US009966377B2

(12) United States Patent
Cantoro et al.

(10) Patent No.: US 9,966,377 B2
(45) Date of Patent: May 8, 2018

(54) SEMICONDUCTOR DEVICES INCLUDING FIN-SHAPED ACTIVE PATTERNS IN DIFFERENT CONDUCTIVITY TYPE REGIONS

(71) Applicant: Samsung Electronics Co., Ltd., Suwon-si, Gyeonggi-do (KR)

(72) Inventors: Mirco Cantoro, Suwon-si (KR); YeonCheol Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/409,202

(22) Filed: Jan. 18, 2017

(65) Prior Publication Data
US 2017/0294437 A1 Oct. 12, 2017

(30) Foreign Application Priority Data
Apr. 11, 2016 (KR) ........................ 10-2016-0044374

(51) Int. Cl.
| | |
|---|---|
| H01L 27/092 | (2006.01) |
| H01L 21/02 | (2006.01) |
| H01L 21/8258 | (2006.01) |
| H01L 21/306 | (2006.01) |
| H01L 29/267 | (2006.01) |

(Continued)

(52) U.S. Cl.
CPC .... *H01L 27/0924* (2013.01); *H01L 21/02532* (2013.01); *H01L 21/02538* (2013.01); *H01L 21/30604* (2013.01); *H01L 21/76224* (2013.01); *H01L 21/8258* (2013.01); *H01L 21/823821* (2013.01); *H01L 21/823828* (2013.01); *H01L 21/823878* (2013.01); *H01L 27/0207* (2013.01); *H01L 27/1104* (2013.01); *H01L 27/1116* (2013.01); *H01L 29/0649* (2013.01); *H01L 29/267* (2013.01); *H01L 29/6656* (2013.01); *H01L 29/66545* (2013.01); *H01L 29/7848* (2013.01)

(58) Field of Classification Search
None
See application file for complete search history.

(56) References Cited

U.S. PATENT DOCUMENTS

| | | |
|---|---|---|
| 7,230,270 B2 | 6/2007 | Chen et al. |
| 8,183,104 B2 | 5/2012 | Hobbs et al. |

(Continued)

FOREIGN PATENT DOCUMENTS

JP 529736 B2 9/2013

*Primary Examiner* — Joseph Schoenholtz
(74) *Attorney, Agent, or Firm* — Myers Bigel, P.A.

(57) ABSTRACT

A semiconductor device includes a substrate with an NMOSFET region and a PMOSFET region, a first active pattern on the NMOSFET region, a second active pattern on the PMOSFET region, a dummy pattern between the NMOSFET and PMOSFET regions, and device isolation patterns on the substrate that fill trenches between the first active pattern, the second active pattern, and the dummy pattern. Upper portions of the first and second active patterns have a fin-shaped structure protruding between the device isolation patterns. The upper portions of the first and second active patterns contain semiconductor materials, respectively, that are different from each other, and an upper portion of the dummy pattern contains an insulating material.

20 Claims, 54 Drawing Sheets

(51) Int. Cl.
    *H01L 29/06*     (2006.01)
    *H01L 27/11*     (2006.01)
    *H01L 21/762*     (2006.01)
    *H01L 21/8238*     (2006.01)
    *H01L 27/02*     (2006.01)
    *H01L 29/66*     (2006.01)
    *H01L 29/78*     (2006.01)

(56) References Cited

U.S. PATENT DOCUMENTS

| | | |
|---|---|---|
| 8,912,056 B2 | 12/2014 | Basker et al. |
| 8,916,440 B2 | 12/2014 | Clark, Jr. et al. |
| 8,937,353 B2 | 1/2015 | Chen et al. |
| 9,006,066 B2 | 4/2015 | Chi et al. |
| 9,048,318 B2 | 6/2015 | Leobandung |
| 9,129,863 B2 | 9/2015 | Caimi et al. |
| 2014/0217467 A1* | 8/2014 | Pawlak .................. H01L 29/12 257/183 |
| 2015/0325575 A1* | 11/2015 | Park .................. H01L 29/0653 257/401 |
| 2017/0053835 A1* | 2/2017 | Sung ............... H01L 21/823821 |
| 2017/0125447 A1* | 5/2017 | Cheng ................. H01L 27/1211 |
| 2017/0154820 A1* | 6/2017 | Lee .................. H01L 21/82341 |
| 2017/0162447 A1* | 6/2017 | Glass ................ H01L 21/82382 |

* cited by examiner

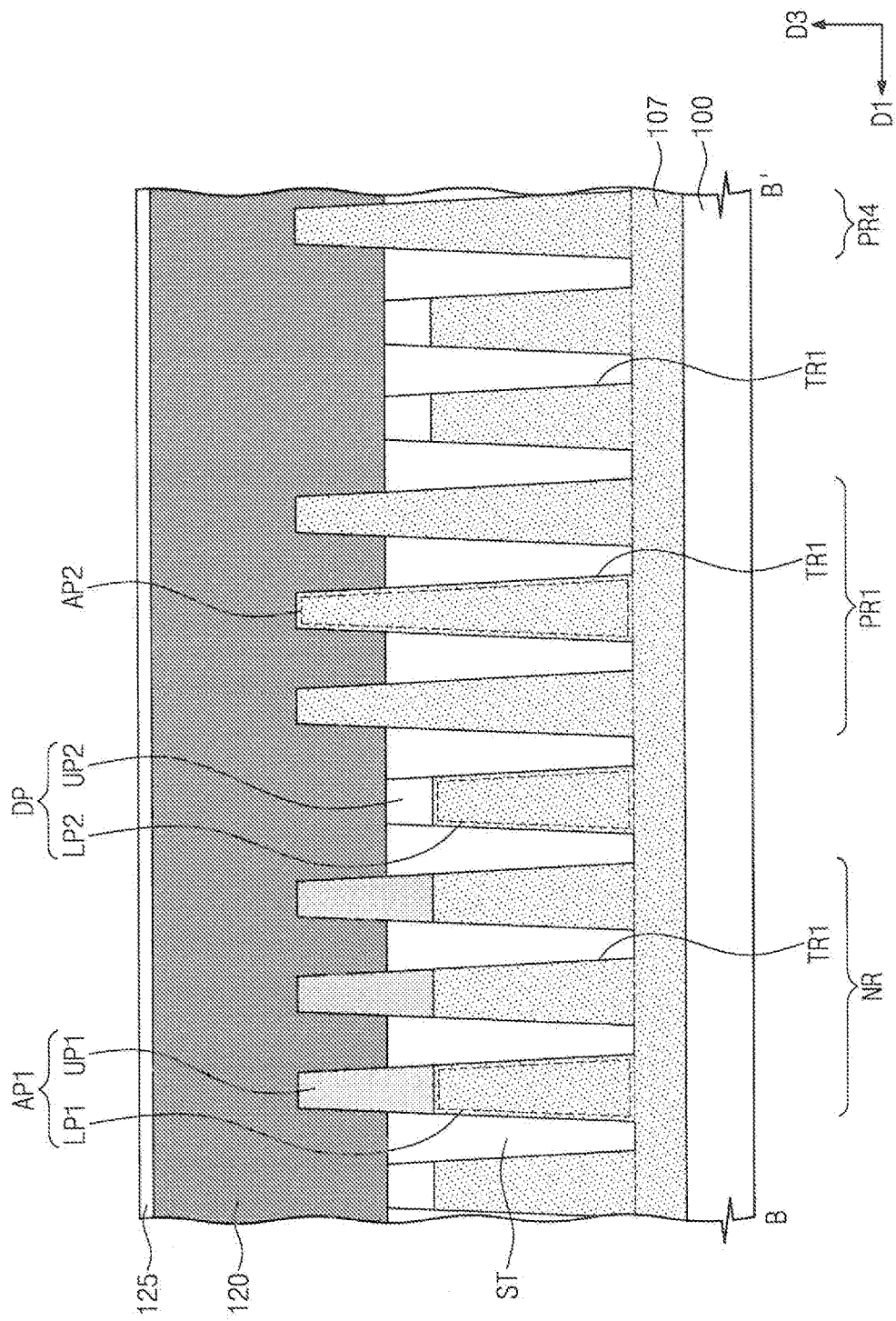

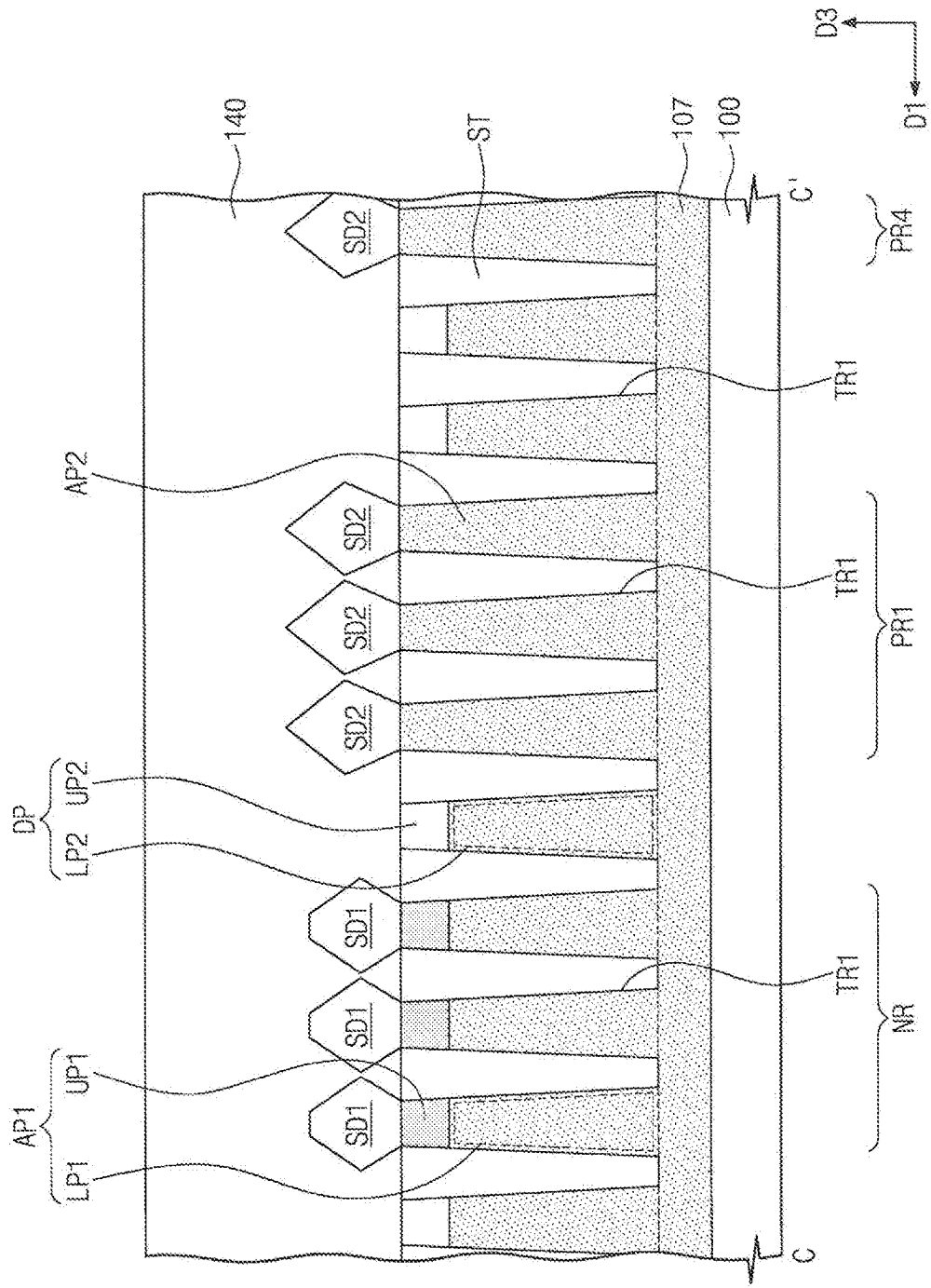

SEMICONDUCTOR DEVICES INCLUDING FIN-SHAPED ACTIVE PATTERNS IN DIFFERENT CONDUCTIVITY TYPE REGIONS

CROSS-REFERENCE TO RELATED APPLICATIONS

This U.S. non-provisional patent application claims priority under 35 U.S.C. § 119 to Korean Patent Application No. 10-2016-0044374, filed on Apr. 11, 2016, in the Korean Intellectual Property Office, the entire contents of which are hereby incorporated by reference.

BACKGROUND OF THE INVENTION

The present disclosure relates to semiconductor devices and methods of fabricating the same, and more particularly, to semiconductor devices including field effect transistors and methods of fabricating the same.

Due to their small-size, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, it may be necessary to realize semiconductor devices with high reliability, high performance, and/or multiple functions. To satisfy these technical requirements, complexity and/or integration density of semiconductor devices are being increased.

SUMMARY

Some embodiments of the inventive concept provide a semiconductor device including field effect transistors with improved electrical characteristics.

Some embodiments of the inventive concept provide a method of fabricating a semiconductor device including field effect transistors with improved electrical characteristics.

According to some embodiments of the inventive concept, a semiconductor device may include a substrate with an NMOSFET region and a PMOSFET region, a first active pattern on the NMOSFET region, a second active pattern on the PMOSFET region, a dummy pattern between the NMOSFET and PMOSFET regions, and device isolation patterns on the substrate that fill trenches between the first active pattern, the second active pattern, and the dummy pattern. Upper portions of the first and second active patterns may have a fin-shaped structure protruding between the device isolation patterns. The upper portions of the first and second active patterns may comprise semiconductor materials, respectively, that are different from each other, and an upper portion of the dummy pattern may contain an insulating material.

According to some embodiments of the inventive concept, a semiconductor device may include a first active pattern, a second active pattern, and a dummy pattern on a substrate. The dummy pattern may be provided between the first and second active patterns. The first active pattern and the second active pattern may have different conductivity types. The first active pattern may include a first lower pattern and a first upper pattern on the first lower pattern, the dummy pattern may include a second lower pattern and a second upper pattern on the second lower pattern. The first lower pattern, the second lower pattern, and the second active pattern may comprise the same semiconductor material, and the second upper pattern may comprise an insulating material.

According to some embodiments of the inventive concept, a method of fabricating a semiconductor device may include forming a first semiconductor layer on a substrate comprising an NMOSFET region and a first PMOSFET region, etching an upper portion of the first semiconductor layer to form a first recess region that vertically overlaps the NMOSFET region, forming a first spacer on an inner sidewall of the first recess region, forming a second semiconductor layer on a portion of the first semiconductor layer exposed by the first recess region, the second semiconductor layer being in direct contact with a sidewall of the first spacer and filling the first recess region, and patterning the first semiconductor layer, the second semiconductor layer, and the first spacer to form a first active pattern, a second active pattern, and a first dummy pattern, respectively. Each of the first active pattern, the second active pattern, and the first dummy pattern may be formed to have a fin-shaped structure.

According to some embodiments of the inventive concept, a semiconductor device may include a substrate having an NMOSFET region and a PMOSFET region, a device isolation pattern on the substrate, a first active pattern on the NMOSFET region that extends through the device isolation pattern and having a first channel region extending therefrom, a second active pattern on the PMOSFET region that extends through the device isolation pattern and having a second channel region extending therefrom, and a dummy pattern that extends through the device isolation pattern without extending therefrom. The first channel region and the second channel region comprise first and second semiconductor materials, respectively, that are different from each other.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3C, 4C, 5C, 6C, 7C, 8C, 9C, 10C, and 11C are sectional views taken along lines B-B' of FIGS. 3A to 11A, respectively.

FIGS. 9D, 10D, and 11D are sectional views taken along lines C-C' of FIGS. 9A, 10A, and 11A, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
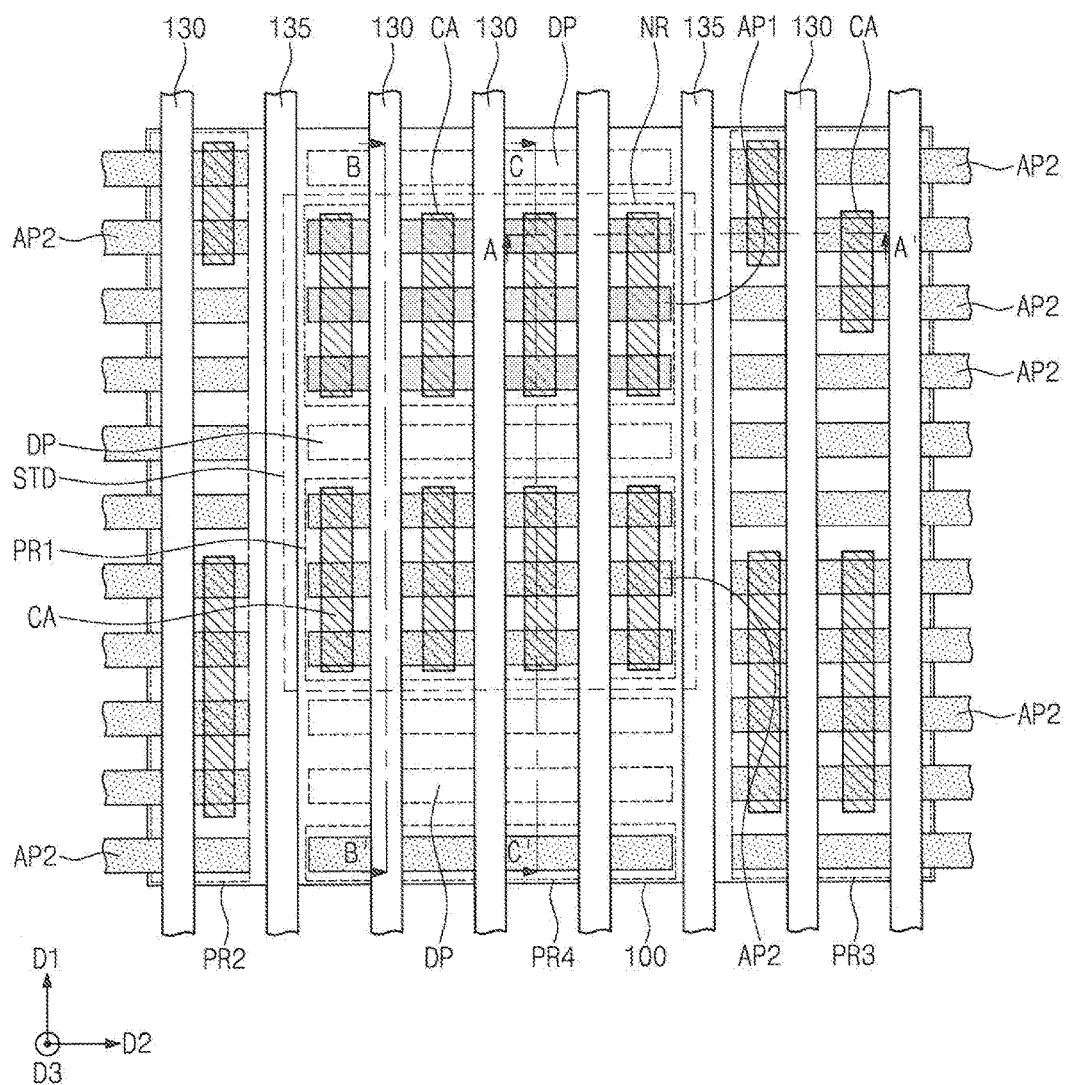
FIG. 1 is a plan view illustrating a semiconductor device according to some embodiments of the inventive concept.
Figure 2A:
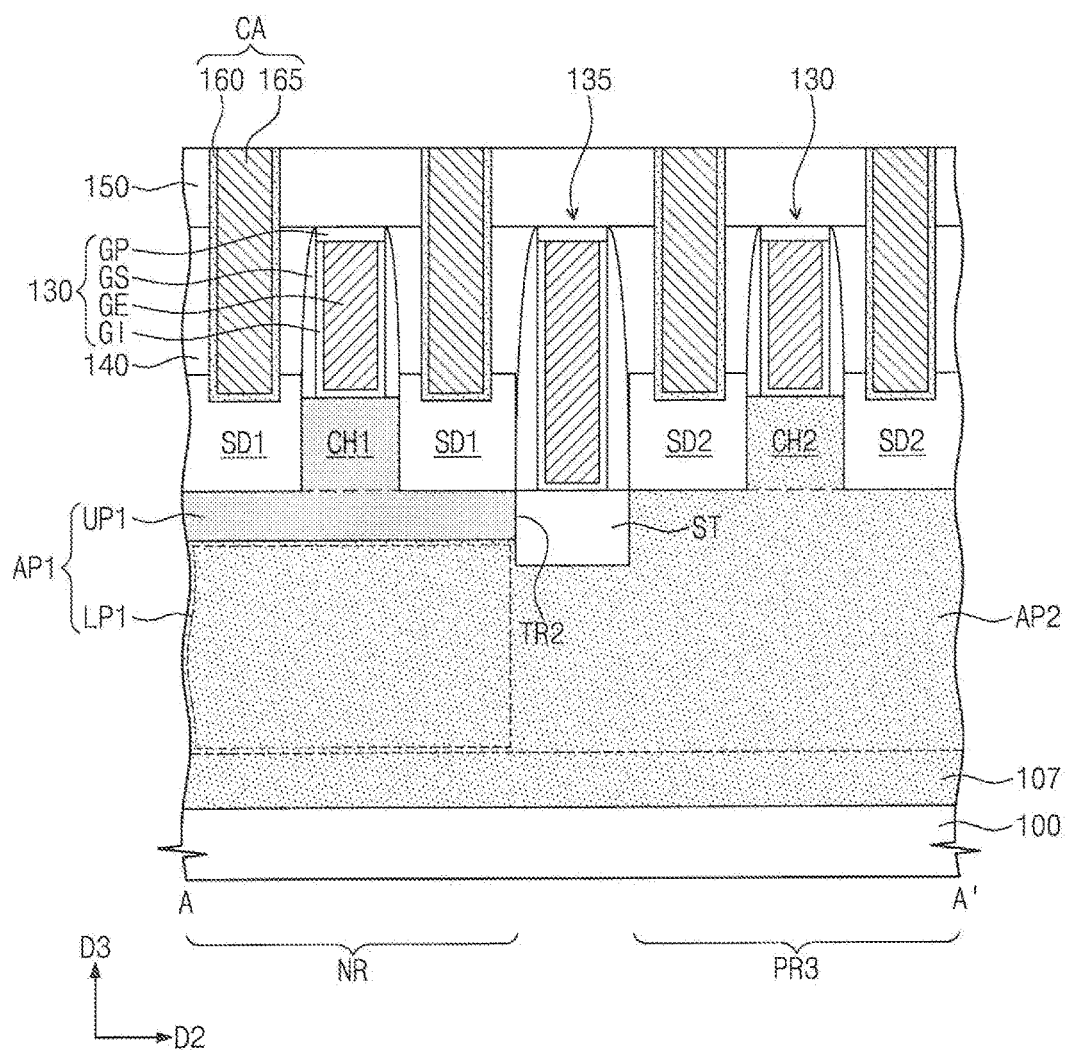
FIG. 2A is a sectional view taken along line A-A' of FIG. 1.
Figure 2B:
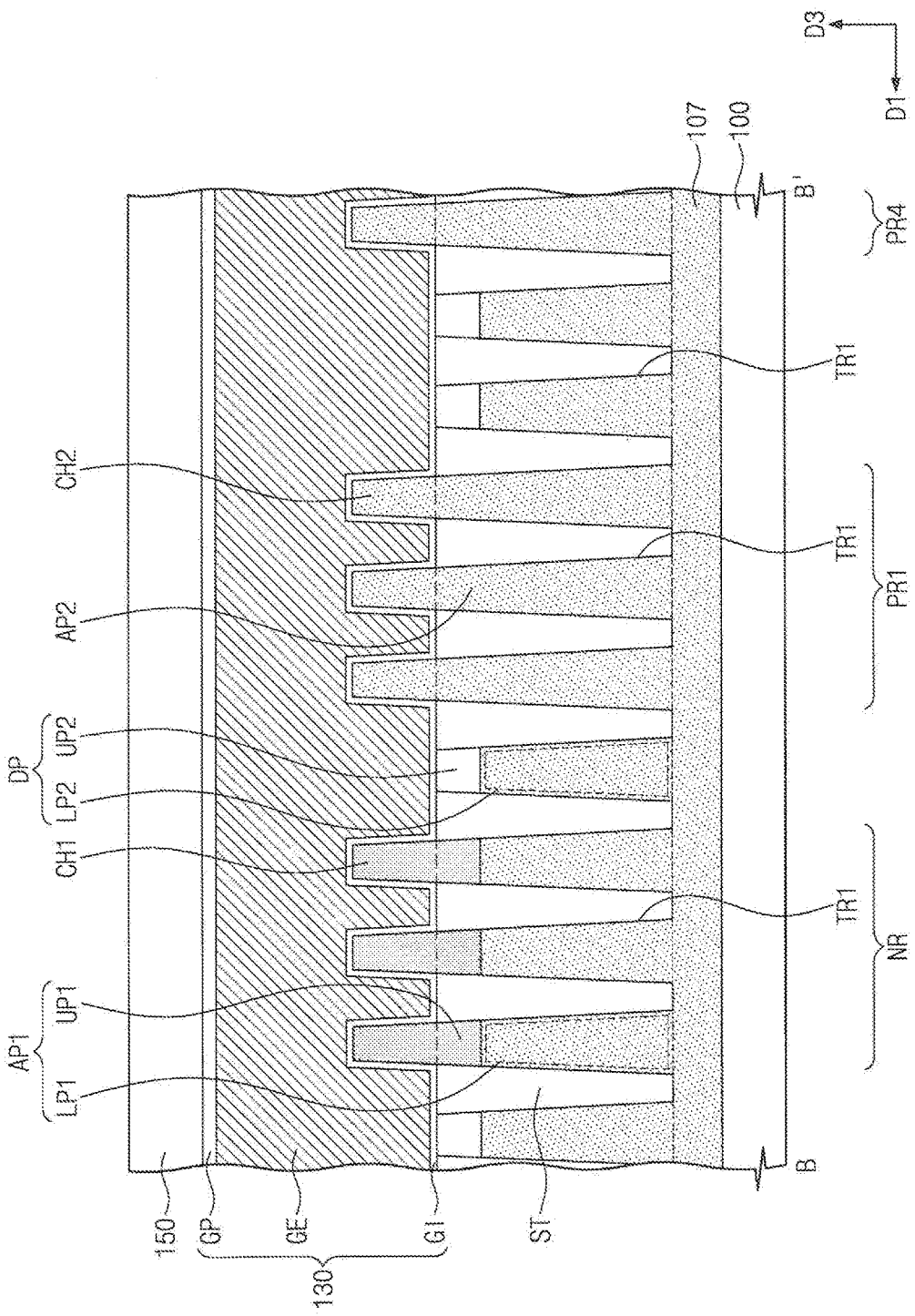
FIG. 2B is a sectional view taken along line B-B' of FIG. 1.
Figure 2C:
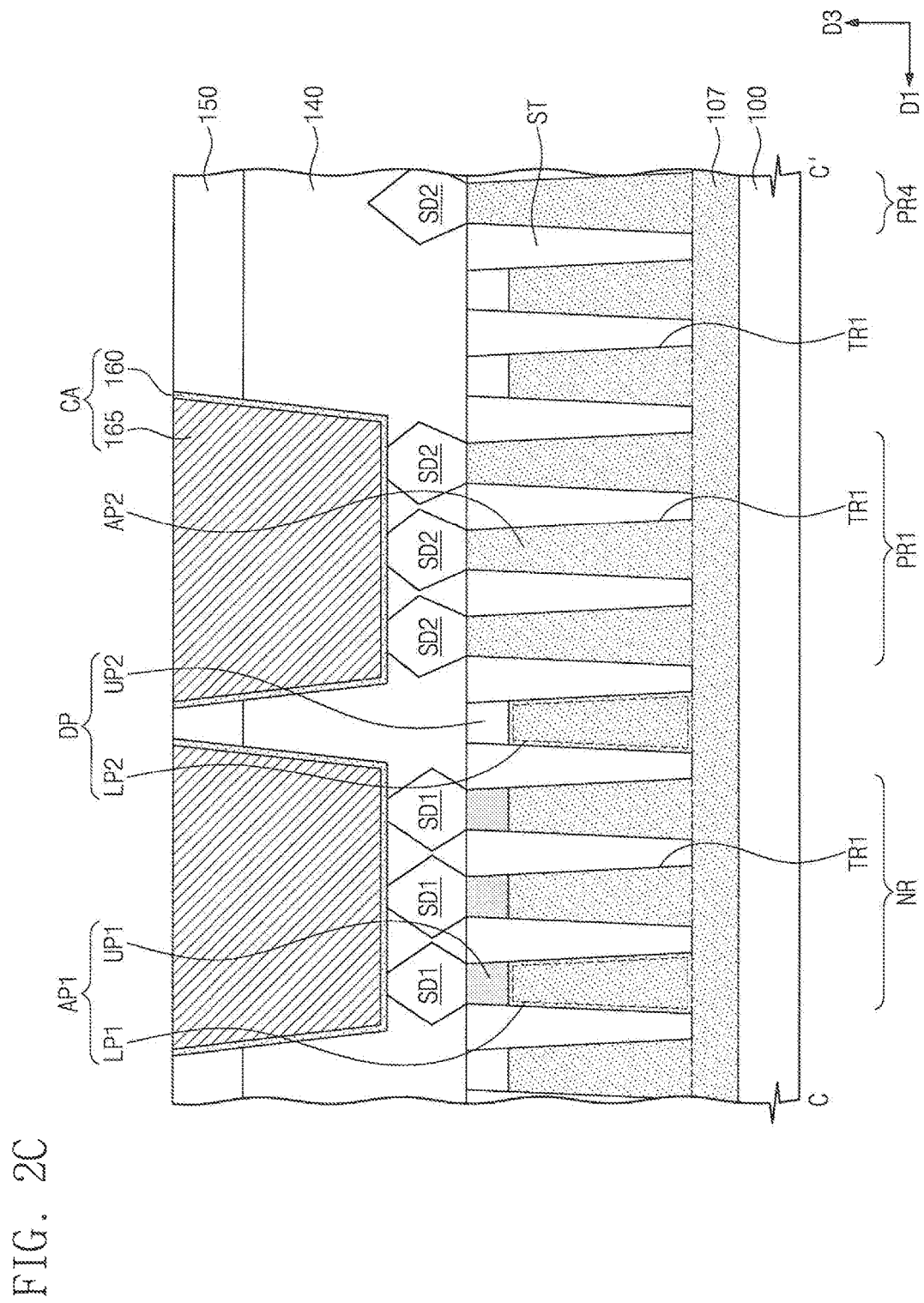
FIG. 2C is a sectional view taken along line C-C' of FIG. 1.

FIG. 1 is a plan view illustrating a semiconductor device according to some embodiments of the inventive concept. FIG. 2A is a sectional view taken along line A-A' of FIG. 1, FIG. 2B is a sectional view taken along line B-B' of FIG. 1, and FIG. 2C is a sectional view taken along line C-C' of FIG. 1.

Referring to FIGS. 1, 2A, 2B, and 2C, a lower semiconductor layer 107 may be provided on a substrate 100. As an example, the substrate 100 may be a silicon substrate, and the lower semiconductor layer 107 may include silicon germanium (SiGe) or germanium (Ge). The lower semiconductor layer 107 may be a strain relaxed buffer (SRB) layer. In certain embodiments, the lower semiconductor layer 107 may further include an SRB layer provided thereunder, and in this case, a germanium (Ge) concentration of the SRB layer may be lower than that of an upper portion of the lower semiconductor layer 107.

The substrate 100 may include an NMOSFET region NR and PMOSFET regions PR1-PR4. The PMOSFET regions PR1-PR4 may include first to fourth PMOSFET regions PR1, PR2, PR3, and PR4. Although, for convenience in description, the first to fourth PMOSFET regions PR1, PR2, PR3, and PR4 are named with different names, they are not separated from each other. For example, the first to fourth PMOSFET regions PR1, PR2, PR3, and PR4 may constitute a single PMOSFET region.

The NMOSFET region NR may be an active region on which n-type transistors are formed, and each of the first to fourth PMOSFET regions PR1-PR4 may be an active region on which p-type transistors are formed. The NMOSFET region NR and the first to fourth PMOSFET regions PR1-PR4 may be horizontally spaced apart from each other. For example, the NMOSFET region NR, the first PMOSFET region PR1, and the fourth PMOSFET region PR4 may be arranged in a first direction D1 parallel to a top surface of the substrate 100. Also, when viewed in a plan view, the NMOSFET region NR, the first PMOSFET region PR1, and the fourth PMOSFET region PR4 may be interposed between the second and third PMOSFET regions PR2 and PR3.

In some embodiments, the NMOSFET region NR and the first PMOSFET region PR1 may constitute a single cell region STD. The cell region STD may be a memory cell region, on which a plurality of memory cells for storing data are provided. As an example, a plurality of memory cell transistors constituting SRAM cells may be provided on the cell region STD of the substrate 100. In other words, the cell region STD may be a part of the SRAM cells. Alternatively, the cell region STD may be a logic cell region on which logic transistors constituting a logic circuit of a semiconductor device are provided. For example, logic transistors constituting a processor core or I/O terminals may be provided on the cell region STD of the substrate 100. In other words, the cell region STD may be a part of the processor core or the I/O terminals.

On the NMOSFET region NR, a plurality of first active patterns AP1 may be provided to extend in a second direction D2 crossing the first direction D1. On each of the first to fourth PMOSFET regions PR1-PR4, a plurality of second active patterns AP2 may be provided to extend in the second direction D2. As shown in FIG. 1, the first active patterns AP1 and the second active patterns AP2 may be provided on the NMOSFET region NR and the first PMOSFET region PR1, respectively, but the inventive concept may not be limited thereto.

The first and second active patterns AP1 and AP2 may extend from the lower semiconductor layer 107 in a third direction D3 perpendicular to the top surface of the substrate 100. In other words, the first and second active patterns AP1 and AP2 may have a structure protruding from the lower semiconductor layer 107. In addition, when viewed in a plan view, each of the first and second active patterns AP1 and AP2 may be a line- or bar-shaped structure extending in the second direction D2. As an example, the first active patterns AP1 may have a p-type conductivity, and the second active patterns AP2 may have an n-type conductivity.

At least one dummy pattern DP extending in the second direction D2 may be provided on a region of the substrate 100 between the NMOSFET region NR and the first PMOSFET region PR1. The dummy pattern DP may be solely provided on the region of the substrate 100, but the inventive concept may not be limited thereto. Furthermore, an additional dummy pattern DP may be provided to be adjacent to the NMOSFET region NR in the first direction D1. In other words, when viewed in a plan view, the NMOSFET region NR may be interposed between a pair of the dummy patterns DP.

At least one dummy pattern DP extending in the second direction D2 may be provided on other region of the substrate 100 between the first PMOSFET region PR1 and the fourth PMOSFET region PR4. As an example, two dummy patterns DP may be provided on the other region of the substrate 100, but the inventive concept may not be limited thereto.

The dummy patterns DP may extend from the lower semiconductor layer 107 in the third direction D3. In other words, the dummy patterns DP may have a structure protruding from the lower semiconductor layer 107. In addition, when viewed in a plan view, each of the dummy patterns DP may be a line- or bar-shaped structure extending in the second direction D2.

Device isolation patterns ST may be provided to fill first trenches TR1, respectively, which are formed between the first active patterns AP1, the second active patterns AP2, and the dummy patterns DP. The first trenches TR1 may extend parallel to each other or in the second direction D2 and may be arranged in the first direction D1. In other words, the first trenches TR1 and the device isolation patterns ST filling them may define the first active patterns AP1, the second active patterns AP2, and the dummy patterns DP. As an example, the device isolation patterns ST may include a silicon oxide layer or a silicon oxynitride layer.

Each of the first active patterns AP1 may include a first lower pattern LP1 and a first upper pattern UP1 on the first lower pattern LP1. As an example, the first lower pattern LP1 may be formed of or include the same material as the lower semiconductor layer 107. For example, the first lower pattern LP1 and the lower semiconductor layer 107 may be connected to each other to form a single monolithic body.

The first upper pattern UP1 may be formed of or include a material different from the first lower pattern LP1. The first upper pattern UP1 may include, for example, at least one III-V semiconductor material. As an example, the III-V semiconductor material may include at least one of indium arsenic (InAs), gallium arsenic (GaAs), aluminum arsenic (AlAs), indium gallium arsenic (InGaAs), indium aluminum arsenic (InAlAs), indium aluminum arsenic antimony (InAlAsSb), indium phosphorus (InP), indium aluminum arsenic phosphorus (InAlAsP), indium gallium arsenic phosphorus (InGaAsP), gallium arsenic antimony (GaAsSb), indium aluminum antimony (InAlSb), indium antimony (InSb), gallium antimony (GaSb), aluminum antimony (AlSb), indium gallium antimony (InGaSb), aluminum arsenic antimony (AlAsSb), aluminum arsenide (AlAs), indium gallium phosphorus (InGaP), gallium arsenic phosphorus (GaAsP), or aluminum gallium arsenide (AlGaAs).

The second active patterns AP2 may be formed of or include the same material as the lower semiconductor layer 107. In other words, the second active patterns AP2 and the lower semiconductor layer 107 may be connected to each other to form a single monolithic body. In detail, unlike the first active patterns AP1 described above, lower and upper portions of each of the second active patterns AP2 may be formed of or include the same semiconductor material containing germanium (Ge).

Each of the dummy patterns DP may include a second lower pattern LP2 and a second upper pattern UP2 on the second lower pattern LP2. For example, the second lower pattern LP2 may be formed of or include the same material as the lower semiconductor layer 107. In other words, the second lower pattern LP2 and the lower semiconductor layer 107 may be connected to each other to form a single monolithic body.

The second upper pattern UP2 may be formed of or include a material different from the second lower pattern LP2. The second upper pattern UP2 may be formed of or include an insulating material. For example, the second upper pattern UP2 may be formed of or include a silicon oxide layer or a silicon oxynitride layer. In some embodiments, top surfaces of the dummy patterns DP (i.e., top surfaces of the second upper patterns UP2) may be substantially coplanar with those of the device isolation patterns ST.

Because the second upper patterns UP2 include an insulating material, the second upper patterns UP2 may provide a function similar to the device isolation patterns ST. For example, the dummy patterns DP may separate the NMOSFET region NR electrically from the first PMOSFET region PR1 and may separate the first PMOSFET region PR1 electrically from the fourth PMOSFET region PR4.

A second trench TR2 extending in the first direction D1 may be formed on regions between the NMOSFET region NR and the second PMOSFET region PR2, between the first PMOSFET region PR1 and the second PMOSFET region PR2, and between the fourth PMOSFET region PR4 and the second PMOSFET region PR2. Also, a second trench TR2 extending in the first direction D1 may be formed on regions between the NMOSFET region NR and the third PMOSFET region PR3, between the first PMOSFET region PR1 and the third PMOSFET region PR3, and between the fourth PMOSFET region PR4 and the third PMOSFET region PR3.

In some embodiments, the second trenches TR2 may extend in the first direction D1 to pass through or penetrate upper portions of the first and second active patterns AP1 and AP2 and upper portions of the dummy patterns DP. Accordingly, the upper portions of the first and second active patterns AP1 and AP2 and the dummy patterns DP may be horizontally spaced apart from each other in the second direction D2. As an example, referring back to FIG. 2A, the upper portion of the first active pattern AP1 on the NMOSFET region NR may be spaced apart from that of the second active pattern AP2 on the third PMOSFET region PR3 in the second direction D2 by the second trench TR2.

The second trenches TR2 may have a depth that is shallower relative to the substrate 100 than that of the first trenches TR1. Bottoms of the second trenches TR2 may be positioned at a lower level relative to the substrate 100 than those of the first upper patterns UP1.

The device isolation patterns ST may be provided to fill the second trenches TR2, respectively. In other words, when viewed in a plan view, the device isolation pattern ST filling the second trench TR2 may be a line- or bar-shaped structure extending in the second direction D2. A top surface of the device isolation pattern ST filling the second trench TR2 may be positioned at substantially the same level as that of the device isolation pattern ST filling the first trench TR1. The device isolation pattern ST filling the second trench TR2 may include a material that is different from or the same as the device isolation pattern ST filling the first trench TR1.

Each of the first active patterns AP1 may include first source/drain regions SD1, which are formed on or in an upper portion thereof (e.g., the first upper pattern UP1), and a first channel region CH1, which is formed between the first source/drain regions SD1. The first channel region CH1 may be provided between the device isolation patterns ST and may have a fin-shaped structure protruding in the third direction D3. The first source/drain regions SD1 may be epitaxial patterns, which may be epitaxially grown from the first active patterns AP1. For example, the first source/drain regions SD1 may be epitaxial patterns, which may be positioned between the device isolation patterns ST and may protrude in the third direction D3.

Each of the second active patterns AP2 may include second source/drain regions SD2, which are formed on or in an upper portion thereof, and a second channel region CH2, which is formed between the second source/drain regions SD2. The second channel region CH2 may be provided between the device isolation patterns ST and may have a fin-shaped structure protruding in the third direction D3. The second source/drain regions SD2 may be epitaxial patterns, which may be epitaxially grown from the second active patterns AP2. For example, the second source/drain regions SD2 may be epitaxial patterns, which may be positioned between the device isolation patterns ST and may protrude in the third direction D3.

Gate structures 130 may be provided on the substrate 100 to cross the first and second active patterns AP1 and AP2. The gate structures 130 may overlap the first and second channel regions CH1 and CH2, when viewed in a plan view. In other words, the gate structures 130 may have a line-shaped structure crossing the first and second channel regions CH1 and CH2 between the device isolation patterns ST and extending in the first direction D1.

Each of the gate structures 130 may include a gate dielectric pattern GI, a gate electrode GE, gate spacers GS, and a capping pattern GP. The gate electrode GE may cover top and side surfaces of the first and second channel regions CH1 and CH2. The gate dielectric pattern GI may be interposed between the first and second channel regions CH1 and CH2 and the gate electrode GE. The gate spacers GS may be provided on both sidewalls of the gate electrode GE. Here, the gate dielectric pattern GI may extend in between the gate spacers GS and the gate electrode GE. The capping pattern GP may cover the top surface of the gate electrode GE.

The gate electrode GE may be formed of or include at least one of doped semiconductors, conductive metal nitrides (e.g., titanium nitride or tantalum nitride), or metals (e.g., aluminum or tungsten). The gate dielectric pattern GI may be formed of or include at least one of a silicon oxide layer, a silicon oxynitride layer, and high-k dielectric layers (e.g., hafnium oxide, hafnium silicate, zirconium oxide, or zirconium silicate) having dielectric constants higher than that of the silicon oxide layer. Each of the capping patterns GP and the gate spacers GS may be formed of or include at least one of a silicon oxide layer, a silicon nitride layer, or a silicon oxynitride layer.

Dummy gate structures 135 may be respectively disposed on the device isolation patterns ST filling the second trenches TR2. Each of the dummy gate structures 135 may be a line-shaped structure extending in the first direction D1 or along the device isolation pattern ST filling the second trench TR2.

Each of the dummy gate structures 135 may include a gate dielectric pattern GI, a gate electrode GE, gate spacers GS, and a capping pattern GP, similar to the gate structure 130 described above. Unlike the gate structures 130, however, the dummy gate structures 135 are not provided on the first and second channel regions CH1 and CH2; therefore, the gate structures 130 may not serve as gate electrodes of transistors provided on the NMOSFET region NR and the first to fourth PMOSFET regions PR1-PR4.

The first and second source/drain regions SD1 and SD2 may be provided to be adjacent to both side surfaces of each of the gate structures 130. In some embodiments, the first source/drain regions SD1 may have top surfaces that are higher than those of the first channel regions CH1, and the second source/drain regions SD2 may have top surfaces that are higher than those of the second channel regions CH2 relative to the substrate 100. The first source/drain regions SD1 may have an n-type conductivity and the second source/drain regions SD2 may have a p-type conductivity.

The first source/drain regions SD1 may be epitaxial patterns and may include a material exerting a tensile strain to the first channel regions CH1. The second source/drain regions SD2 may also be epitaxial patterns and may include a material exerting a compressive strain to the second channel regions CH2. Because the first and second source/drain regions SD1 and SD2 exert the tensile strain and the compressive strain to the first and second channel regions CH1 and CH2, respectively, carriers generated in the first and second channel regions CH1 and CH2 may have an increased mobility, when the field effect transistors are operated.

When the first upper patterns UP1 (e.g., the first channel regions CH1) contain indium gallium arsenic (InGaAs), an InGaAs concentration of the first source/drain regions SD1 may be different from that of the first channel regions CH1. Accordingly, the first source/drain regions SD1 may exert a tensile or compressive strain to the first channel regions CH1.

When the upper portions of the second active patterns AP2 (e.g., the second channel regions CH2) contain silicon germanium (SiGe), an SiGe concentration of the second source/drain regions SD2 may be different from that of the second channel regions CH2. Accordingly, the second source/drain regions SD2 may exert a compressive or tensile strain to the second channel regions CH2.

In some embodiments, when viewed in a sectional view, the first source/drain regions SD1 may have a shape different from the second source/drain regions SD2; for example, see FIG. 2C. This is because, as described above, different materials are used to epitaxially grow the first and second source/drain regions SD1 and SD2.

A first interlayered insulating layer 140 may be provided on the substrate 100. The first interlayered insulating layer 140 may be provided to cover sidewalls of the gate structures 130, sidewalls of the dummy gate structures 135, and the first and second source/drain regions SD1 and SD2. The first interlayered insulating layer 140 may have a top surface that is substantially coplanar with those of the gate structures 130 and the dummy gate structures 135. On the first interlayered insulating layer 140, a second interlayered insulating layer 150 may be formed to cover the gate structures 130. As an example, each of the first and second interlayered insulating layers 140 and 150 may include a silicon oxide layer or a silicon oxynitride layer.

Source/drain contacts CA may be provided at both sides of each of the gate structures 130. The source/drain contacts CA may be provided to penetrate the second interlayered insulating layer 150 and the first interlayered insulating layer 140 and may be electrically connected to the first and second source/drain regions SD1 and SD2. When viewed in a plan view, the source/drain contacts CA may be connected to at least one of the first active patterns AP1 (e.g., the first source/drain regions SD1). When viewed in a plan view, the source/drain contacts CA may be connected to at least one of the second active patterns AP2 (e.g., the second source/drain regions SD2).

Each of the source/drain contacts CA may include a first conductive pattern 160 and a second conductive pattern 165 on the first conductive pattern 160. The first conductive pattern 160 may be a barrier conductive layer. As an example, the first conductive pattern 160 may include at least one of a titanium nitride layer, a tungsten nitride layer, or a tantalum nitride layer. The second conductive pattern 165 may be a metal layer. As an example, the second conductive pattern 165 may be formed of or include at least one of tungsten, titanium, or tantalum. Although not shown, a metal silicide layer may be interposed between each of the source/drain contacts CA and the first and second source/drain regions SD1 and SD2. As an example, the metal silicide layer may be formed of or include at least one of titanium-silicide, tantalum-silicide, or tungsten-silicide.

Although not shown, interconnection lines, each of which is connected to at least one of the source/drain contacts CA, may be provided on the second interlayered insulating layer 150. The interconnection lines may be formed of or include a conductive material.

According to some embodiments of the inventive concept, in a semiconductor device, a channel region of an n-type transistor (i.e., the first channel region CH1) and a channel region of a p-type transistor (i.e., the second channel region CH2) may include different semiconductor materials from each other. In some embodiments, the semiconductor device may be used to realize a dual channel CMOS. Furthermore, because the dummy pattern DP is disposed between the n- and p-type transistors to serve as a device isolation pattern, it may be possible to simplify a process of fabricating a semiconductor device. The process simplification using the dummy pattern DP will be described below.

Figure 9A:
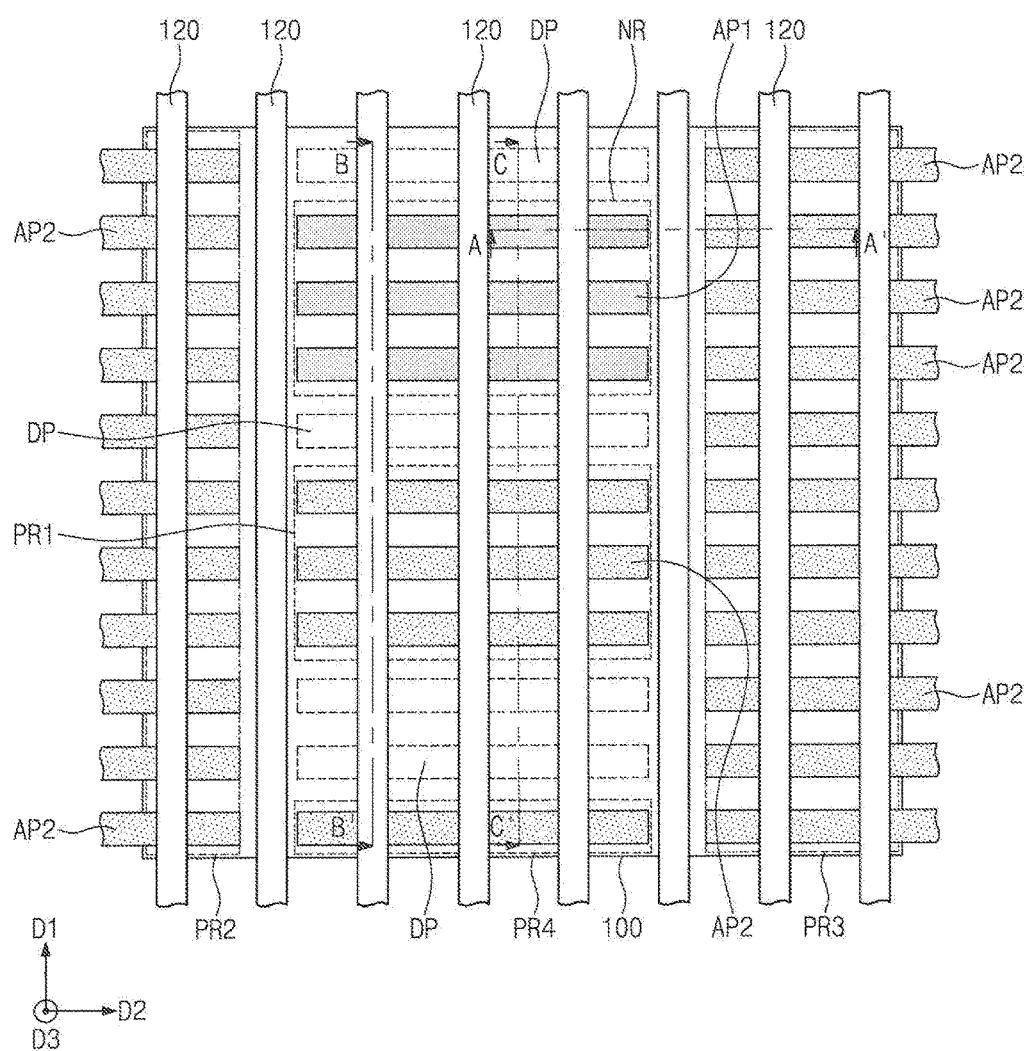
Figure 9B:
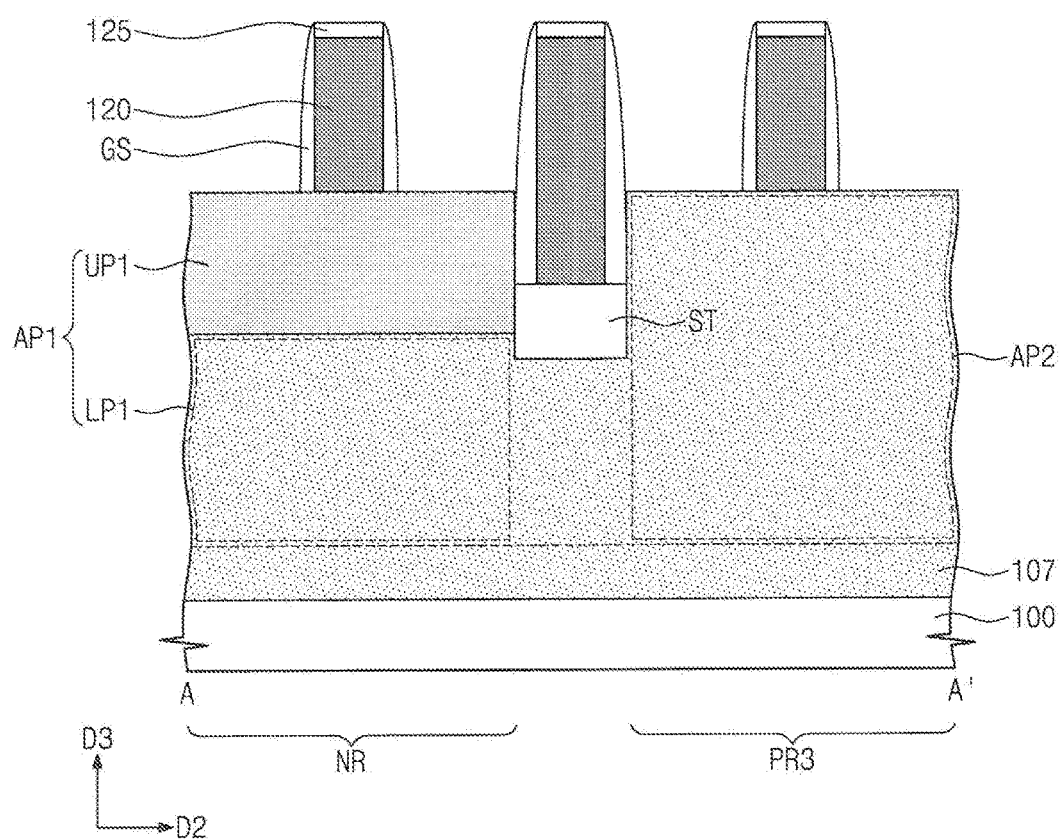
Figure 9D:
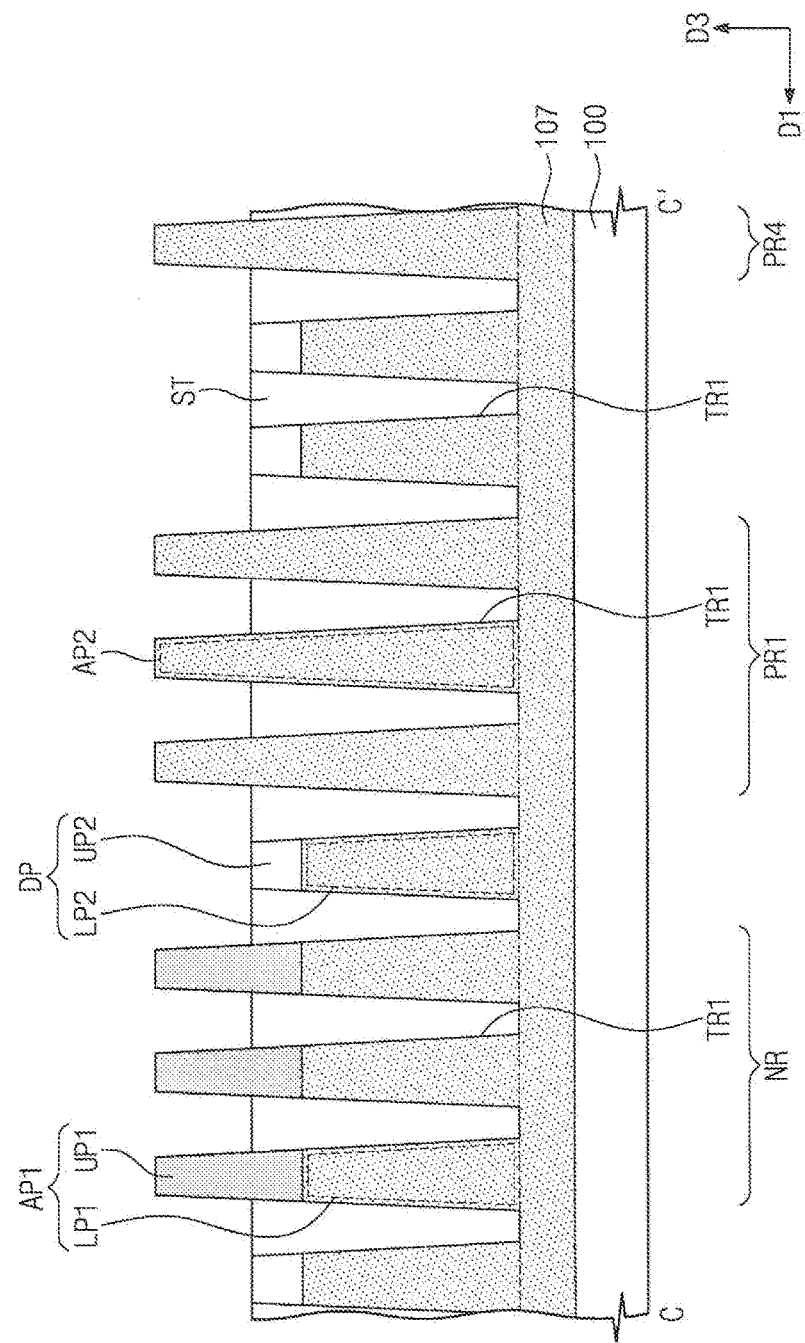
Figure 10A:
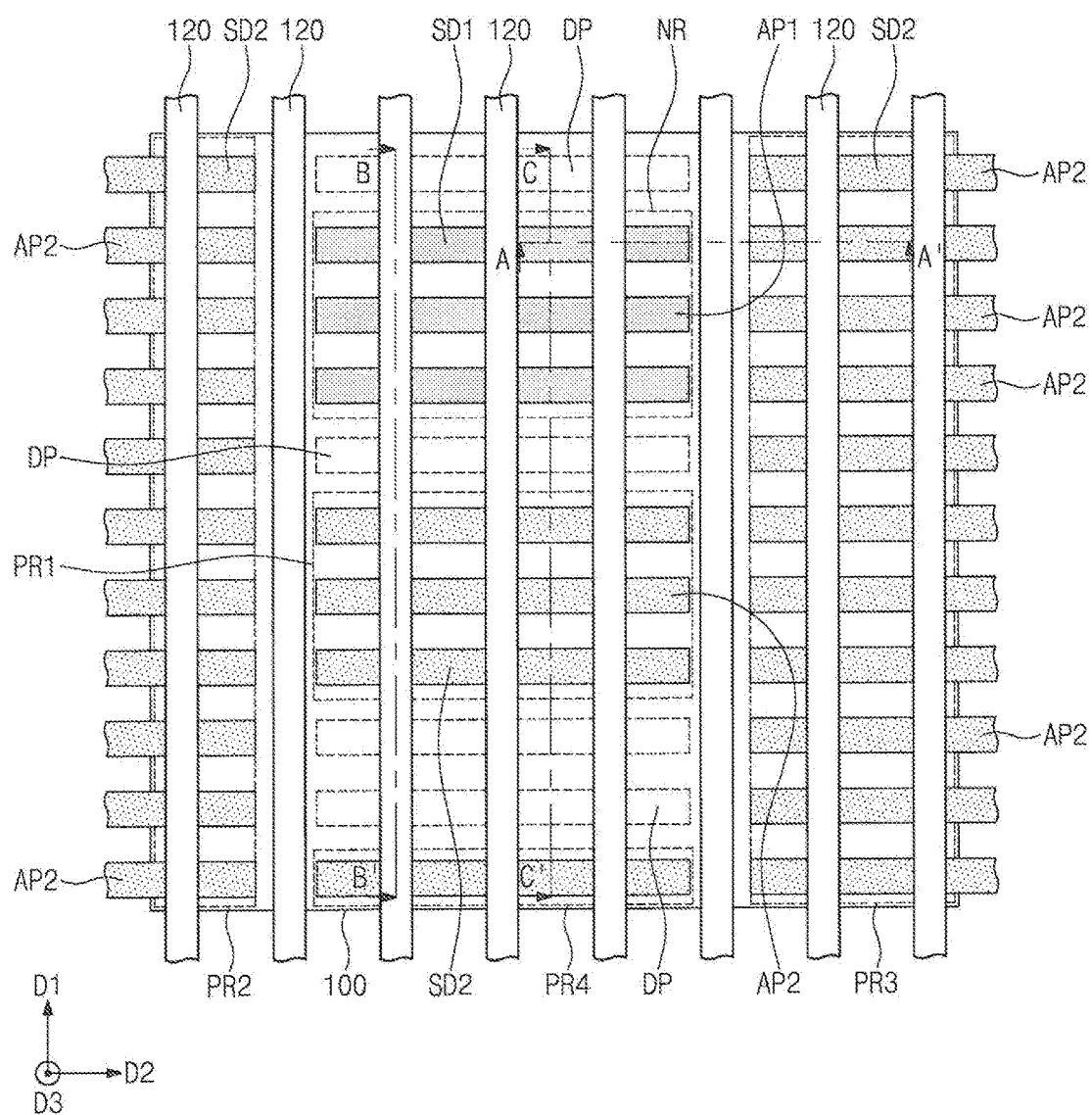
Figure 10B:
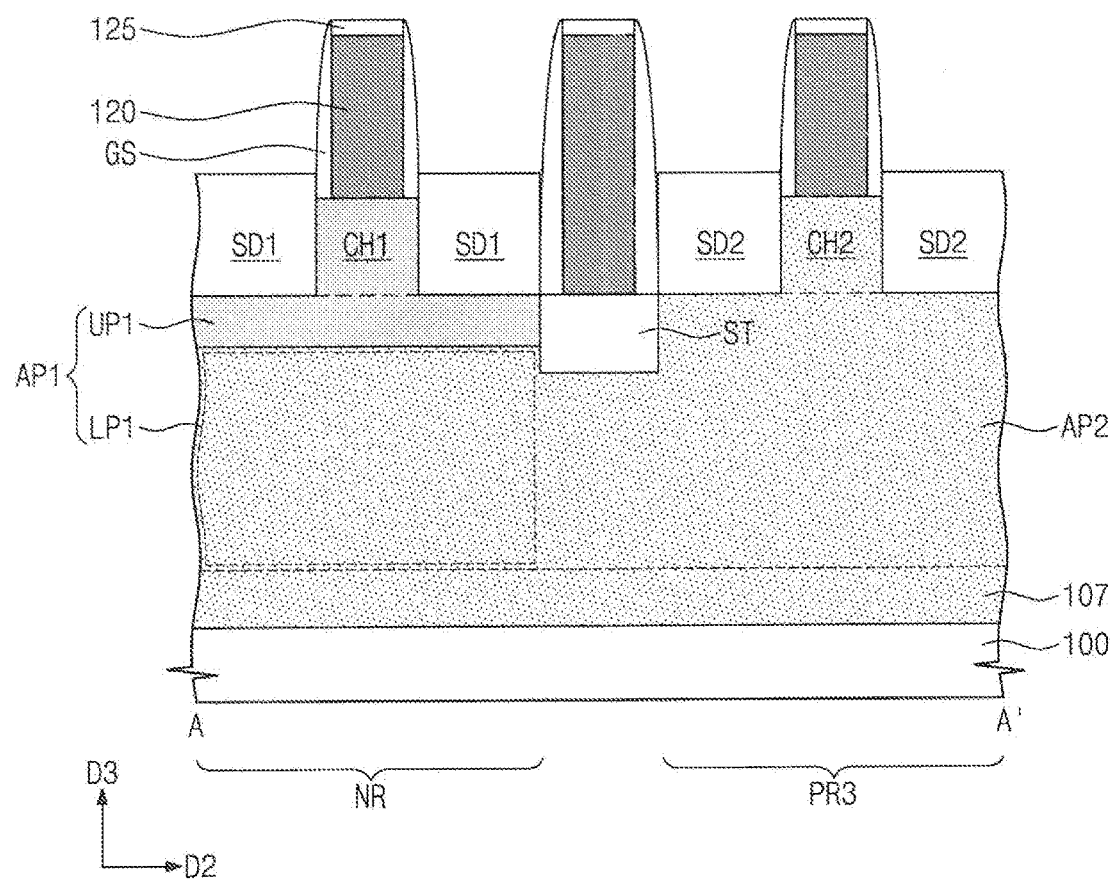
Figure 10C:
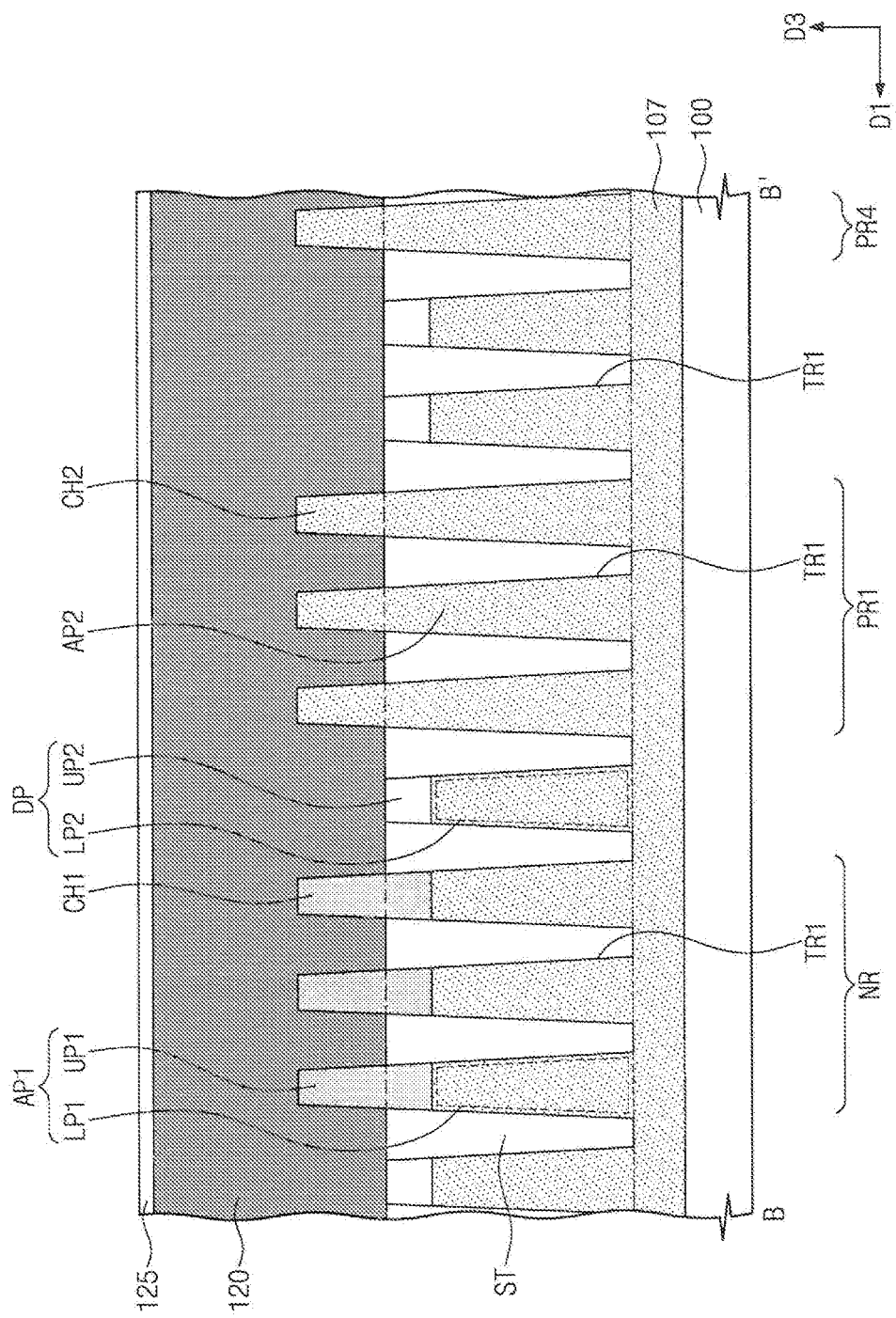
Figure 10D:
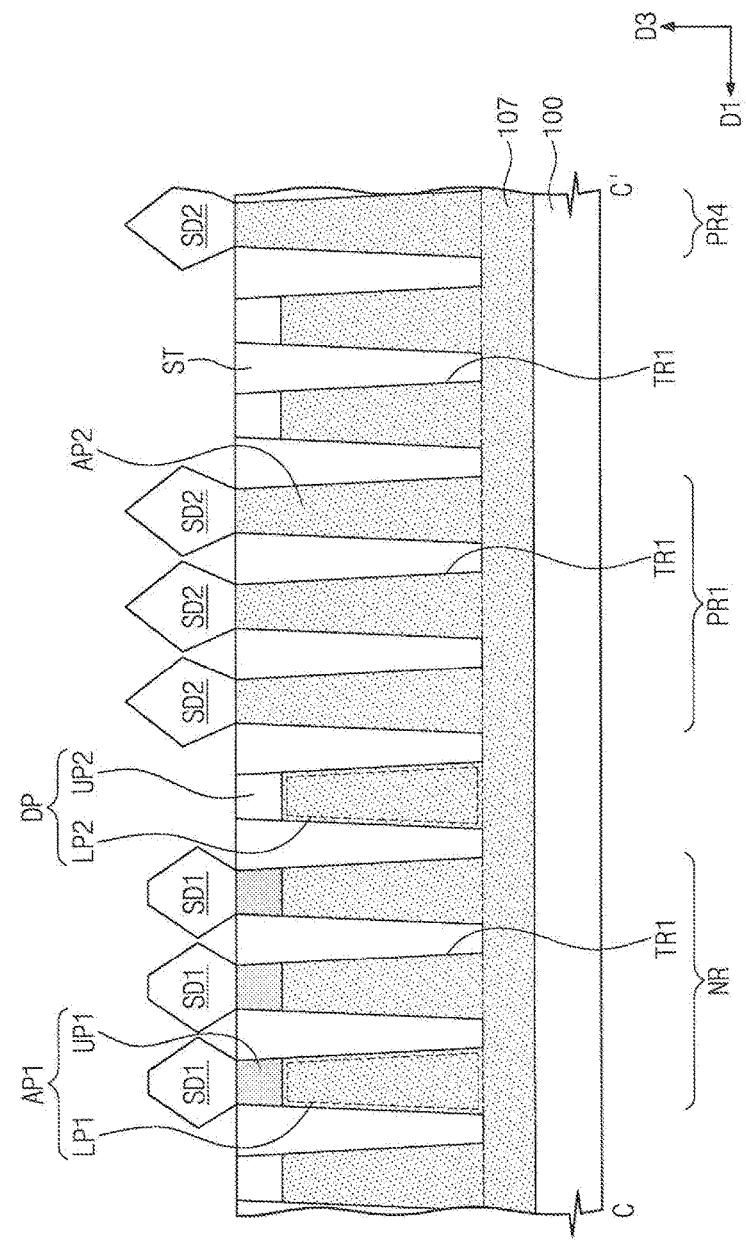
Figure 11A:
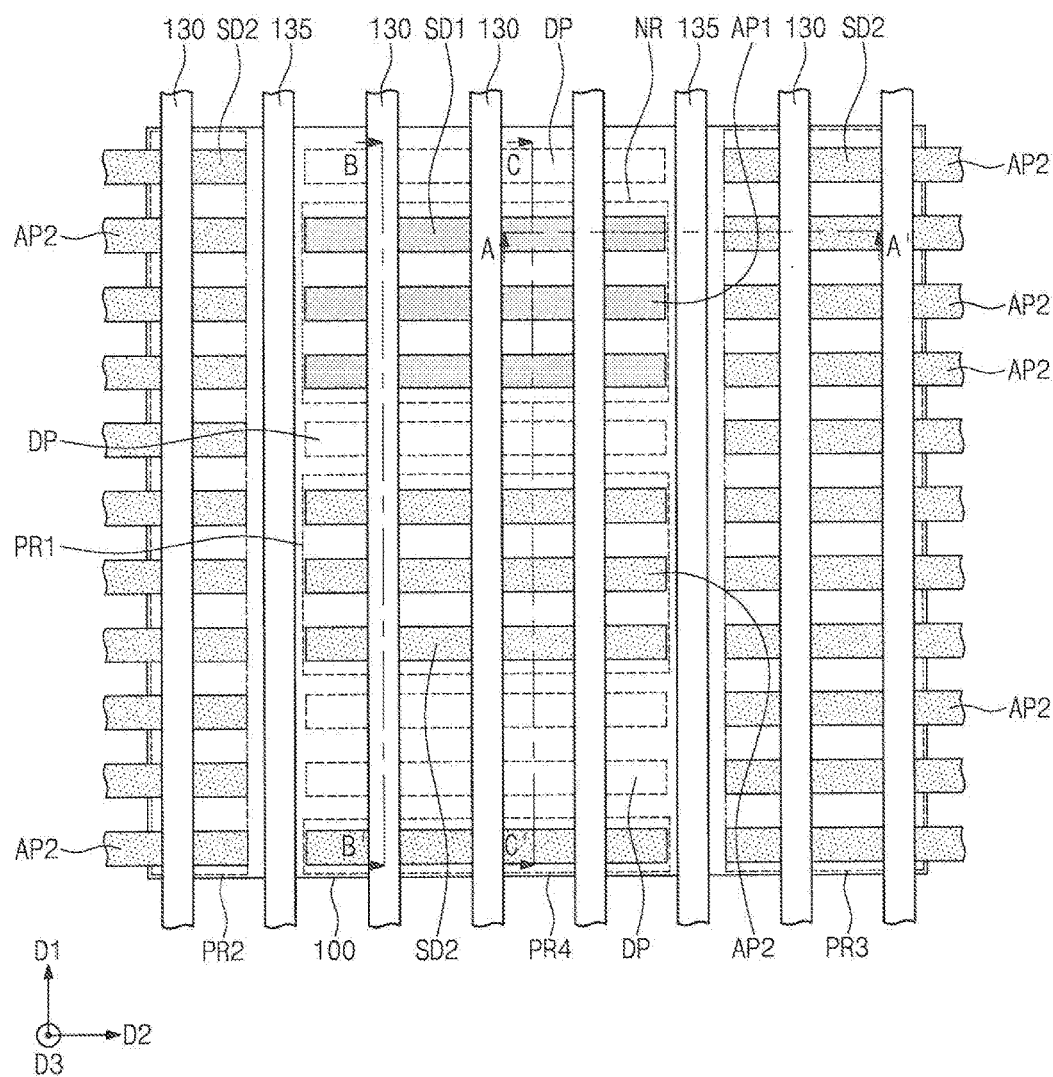
Figure 11B:
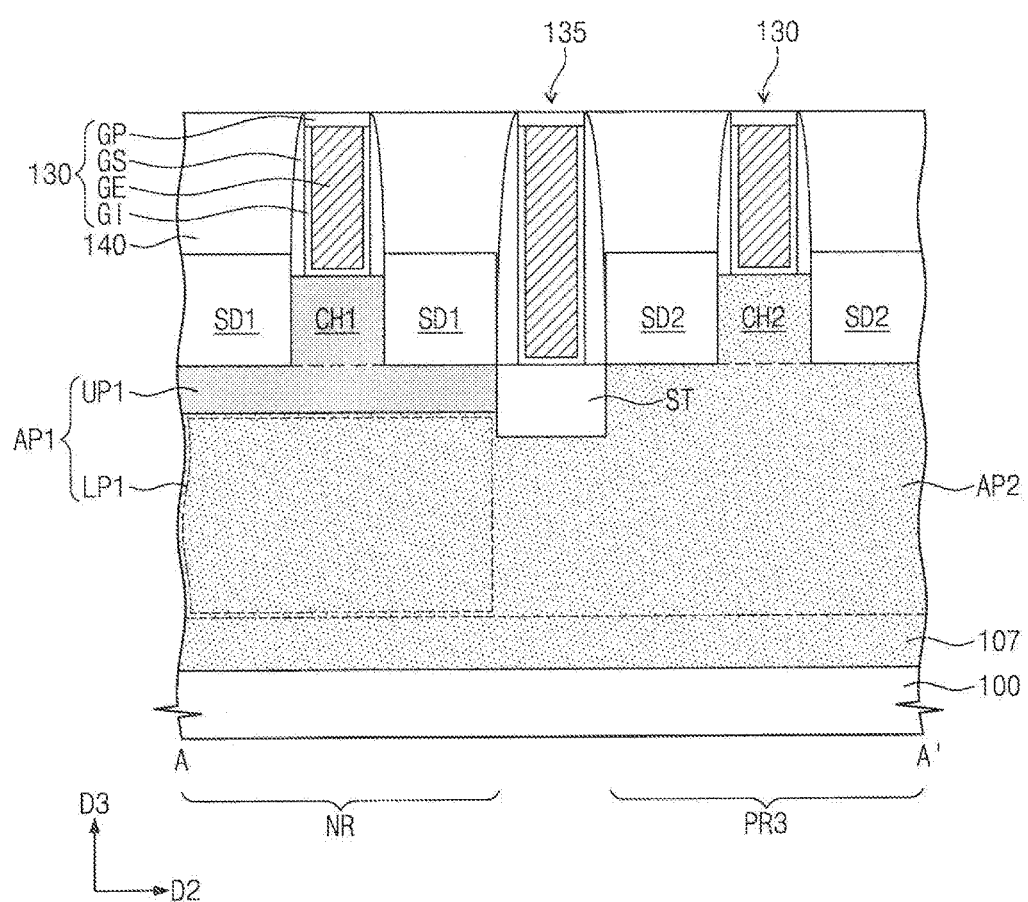
Figure 11C:
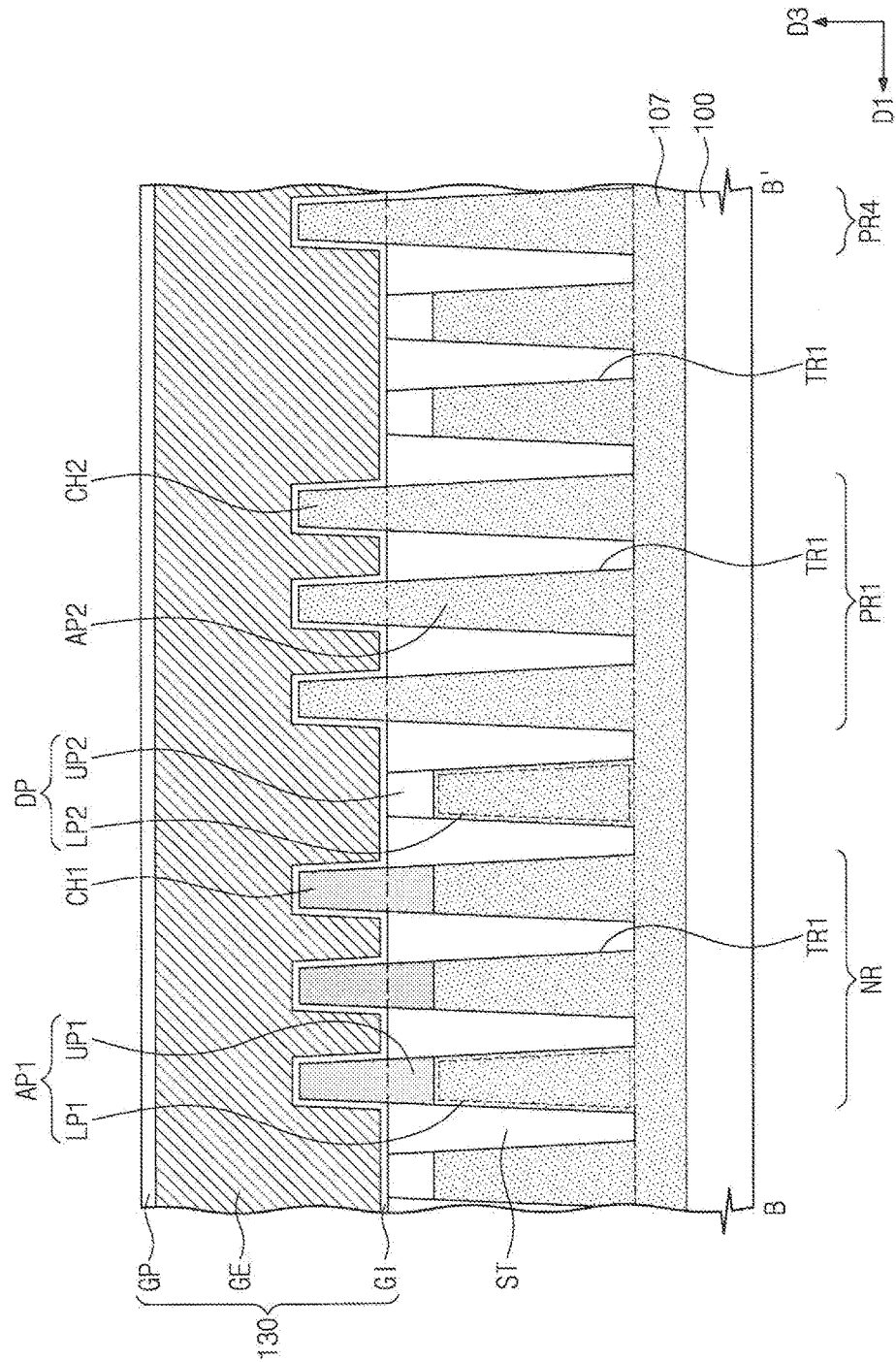

FIGS. 3A, 4A, 5A, 6A, 7A, 8A, 9A, 10A, and 11A are plan views illustrating a method of fabricating a semiconductor device, according to some embodiments of the inventive concept. FIGS. 3B, 4B, 5B, 6B, 7B, 8B, 9B, 10B, and 11B are sectional views taken along lines A-A' of FIGS. 3A to 11A, respectively, FIGS. 3C, 4C, 5C, 6C, 7C, 8C, 9C, 10C, and 11C are sectional views taken along lines B-B' of FIGS. 3A to 11A, respectively. FIGS. 9D, 10D, and 11D are sectional views taken along lines C-C' of FIGS. 9A, 10A, and 11A, respectively.

Figure 3A:
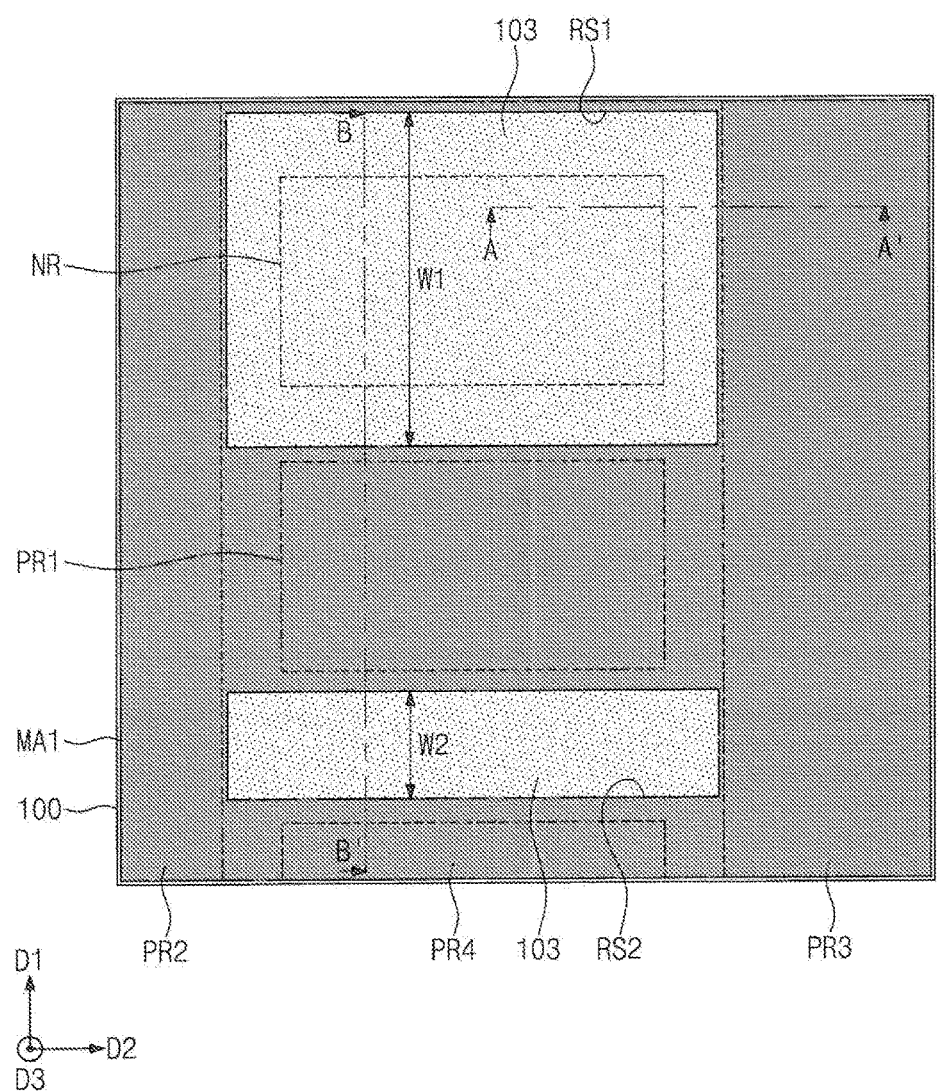
FIGS. 3A, 4A, 5A, 6A, 7A, 8A, 9A, 10A, and 11A are plan views illustrating a method of fabricating a semiconductor device, according to some embodiments of the inventive concept.
Figure 3B:
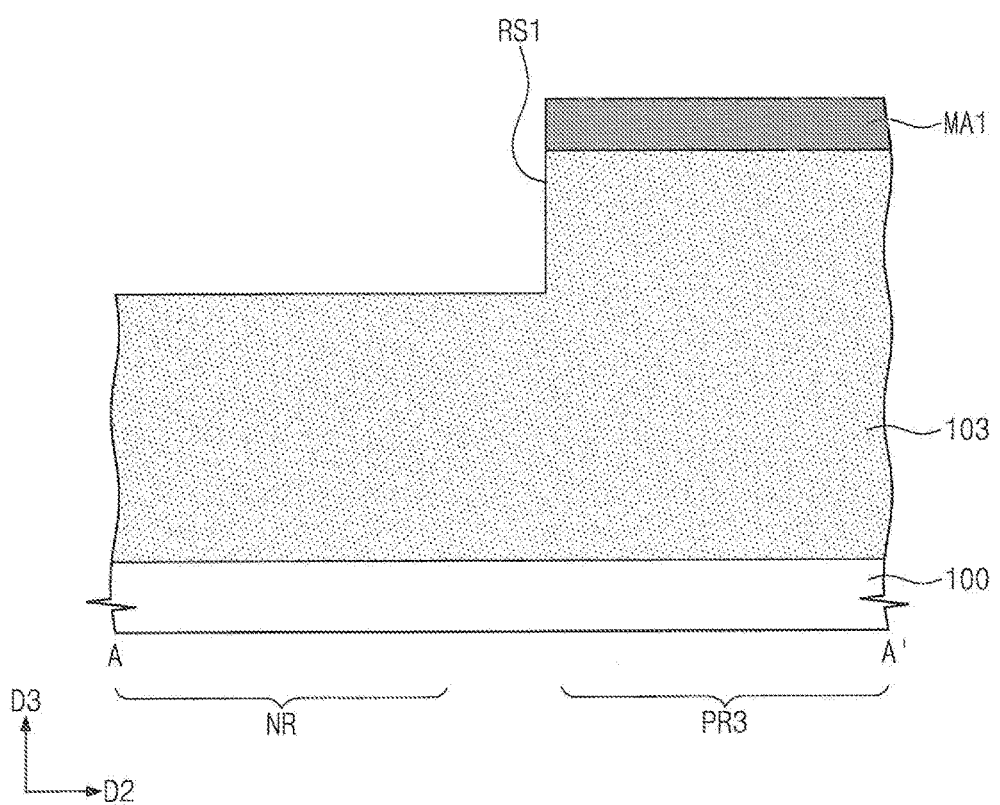
FIGS. 3B, 4B, 5B, 6B, 7B, 8B, 9B, 10B, and 11B are sectional views taken along lines A-A' of FIGS. 3A to 11A, respectively.
Figure 3C:
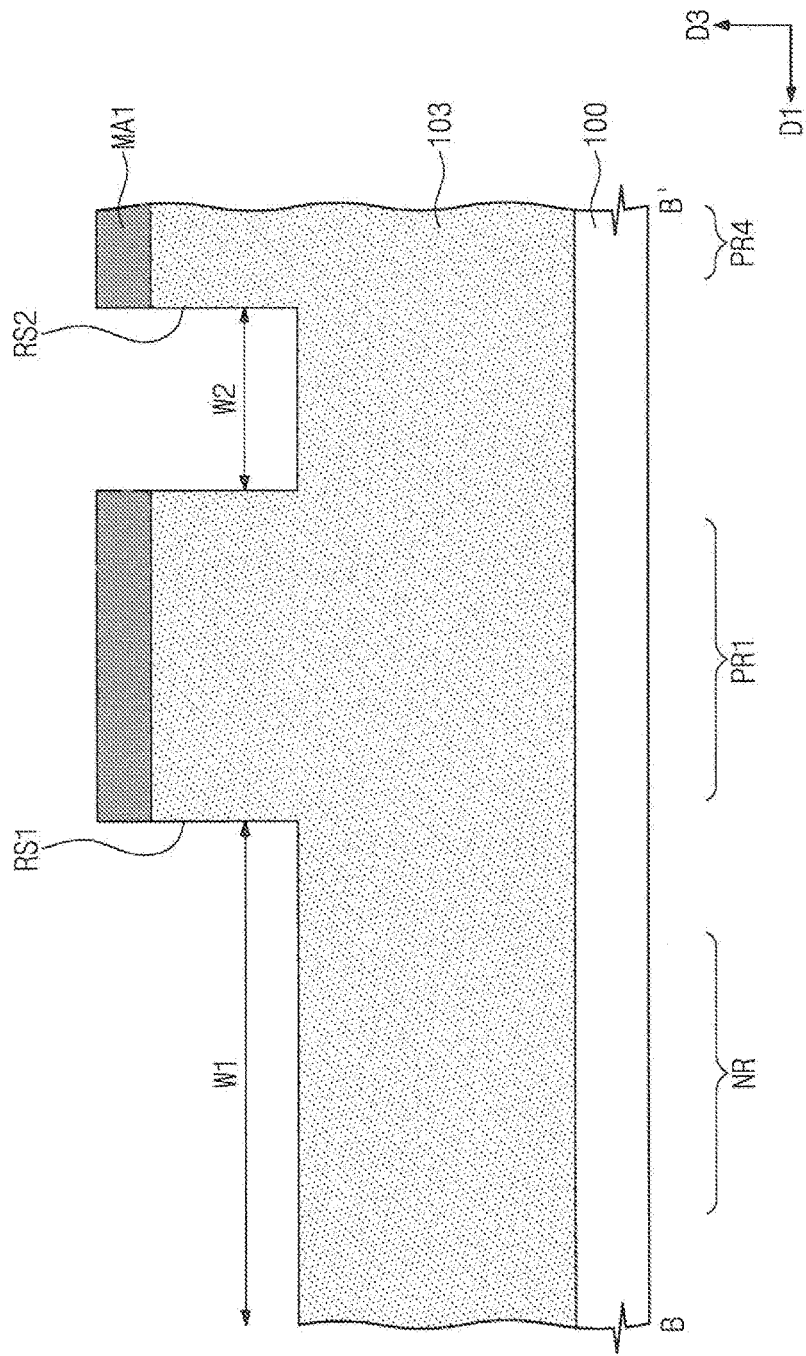

Referring to FIGS. 3A to 3C, a first semiconductor layer 103 may be formed on a substrate 100. The first semiconductor layer 103 may be formed by a selective epitaxial growth process using a top surface of the substrate 100 as a seed layer. As an example, the substrate 100 may be a silicon substrate, and the first semiconductor layer 103 may be a silicon germanium (SiGe) or germanium (Ge) pattern formed by the selective epitaxial growth process. The first semiconductor layer 103 may be a strain relaxed buffer (SRB) layer. As another example, before the formation of the first semiconductor layer 103, the SRB layer may be further formed between the first semiconductor layer 103 and the substrate 100. Here, a germanium (Ge) concentration of the SRB layer may be lower than that of an upper portion of the first semiconductor layer 103.

The substrate 100 may include an NMOSFET region NR and PMOSFET regions PR1-PR4. The PMOSFET regions PR1-PR4 may include first to fourth PMOSFET regions PR1, PR2, PR3, and PR4. The NMOSFET region NR and the first to fourth PMOSFET regions PR1-PR4 may be configured to have substantially the same features and elements as those of the embodiments previously described with reference to FIGS. 1 and 2A to 2C.

A first recess region RS1 and a second recess region RS2 may be formed in an upper portion of the first semiconductor layer 103. When viewed in a plan view, the first recess region RS1 may overlap the NMOSFET region NR. When viewed in a plan view, the second recess region RS2 may be interposed between the first PMOSFET region PR1 and the fourth PMOSFET region PR4. However, the first and second recess regions RS1 and RS2 may not overlap the first to fourth PMOSFET regions PR1-PR4.

When measured in the first direction D1, a first width W1 of the first recess region RS1 may be greater than a second width W2 of the second recess region RS2. By contrast, when measured in the second direction D2, a width of the first recess region RS1 may be substantially the same as that of the second recess region RS2. In addition, the first recess region RS1 and the second recess region RS2 may be formed to have substantially the same depth.

The formation of the first and second recess regions RS1 and RS2 may include forming a first mask pattern MA1 on the first semiconductor layer 103 and patterning the upper portion of the first semiconductor layer 103 using the first mask pattern MA1 as an etch mask. In other words, the first mask pattern MA1 may define positions and shapes of the first and second recess regions RS1 and RS2.

Figure 4A:
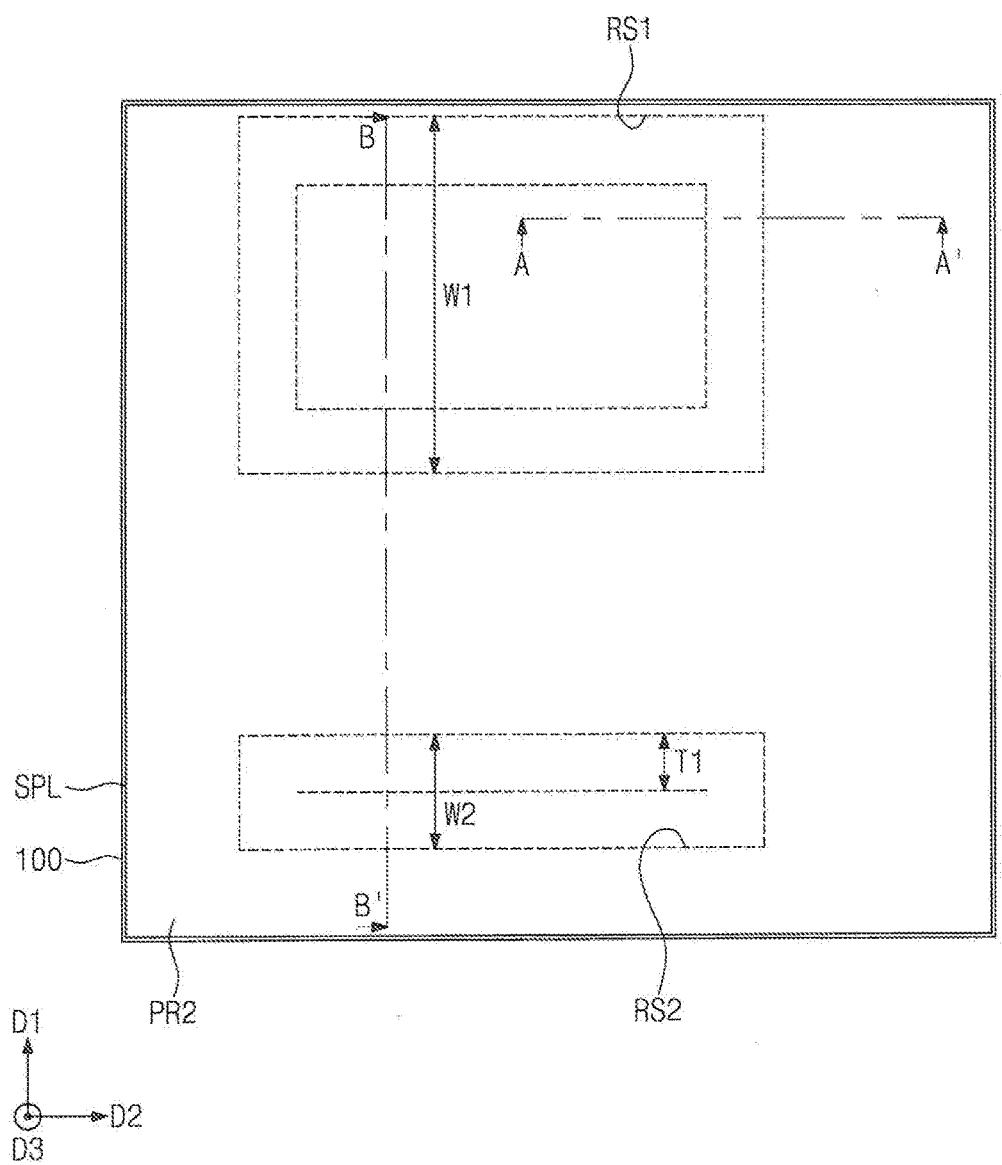
Figure 4B:
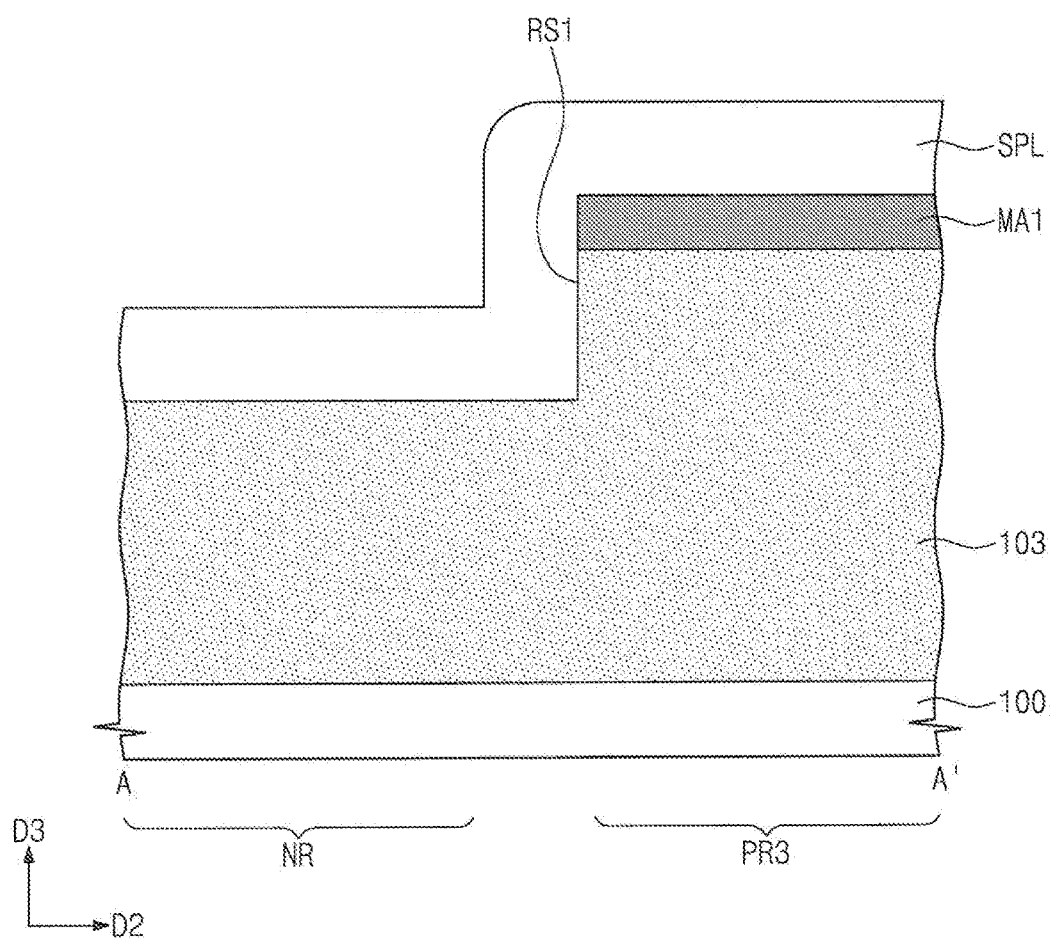
Figure 4C:
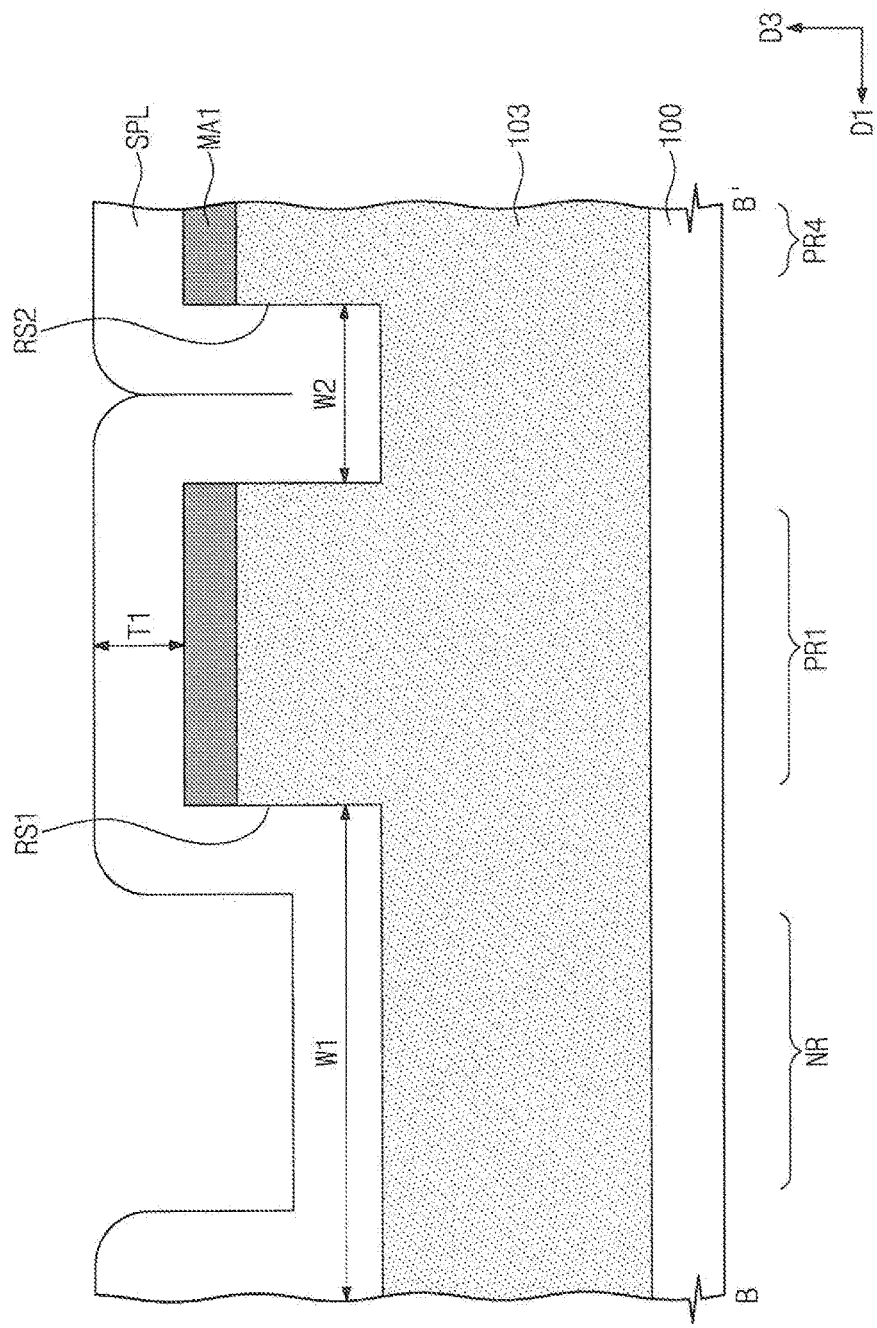

Referring to FIGS. 4A to 4C, a spacer layer SPL may be conformally formed on the resulting structure with the first and second recess regions RS1 and RS2. The spacer layer SPL may be formed to have a thickness T1, allowing the spacer layer SPL to completely fill the second recess region RS2. For example, the thickness T1 of the spacer layer SPL may be at least half the second width W2. In certain embodiments, the spacer layer SPL may not fill the entire region of the first recess region RS1. The spacer layer SPL may be formed of, for example, a silicon oxide layer or a silicon oxynitride layer.

Figure 5A:
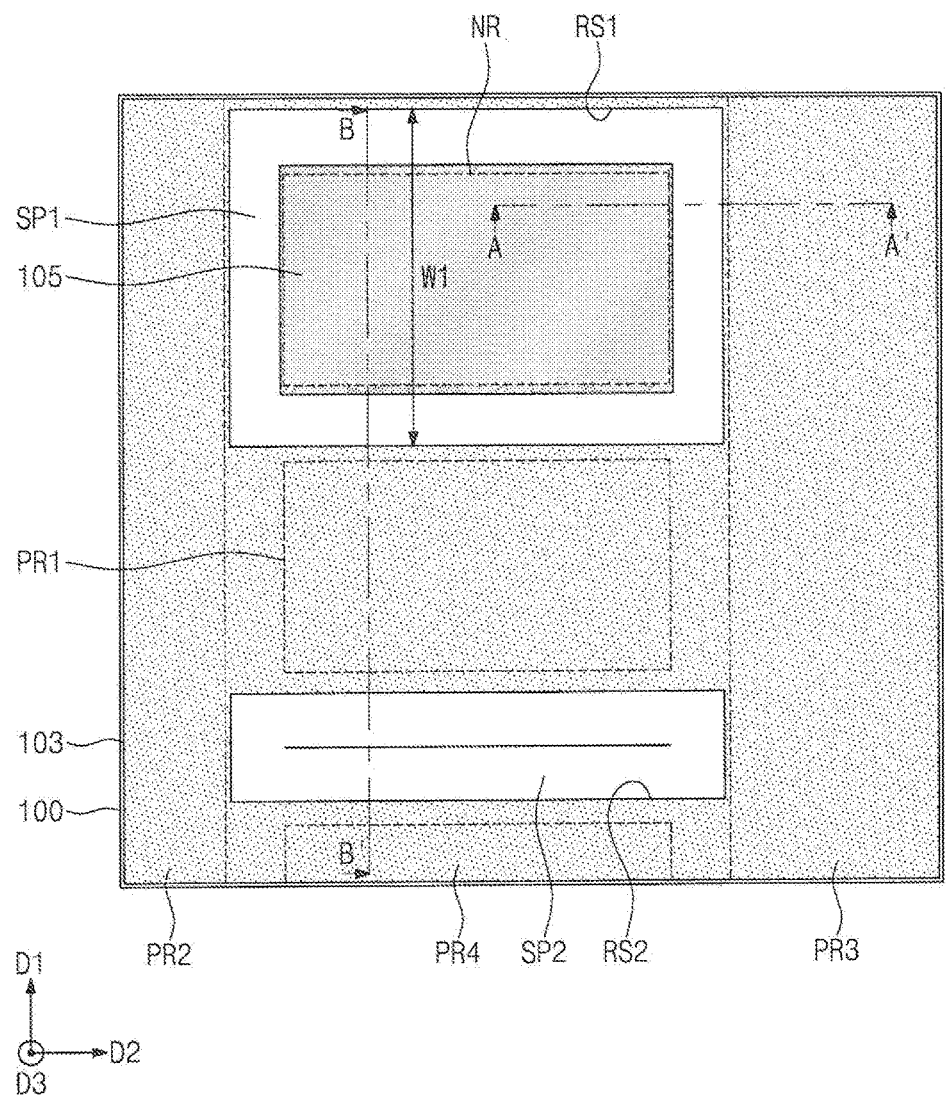
Figure 5B:
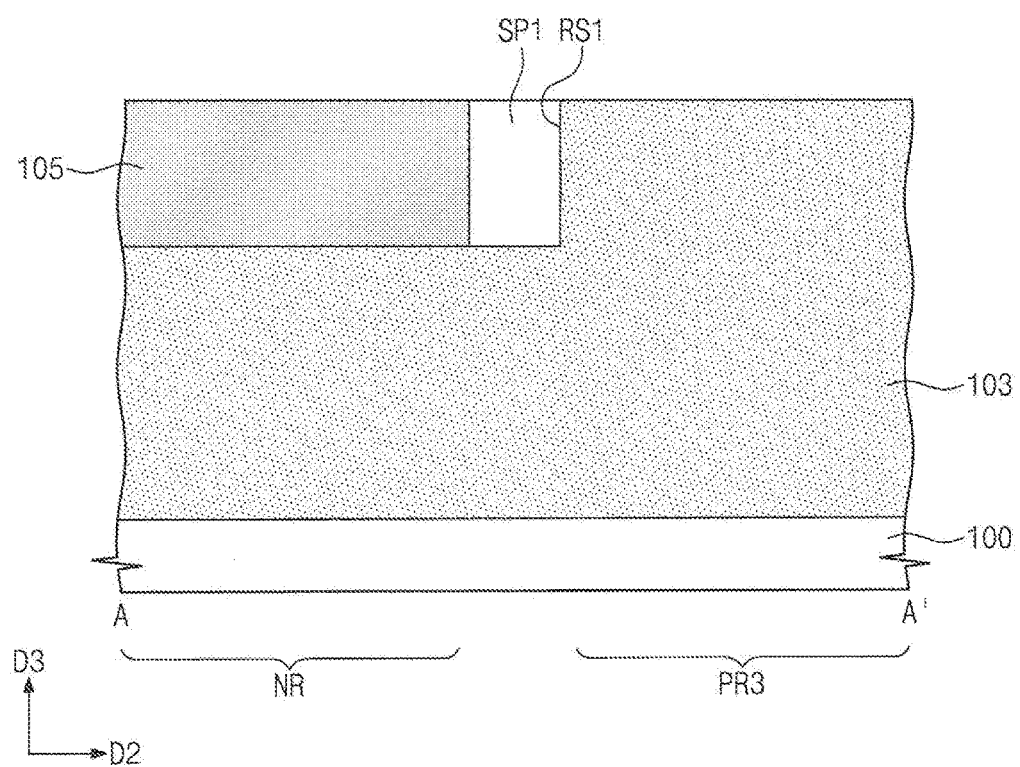
Figure 5C:
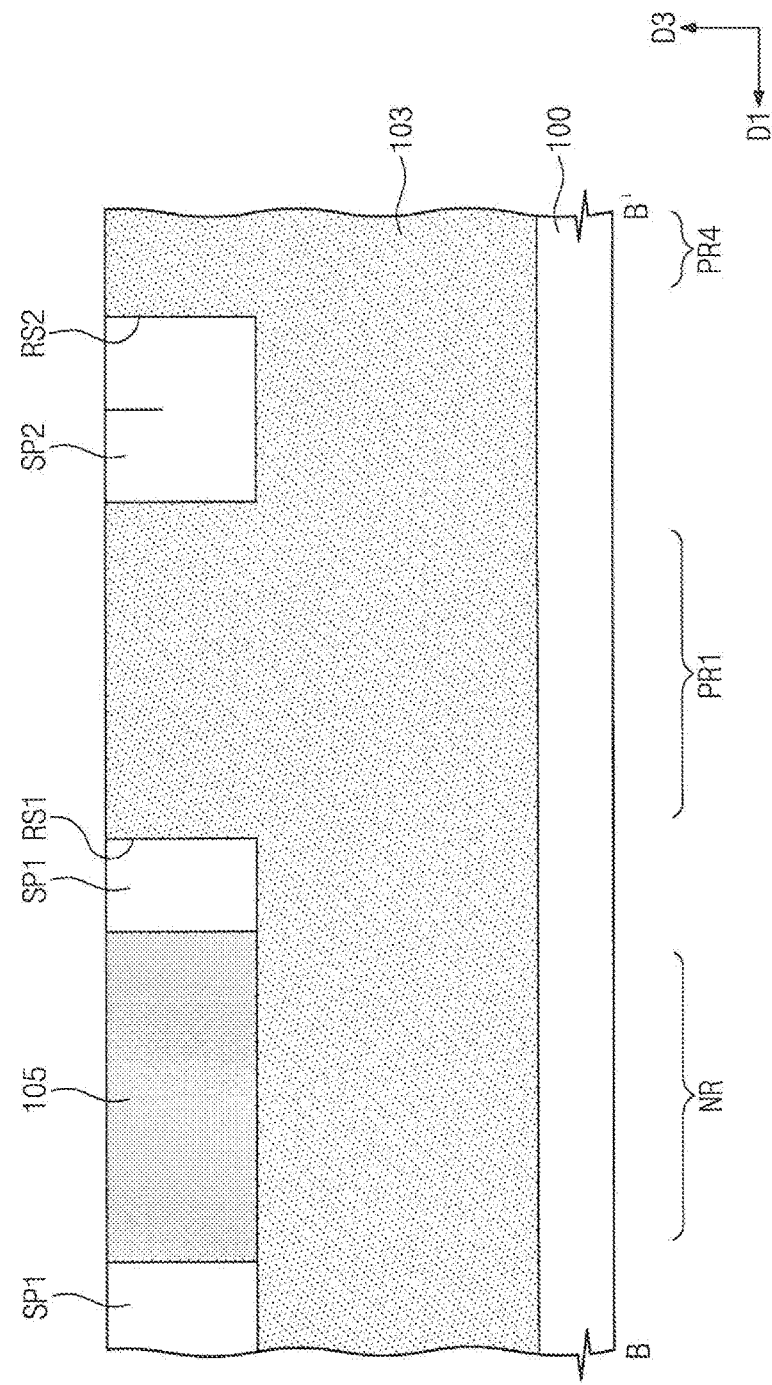

Referring to FIGS. 5A to 5C, the spacer layer SPL may be anisotropically etched to form a first spacer SP1 in the first recess region RS1 and a second spacer SP2 in the second recess region RS2. When viewed in a plan view, the first spacer SP1 may not overlap the NMOSFET region NR. A top surface of the first semiconductor layer 103 may be partially exposed by the first spacer SP1 in the first recess region RS1. However, because the second recess region RS2 is completely filled with the second spacer SP2, the first semiconductor layer 103 may not be exposed through the second recess region RS2.

A selective epitaxial growth process using the exposed top surface of the first semiconductor layer 103 as a seed layer may be performed to form a second semiconductor layer 105 on the first semiconductor layer 103, and, in some embodiments, the second semiconductor layer 105 may be formed to fill the first recess region RS1. The first spacer SP1 may be formed to enclose the second semiconductor layer 105. When viewed in a plan view, the second semiconductor layer 105 may overlap the NMOSFET region NR.

The second semiconductor layer 105 may be formed of or include at least one III-V semiconductor material. As an example, the III-V semiconductor material may include at least one of indium arsenic (InAs), gallium arsenic (GaAs), aluminum arsenic (AlAs), indium gallium arsenic (InGaAs), indium aluminum arsenic (InAlAs), indium aluminum arsenic antimony (InAlAsSb), indium phosphorus (InP), indium aluminum arsenic phosphorus (InAlAsP), indium gallium arsenic phosphorus (InGaAsP), gallium arsenic antimony (GaAsSb), indium aluminum antimony (InAlSb), indium antimony (InSb), gallium antimony (GaSb), aluminum antimony (AlSb), indium gallium antimony (InGaSb), aluminum arsenic antimony (AlAsSb), aluminum arsenide (AlAs), indium gallium phosphorus (InGaP), gallium arsenic phosphorus (GaAsP), or aluminum gallium arsenide (AlGaAs).

Thereafter, a planarization process may be performed to expose the top surface of the first semiconductor layer 103 on the first to fourth PMOSFET regions PR1-PR4. In certain embodiments, the first mask pattern MA1 may be removed during the planarization process. In some embodiments, the planarization process may include an etch-back process and/or a chemical mechanical polishing (CMP) process.

Figure 6A:
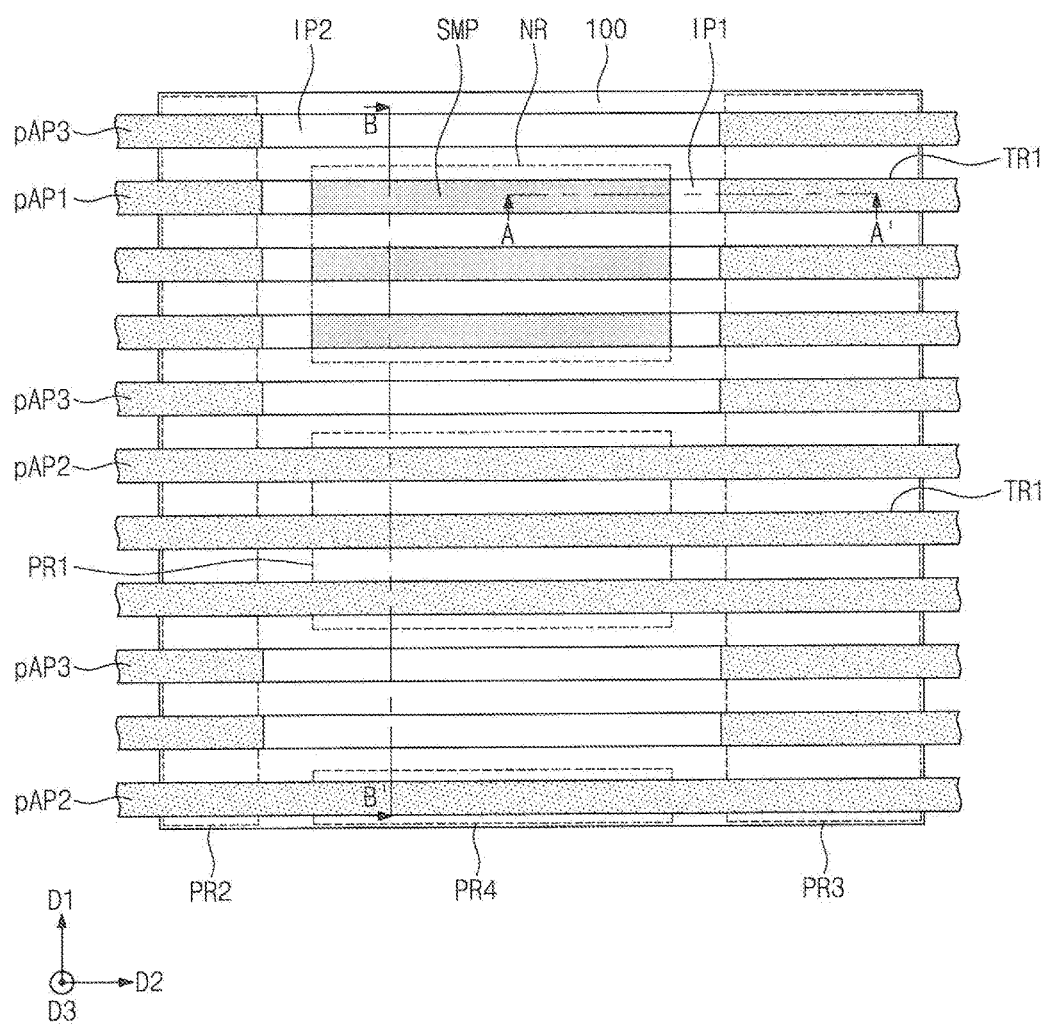
Figure 6B:
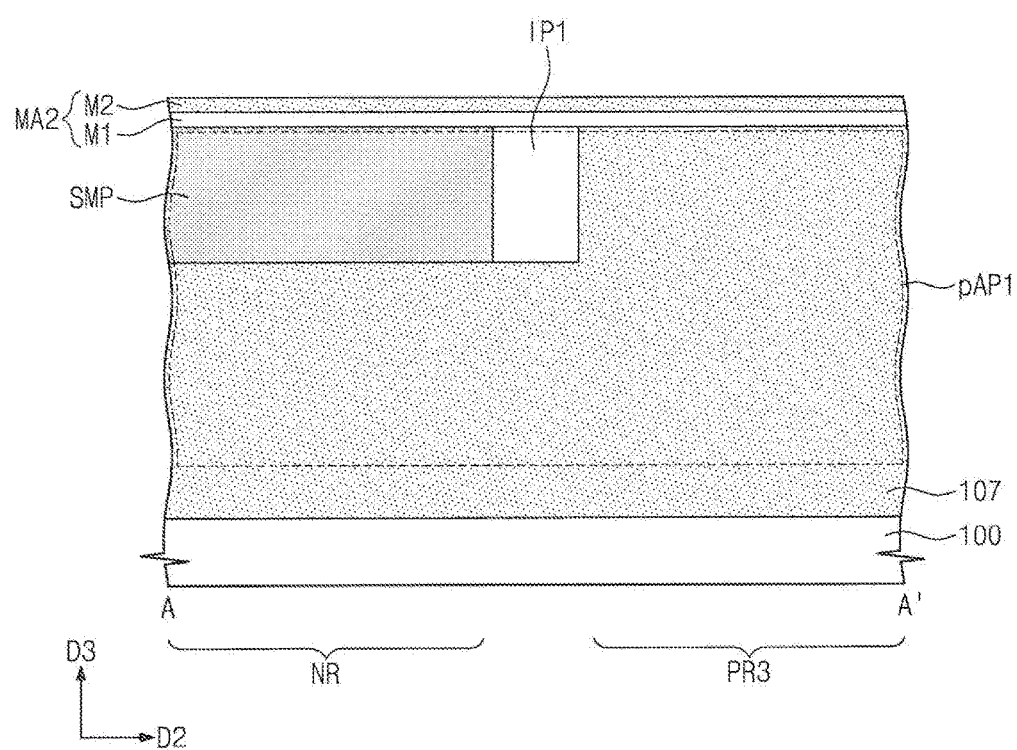
Figure 6C:
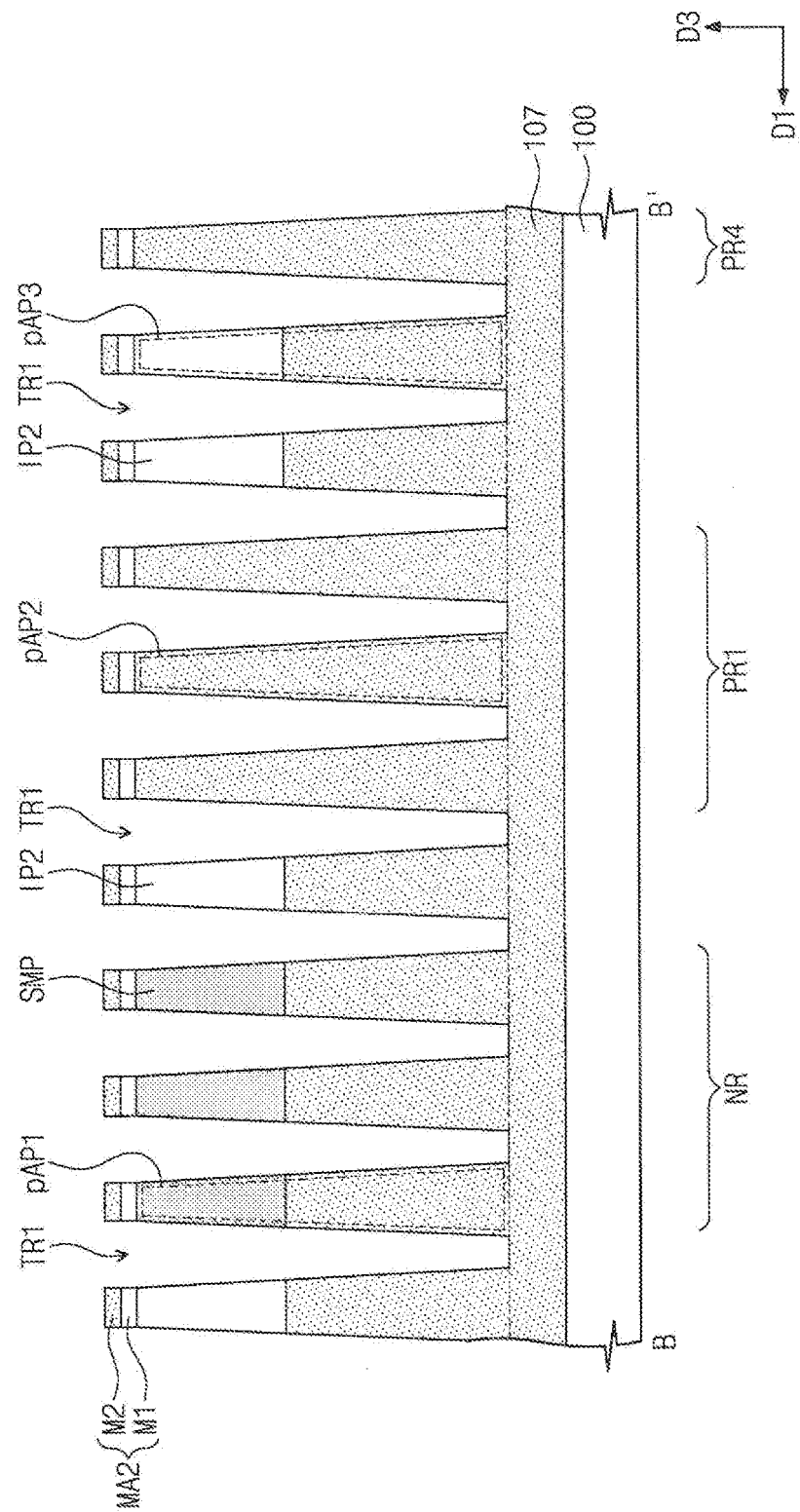

Referring to FIGS. 6A to 6C, the first and second semiconductor layers and first and second spacers 103, 105, SP1, and SP2 may be patterned to form first to third preliminary active patterns pAP1, pAP2, and pAP3. The first to third preliminary active patterns pAP1, pAP2, and pAP3 may have a line- or bar-shaped structure extending in the second direction D2. For example, the first to third preliminary active patterns pAP1, pAP2, and pAP3 may be formed by an anisotropic etching process capable of uniformly etching all of the first and second semiconductor layers and first and second spacers 103, 105, SP1, and SP2.

The first preliminary active patterns pAP1 may be formed to cross the NMOSFET region NR. The second preliminary active patterns pAP2 may be formed to cross the first and fourth PMOSFET regions PR1 and PR4. At least one of the third preliminary active patterns pAP3 may be formed to cross over a portion of the substrate 100 located between the NMOSFET region NR and the first PMOSFET region PR1. The third preliminary active patterns pAP3 may be formed to cross over another portion of the substrate 100 located between the first PMOSFET region PR1 and the fourth PMOSFET region PR4.

The first preliminary active patterns pAP1 may include semiconductor patterns SMP that are provided at upper portions thereof. The semiconductor patterns SMP may overlap the NMOSFET region NR, when viewed in a plan view. Furthermore, the first preliminary active patterns pAP1 may include first insulating patterns IP1 that are provided at upper portions thereof. When viewed in a plan view, the first insulating patterns IP1 may be interposed between the NMOSFET region NR and the second PMOSFET region PR2 and between the NMOSFET region NR and the third PMOSFET region PR3. The third preliminary active patterns pAP3 may include second insulating patterns IP2 that are respectively provided at upper portions thereof.

The formation of the first to third preliminary active patterns pAP1, pAP2, and pAP3 may include forming second mask patterns MA2 on the substrate 100, and then, anisotropically etching the first semiconductor layer 103, the second semiconductor layer 105, the first spacer SP1, and the second spacer SP2 using the second mask patterns MA2 as an etch mask. As a result, first trenches TR1 may be formed to define the first to third preliminary active patterns pAP1, pAP2, and pAP3. Each of the second mask patterns MA2 may include a buffer pattern M1 and a hard mask pattern M2 that are sequentially stacked on the substrate 100. As an example, the buffer pattern M1 may be formed of or include a silicon oxide layer or a silicon oxynitride layer, and the hard mask pattern M2 may be formed of or include a silicon nitride layer.

In detail, the first semiconductor layer 103 may be patterned to form a lower semiconductor layer 107 below the first trenches TR1. The first to third preliminary active patterns pAP1, pAP2, and pAP3 may be positioned on the lower semiconductor layer 107. The first semiconductor layer 103 may be patterned to form lower portions of the first and third preliminary active patterns pAP1 and pAP3. The first semiconductor layer 103 may be patterned to form the second preliminary active patterns pAP2. The second semiconductor layer 105 may be patterned to form the semiconductor patterns SMP. The first and second spacers SP1 and SP2 may be patterned to form the first and second insulating patterns IP1 and IP2.

Figure 7A:
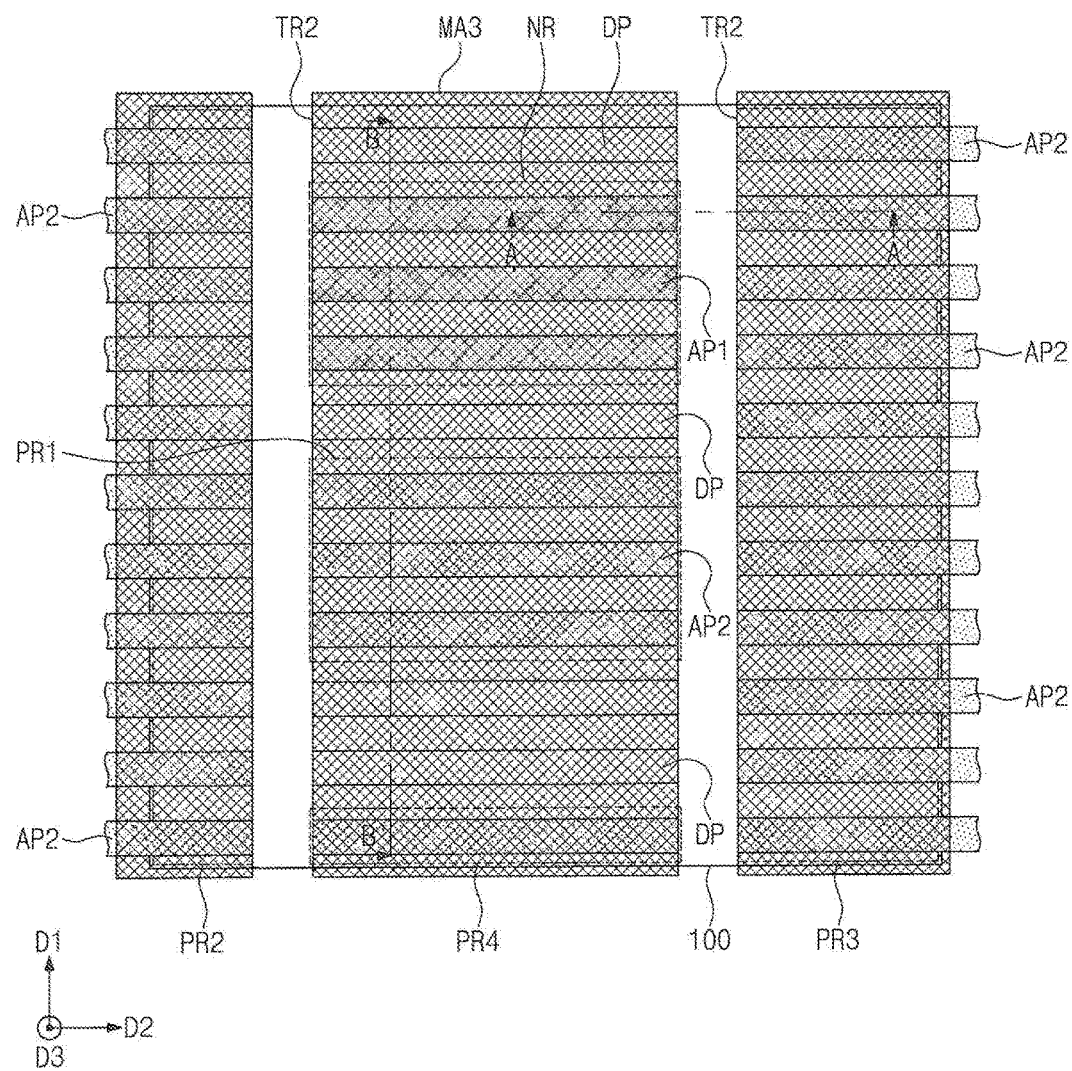
Figure 7B:
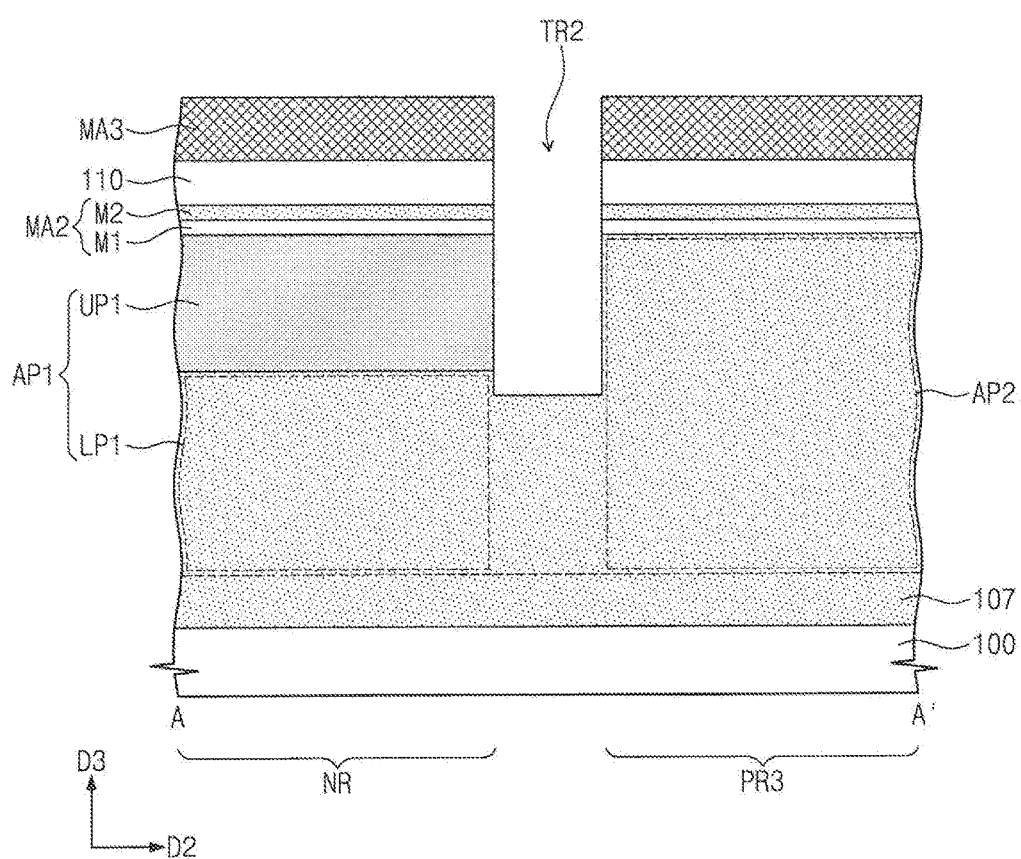
Figure 7C:
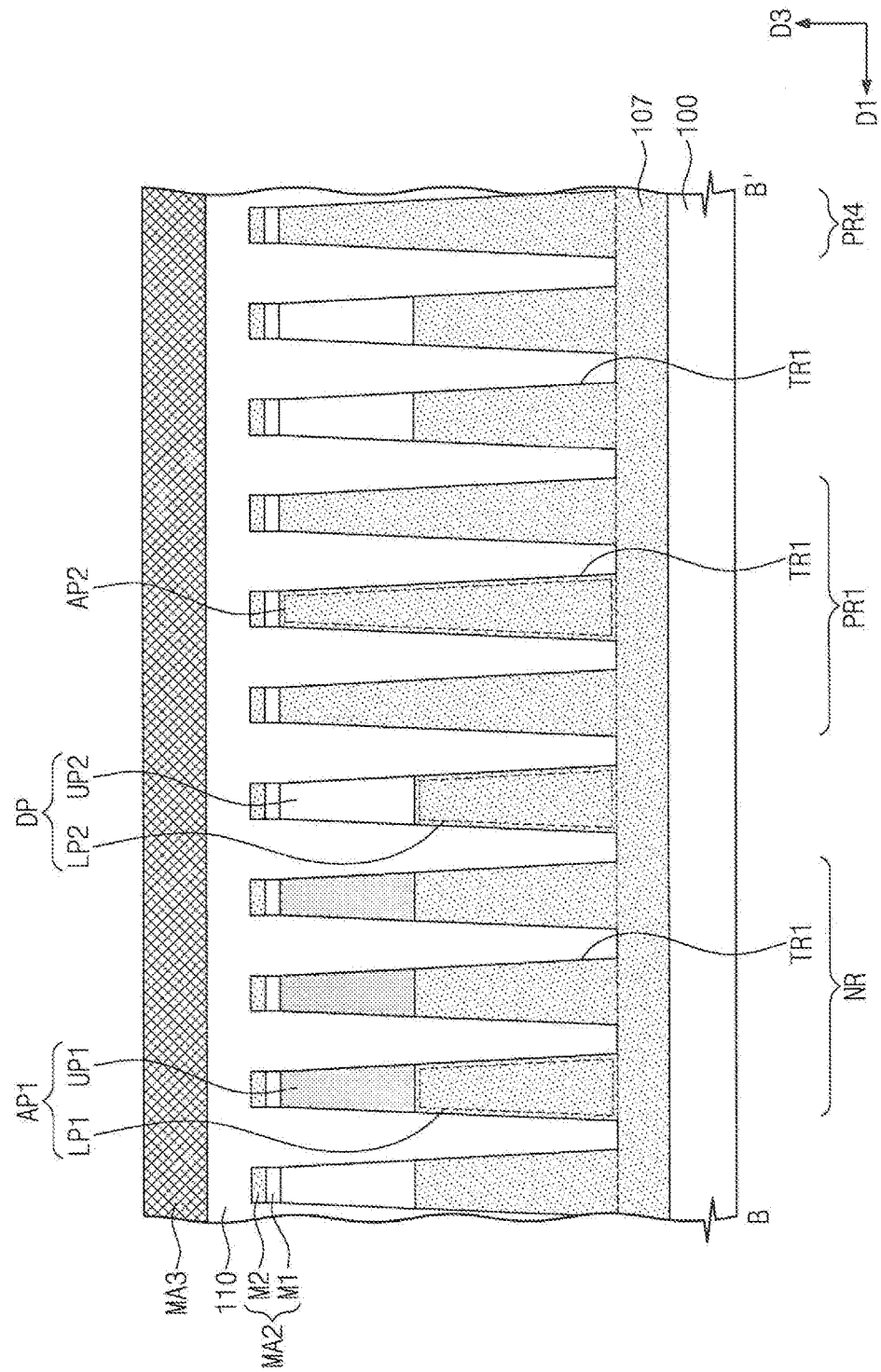

Referring to FIGS. 7A to 7C, an insulating gapfill layer 110 may be formed on the resulting structure with the first to third preliminary active patterns pAP1, pAP2, and pAP3. The insulating gapfill layer 110 may be formed to completely cover the first to third preliminary active patterns pAP1, pAP2, and pAP3. A third mask pattern MA3 may be formed on the insulating gapfill layer 110. Using the third mask pattern MA3 as an etch mask, upper portions of the first to third preliminary active patterns pAP1, pAP2, and pAP3 may be patterned to form first active patterns AP1, second active patterns AP2, and dummy patterns DP. As an example, the insulating gapfill layer 110 may be formed of or include a silicon oxide layer or a silicon oxynitride layer.

Each of the first active patterns AP1 may include a first lower pattern LP1 and a first upper pattern UP1 on the first lower pattern LP1. For example, the semiconductor patterns SMP of the first preliminary active patterns pAP1 may be patterned to form the first upper patterns UP1. Each of the second active patterns AP2 may include lower and upper portions which are formed of the same semiconductor material (e.g., containing germanium (Ge)). Each of the dummy patterns DP may include a second lower pattern LP2 and a second upper pattern UP2 on the second lower pattern LP2. In detail, the second insulating patterns IP2 of the third preliminary active patterns pAP3 may be patterned to form the second upper patterns UP2. Except for these distinctions, the first active patterns AP1, the second active patterns AP2 and the dummy patterns DP may be configured to have substantially the same features and elements as those of the embodiments previously described with reference to FIGS. 1 and 2A to 2C.

The formation of the first active patterns AP1, the second active patterns AP2, and the dummy patterns DP may include forming second trenches TR2, which are formed to cross the first to third preliminary active patterns pAP1, pAP2, and pAP3. At least one of the second trenches TR2 may be formed to extend in the first direction D1 on regions between the NMOSFET region NR and the second PMOSFET region PR2, between the first PMOSFET region PR1 and the second PMOSFET region PR2, and between the fourth PMOSFET region PR4 and the second PMOSFET region PR2. Another of the second trenches TR2 may be formed to extend in the first direction D1 on regions between the NMOSFET region NR and the third PMOSFET region PR3, between the first PMOSFET region PR1 and the third PMOSFET region PR3, and between the fourth PMOSFET region PR4 and the third PMOSFET region PR3. The second trenches TR2 may be formed to have bottom surfaces lower than those of the semiconductor patterns SMP and the first and second insulating patterns IP1 and IP2 relative to the substrate 100. In certain embodiments, the first insulating patterns IP1 may be completely removed when the second trenches TR2 are formed.

Figure 8A:
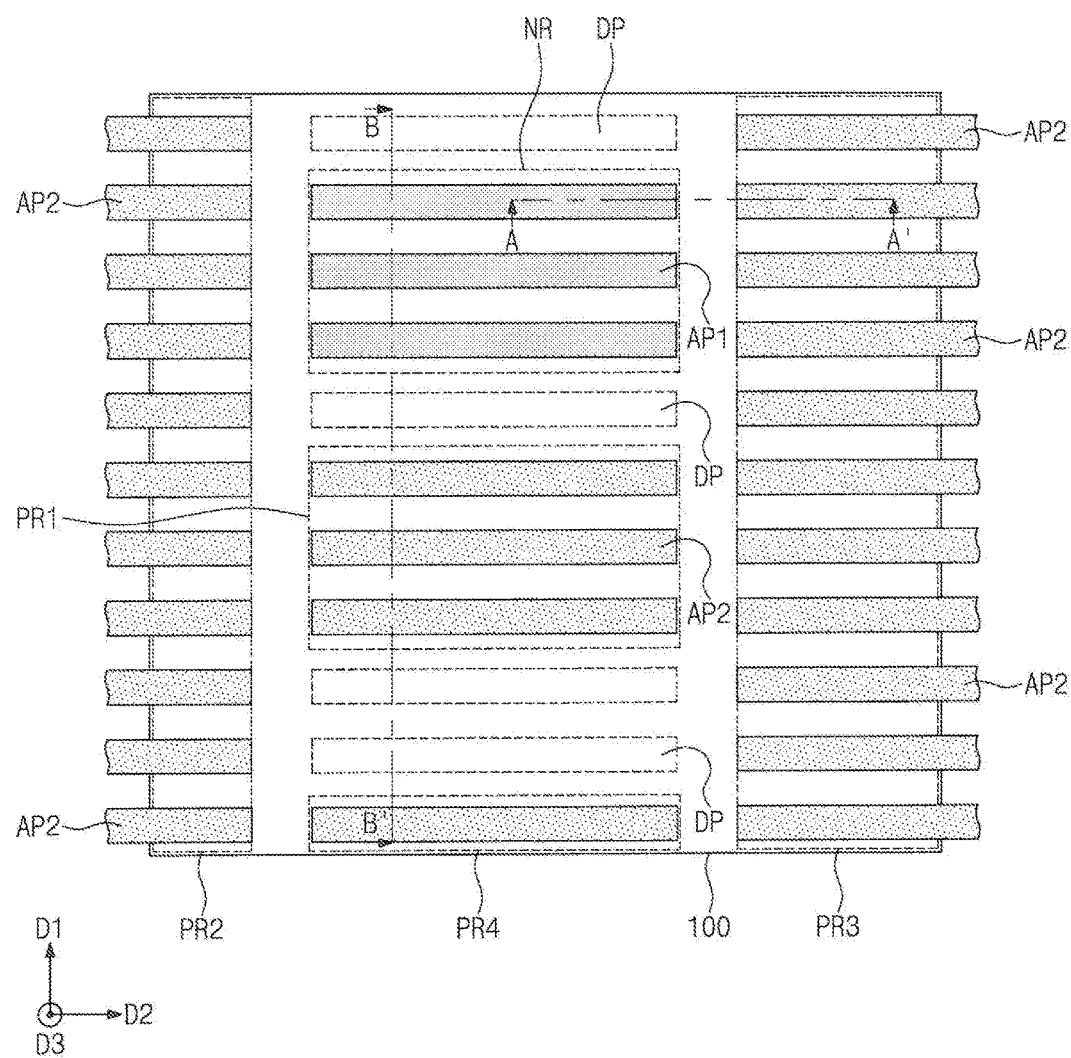
Figure 8B:
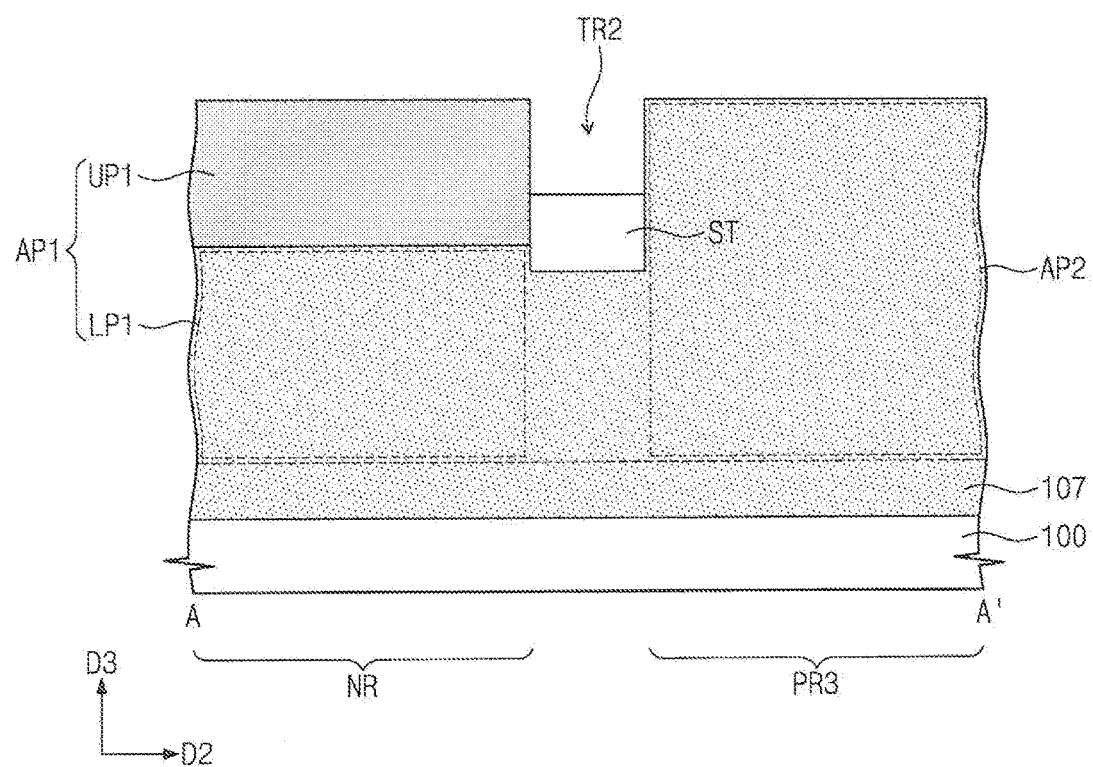
Figure 8C:
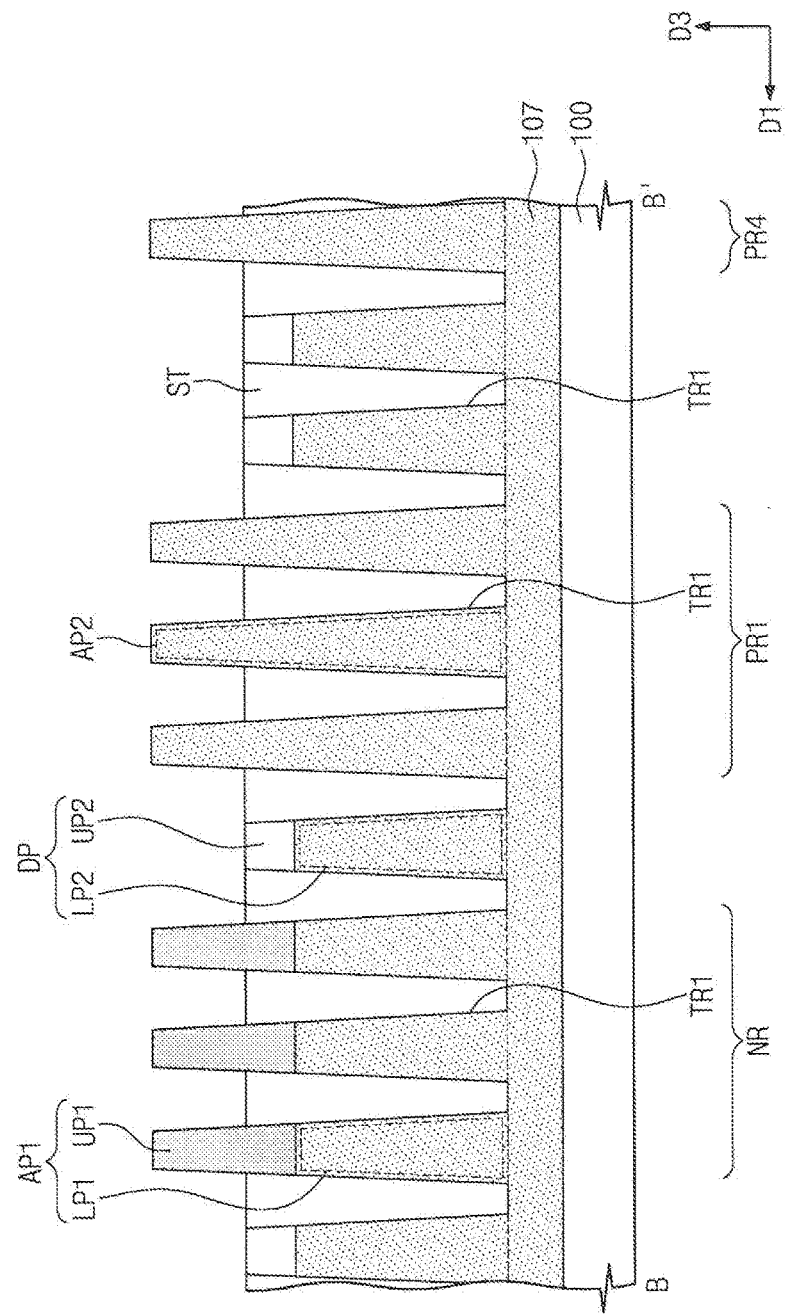

Referring to FIGS. 8A to 8C, an additional insulating gapfill layer may be formed to fill the second trenches TR2. The additional insulating gapfill layer may be formed of or include, for example, a silicon oxide layer or a silicon oxynitride layer. Thereafter, a planarization process may be performed to expose top surfaces of the first active patterns AP1, the second active patterns AP2, and the dummy patterns DP. During the planarization process, the second and third mask patterns MA2 and MA3 may be removed. Next, the insulating gapfill layer 110 and the additional insulating gapfill layer may be recessed to form device isolation patterns ST filling the first and second trenches TR1 and TR2. The recessing of the insulating gapfill layer 110 and the additional insulating gapfill layer may be performed using a wet etching process. The wet etching process on the insulating gapfill layer 110 and the additional insulating gapfill layer may be performed using an etch recipe having an etch selectivity with respect to the first and second active patterns AP1 and AP2.

As a result of the recessing of the insulating gapfill layer 110 and the additional insulating gapfill layer, upper portions (e.g., the first upper patterns UP1) of the first active patterns AP1 and upper portions of the second active patterns AP2 may be formed to have a fin-shaped structure that is positioned between the device isolation patterns ST and has an upwardly protruding shape. The second upper patterns UP2 may also be recessed during the recessing of the insulating gapfill layer 110 and the additional insulating gapfill layer. Accordingly, the dummy patterns DP may have top surfaces that are substantially coplanar with those of the device isolation patterns ST.

Referring to FIGS. 9A to 9D, sacrificial gate patterns 120 and gate mask patterns 125, which are sequentially stacked, may be formed on the first and second active patterns AP1 and AP2, the dummy patterns DP, and the device isolation patterns ST. The sacrificial gate patterns 120 may be a line- or bar-shaped structure which crosses the first and second active patterns AP1 and AP2 and extends in the first direction D1. Some of the sacrificial gate patterns 120 may be formed on the device isolation patterns ST filling the second trenches TR2.

In detail, the formation of the sacrificial gate patterns 120 and the gate mask patterns 125 may include sequentially forming a sacrificial gate layer and a gate mask layer on the substrate 100 and patterning the sacrificial gate layer and the gate mask layer. The sacrificial gate layer may be formed of or include a poly-silicon layer. The gate mask layer may be formed of or include a silicon nitride layer or a silicon oxynitride layer.

Gate spacers GS may be formed on both sidewalls of each of the sacrificial gate patterns 120. The formation of the gate spacers GS may include conformally forming a gate spacer layer on the resulting structure provided with the sacrificial gate patterns 120 and anisotropically etching the gate spacer layer. The gate spacer layer may be formed of or include at least one of a silicon oxide layer, a silicon nitride layer, or a silicon oxynitride layer.

Referring to FIGS. 10A to 10D, first and second source/drain regions SD1 and SD2 may be formed at both sides of each of the sacrificial gate patterns 120. The first source/drain regions SD1 may be formed in the upper portions (e.g., the first upper patterns UP1) of the first active patterns AP1, and the second source/drain regions SD2 may be formed in the upper portions of the second active patterns AP2.

In detail, the formation of the first source/drain regions SD1 may include etching the upper portions of the first active patterns AP1 using the gate mask patterns 125 and the gate spacers GS as an etch mask, and performing a selective epitaxial growth process using the etched upper portions of the first active patterns AP1 as a seed layer. The formation of the second source/drain regions SD2 may include etching upper portions of the second active patterns AP2 using the gate mask patterns 125 and the gate spacers GS as an etch mask, and performing a selective epitaxial growth process using the etched upper portions of the second active patterns AP2 as a seed layer. In some embodiments, the selective epitaxial growth process may include a chemical vapor deposition (CVD) process or a molecular beam epitaxy (i) process.

The first source/drain regions SD1 may be formed to exert a tensile strain to first channel regions CH1 of the first upper patterns UP1 interposed therebetween. As an example, when the first upper patterns UP1 (or the first channel regions CH1) are formed of or include indium gallium arsenic (InGaAs), the first source/drain regions SD1 may be formed of an indium gallium arsenic (InGaAs) layer whose content is different from that of the first channel regions CH1. In this case, the first source/drain regions SD1 may exert a tensile strain to the first channel regions CH1. During or after the epitaxial growth process, the first source/drain regions SD1 may be doped with n-type impurities.

By contrast, the second source/drain regions SD2 may be formed to exert a compressive strain to second channel regions CH2 of the second active patterns AP2 interposed therebetween. As an example, when the upper portions (e.g., the second channel regions CH2) of the second active patterns AP2 are formed of or include silicon germanium (SiGe), the second source/drain regions SD2 may be formed a silicon germanium (SiGe) layer whose content is different from that of the second channel regions CH2. In this case, the second source/drain regions SD2 may exert a compressive strain to the second channel regions CH2. During or after the epitaxial growth process, the second source/drain regions SD2 may be doped with p-type impurities.

In some embodiments, the first and second source/drain regions SD1 and SD2 may be epitaxial patterns made of different materials, and, thus, the first and second source/drain regions SD1 and SD2 may differ from each other in terms of their shapes and sizes. Furthermore, the second source/drain regions SD2 may be more uniformly grown compared with the first source/drain regions SD1. For example, when viewed in a sectional view taken along the first direction D1, each of the second source/drain regions SD2 may have a tapered top. By contrast, each of the first source/drain regions SD1 may have a flat top as shown in FIG. 10D.

Referring to FIGS. 11A to 11D, a first interlayered insulating layer 140 may be formed on the resulting structure with the first and second source/drain regions SD1 and SD2. The first interlayered insulating layer 140 may be formed of or include, for example, a silicon oxide layer or a silicon oxynitride layer. Next, a planarization process may be performed on the first interlayered insulating layer 140 to expose top surfaces of the sacrificial gate patterns 120. The planarization process may include an etch-back and/or CMP process. In some embodiments, the gate mask patterns 125 on the sacrificial gate patterns 120 may be removed, during formation of the first interlayered insulating layer 140.

The sacrificial gate patterns 120 may be replaced with gate electrodes GE, respectively. For example, the formation of the gate electrodes GE may include removing the exposed sacrificial gate patterns 120 to form gap regions between the gate spacers GS, forming a gate dielectric layer and a gate conductive layer to sequentially fill the gap regions, and planarizing the gate dielectric layer and the gate conductive layer to forma gate dielectric pattern GI and the gate electrode GE in each of the gap regions. As an example, the gate dielectric layer may be formed of or include, for example, at least one of a silicon oxide layer, a silicon oxynitride layer, or high-k dielectric layers having a dielectric constant higher than that of silicon oxide. The gate conductive layer may be formed of or include at least one of doped semiconductor materials, conductive metal nitrides, or metals.

Thereafter, the gate dielectric patterns GI and the gate electrodes GE in the gap regions may be partially recessed, and then, capping patterns GP may be formed on the gate electrodes GE, respectively. In certain embodiments, the capping patterns GP may be formed of or include at least one of a silicon oxide layer, a silicon nitride layer, or a silicon oxynitride layer.

The gate dielectric pattern GI, the gate electrode GE, the gate spacers GS, and the capping pattern GP may constitute a gate structure 130. The gate dielectric pattern GI, the gate electrode GE, the gate spacers GS, and the capping pattern GP, which are formed on the device isolation pattern ST filling the second trench TR2, may constitute a dummy gate structure 135.

Referring back to FIGS. 1 and 2A to 2C, a second interlayered insulating layer 150 may be formed on the first interlayered insulating layer 140. The second interlayered insulating layer 150 may be formed of or include, for example, a silicon oxide layer or a silicon oxynitride layer.

Next, source/drain contacts CA may be formed at both sides of each of the gate structures 130. For example, contact holes may be formed to penetrate the second interlayered insulating layer 150 and the first interlayered insulating layer 140 and to expose the first and second source/drain regions SD1 and SD2. Upper portions of the first and second source/drain regions SD1 and SD2 may be partially etched when the contact holes are formed. Thereafter, a first conductive pattern 160 and a second conductive pattern 165 may be formed to sequentially fill each of the contact holes. The first conductive pattern 160 may be a barrier conductive layer, which may be formed of at least one of titanium nitride, tungsten nitride, or tantalum nitride. The second conductive pattern 165 may be a metal layer, which may be formed at least one of tungsten, titanium, or tantalum.

Although not shown, in a subsequent process, interconnection lines, which are respectively coupled to the source/drain contacts CA, may be formed on the second interlayered insulating layer 150. The interconnection lines may be formed of or include a conductive material.

In the method of fabricating a semiconductor device according to some embodiments of the inventive concept, recess regions may be formed using a single mask pattern and spacers may be formed in the recess regions, respectively. This may make it possible to form dummy patterns DP for separating NMOSFET and PMOSFET regions from each other during a subsequent process for forming active patterns. Accordingly, it may be possible to omit a deep trench isolation process, which is performed to separate the NMOSFET and PMOSFET regions from each other using an additional mask after the formation of the active patterns. That is, according to some embodiments of the inventive concept, it may be possible to fabricate a dual channel CMOS device through a simplified, cost-effective process.

Figure 12:
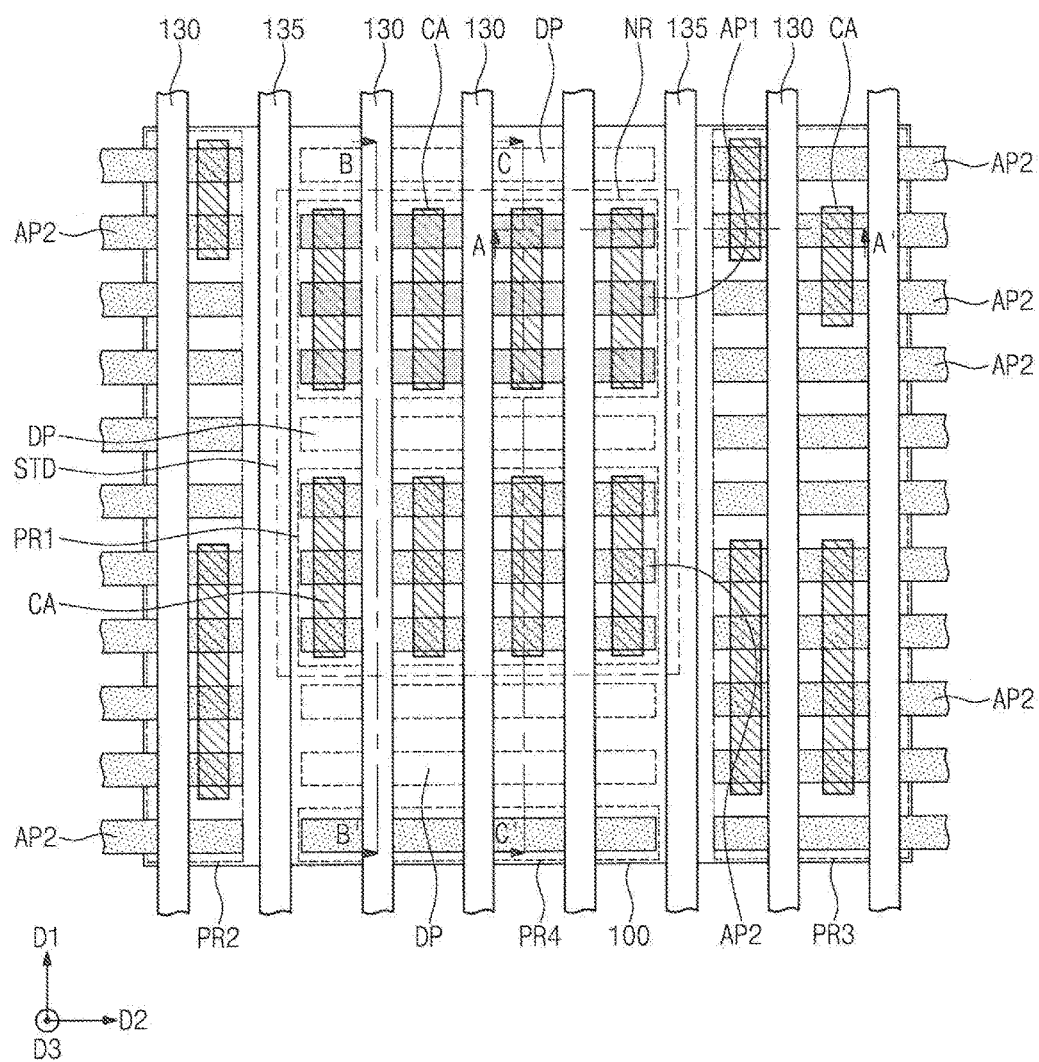
FIG. 12 is a plan view illustrating a semiconductor device according to some embodiments of the inventive concept.
Figure 13A:
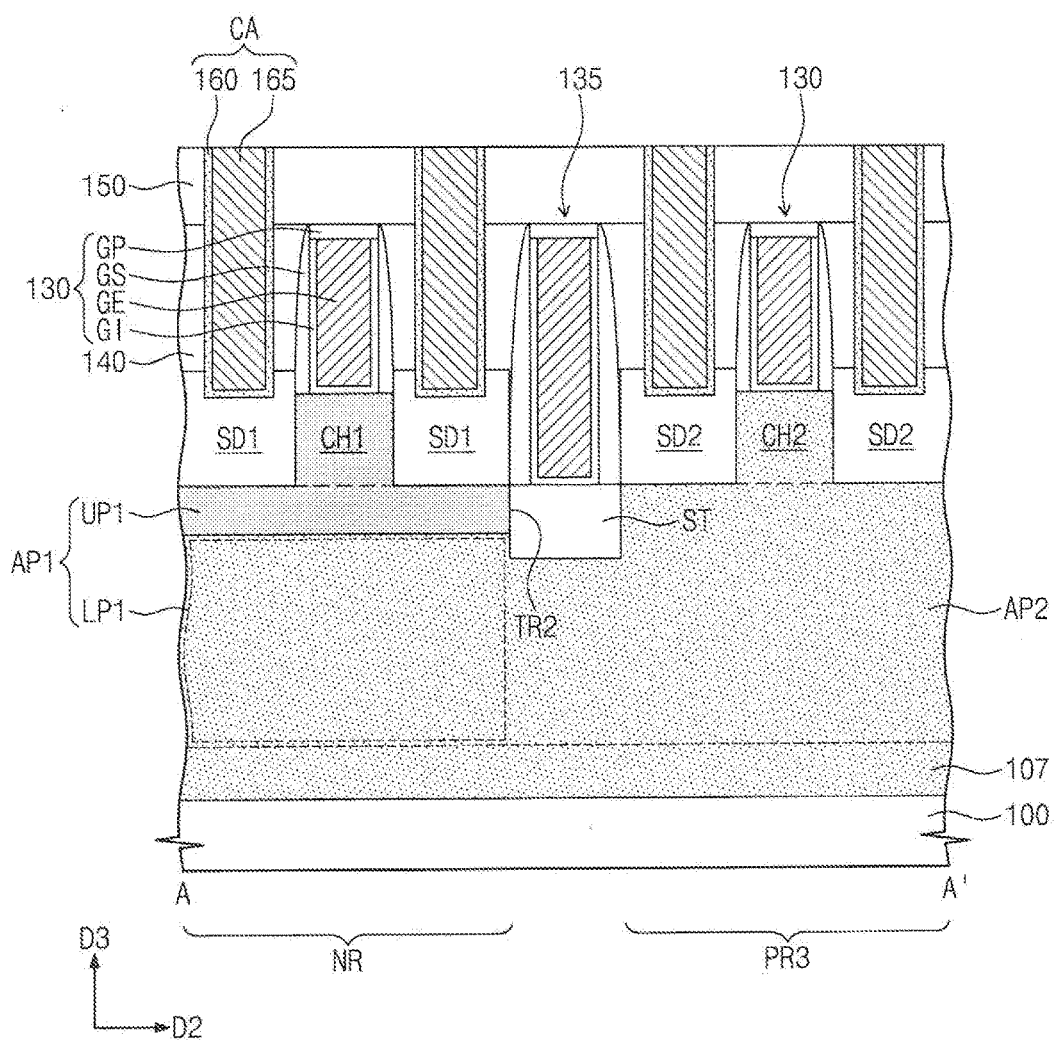
FIG. 13A is a sectional view taken along line A-A' of FIG. 12.
Figure 13B:
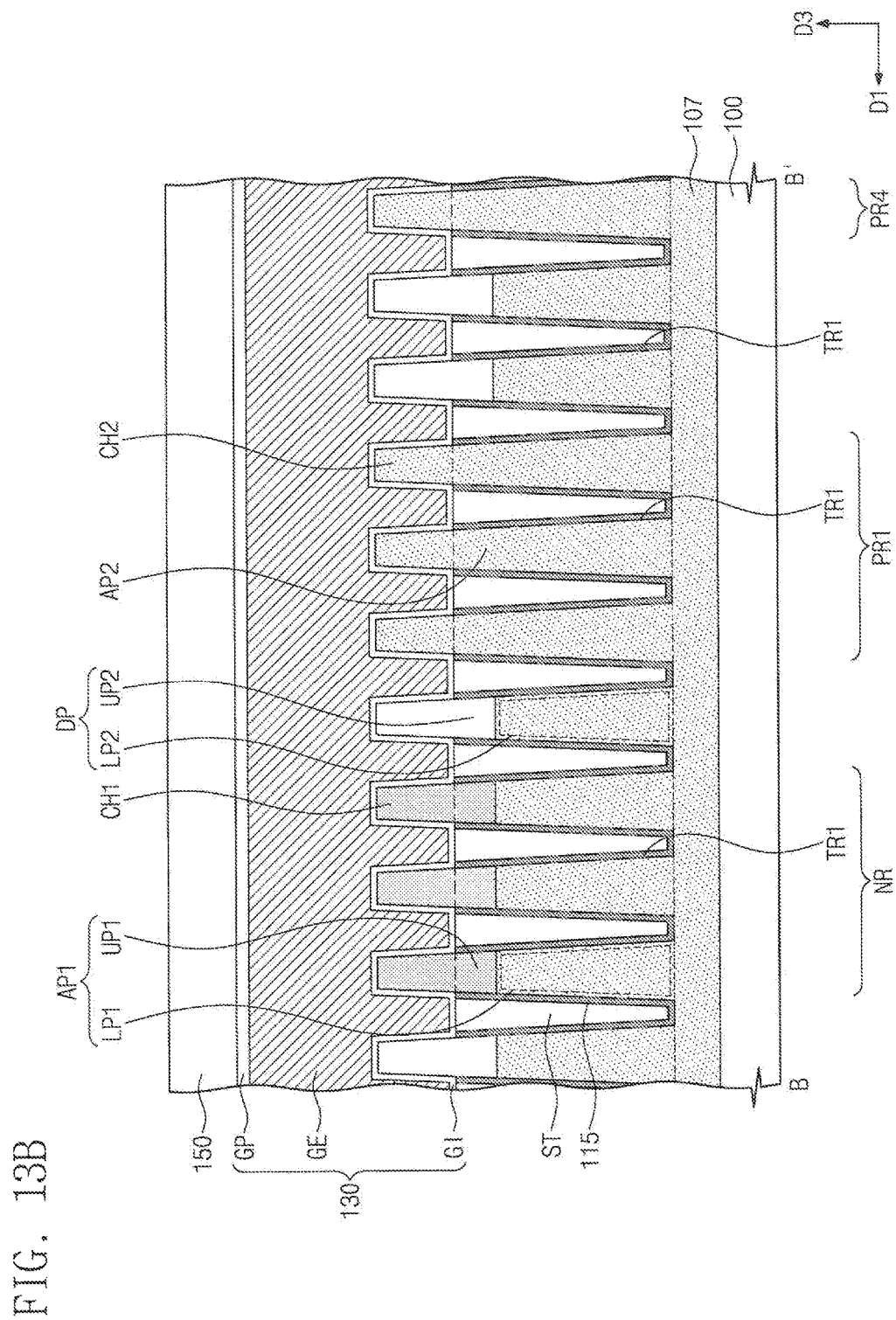
FIG. 13B is a sectional view taken along line B-B' of FIG. 12.
Figure 13C:
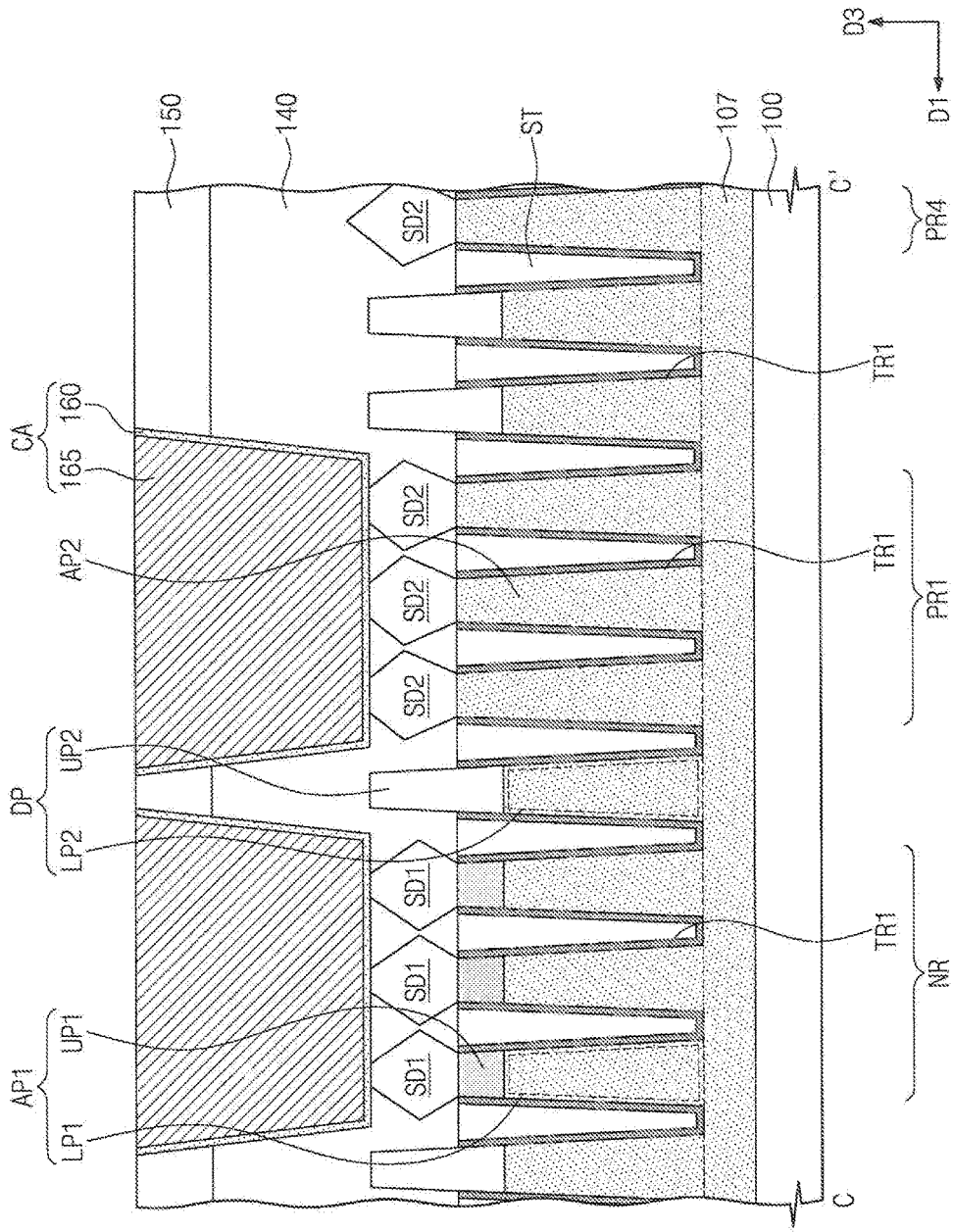
FIG. 13C is a sectional view taken along line C-C' of FIG. 12.

FIG. 12 is a plan view illustrating a semiconductor device according to some embodiments of the inventive concept. FIG. 13A is a sectional view taken along line A-A' of FIG. 12, FIG. 13B is a sectional view taken along line B-B' of FIG. 12, and FIG. 13C is a sectional view taken along line C-C' of FIG. 12. In the following description, an element previously described with reference to FIGS. 1 and 2A to 2C may be identified by a similar or identical reference number without repeating an overlapping description thereof for the sake of brevity.

Referring to FIGS. 12, 13A, 13B, and 13C, etch stop layers 115 may be interposed between the first active patterns AP1 and the device isolation patterns ST, between the second active patterns AP2 and the device isolation patterns ST, and between the dummy patterns DP and the device isolation patterns ST. In other words, each of the first trenches TR1 may be filled with the etch stop layer 115 and the device isolation pattern ST. The etch stop layer 115 may be formed of or include, for example, a silicon nitride layer.

Each of the dummy patterns DP may include the second lower pattern LP2 and the second upper pattern UP2 on the second lower pattern LP2. The second upper pattern UP2 may be provided between the device isolation patterns ST and may have a fin-shaped structure protruding in the third direction D3. For example, the second upper pattern UP2 may have top surface that are higher than those of the device isolation patterns ST. The second upper patterns UP2 may have top surfaces that are substantially coplanar with those of the first and second channel regions CH1 and CH2, as shown in FIG. 13B.

The gate structures 130 may cross not only the first and second channel regions CH1 and CH2 but also the second upper patterns UP2 and may extend in the first direction D1. The gate electrode GE and the gate dielectric pattern GI thereunder may cover top and side surfaces of the first upper pattern UP1.

In the present embodiment, the dummy patterns DP may resemble the first and second active patterns AP1 and AP2 in shape, but due to the second upper patterns UP2 made of an insulating material, the dummy patterns DP may provide a function similar to the device isolation patterns ST.

Figure 14A:
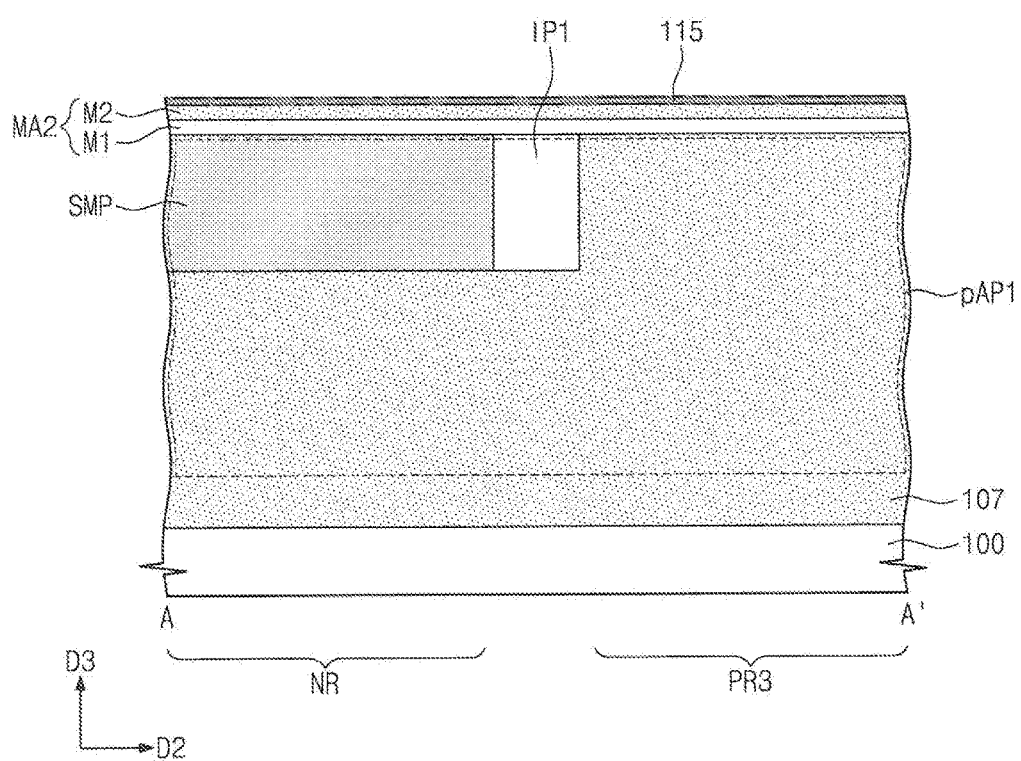
FIGS. 14A, 14B, 15A, and 15B are sectional views illustrating a method of fabricating a semiconductor device, according to some embodiments of the inventive concept.
Figure 14B:
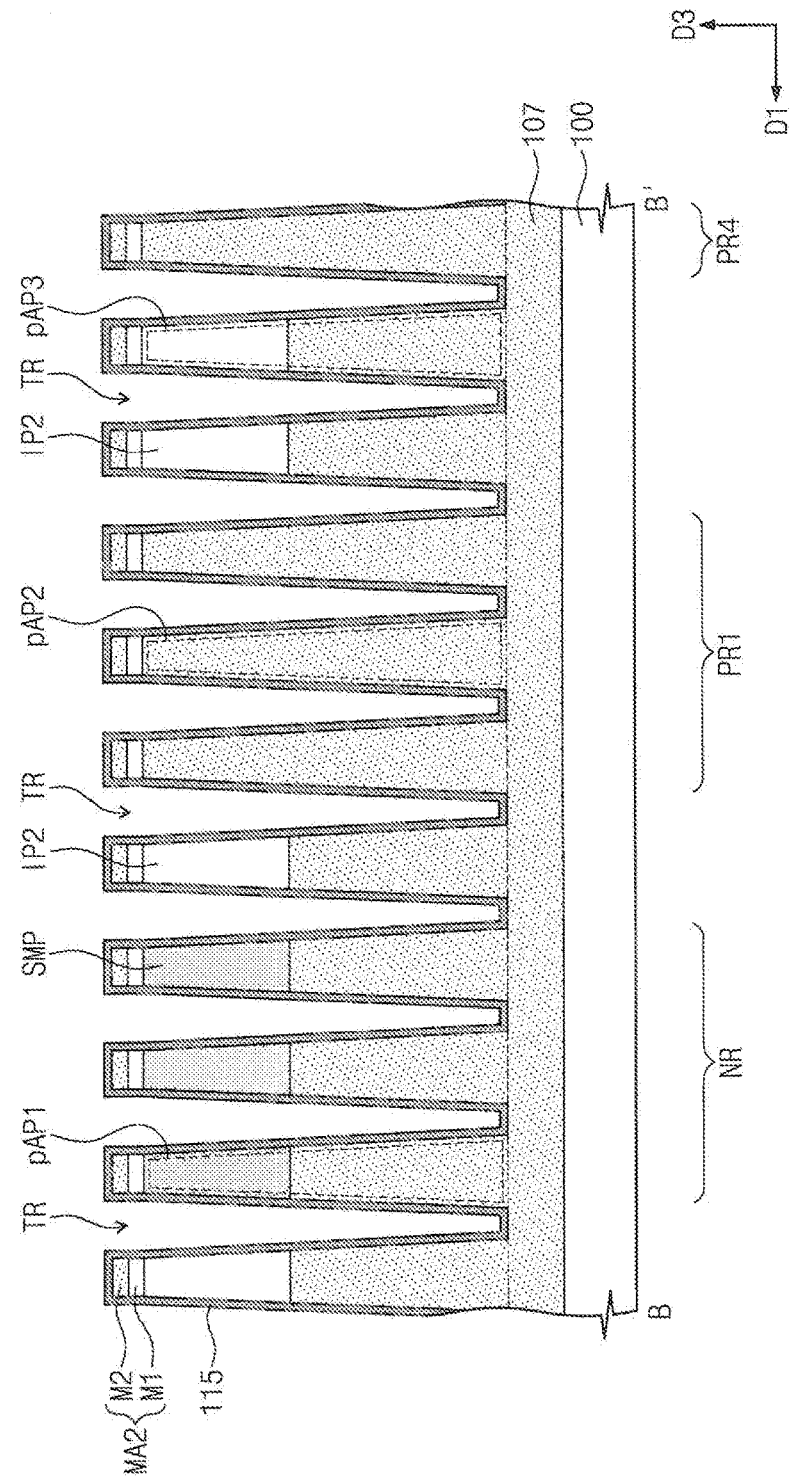
Figure 15A:
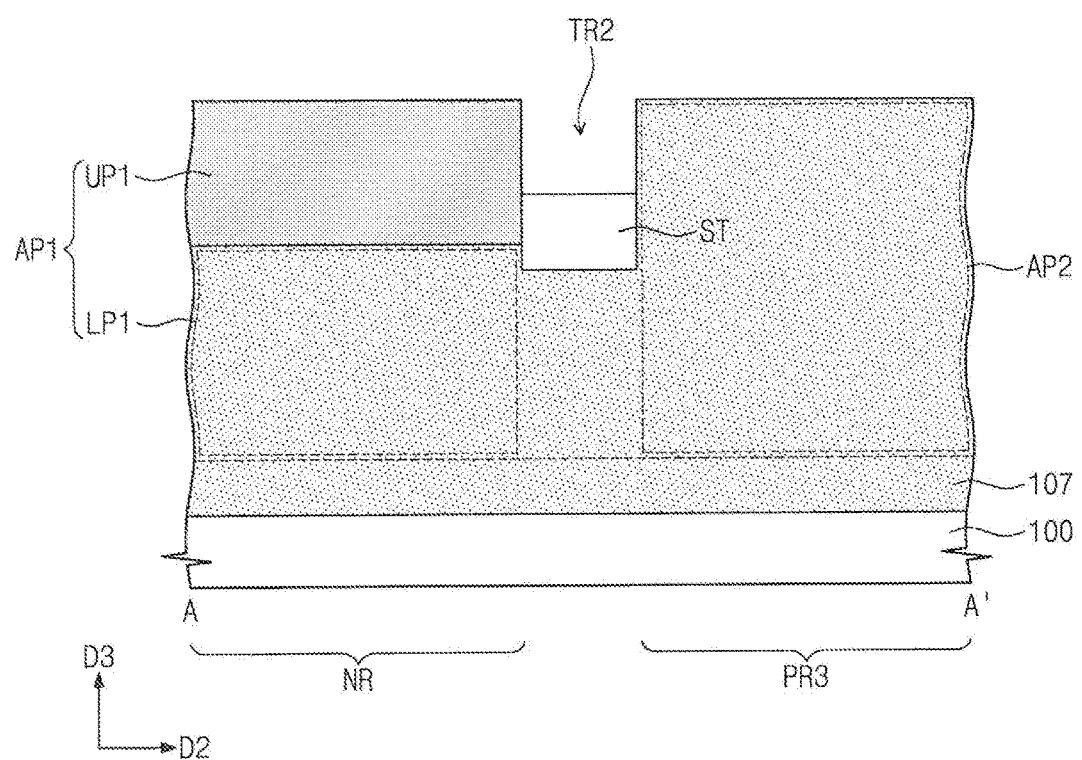
Figure 15B:
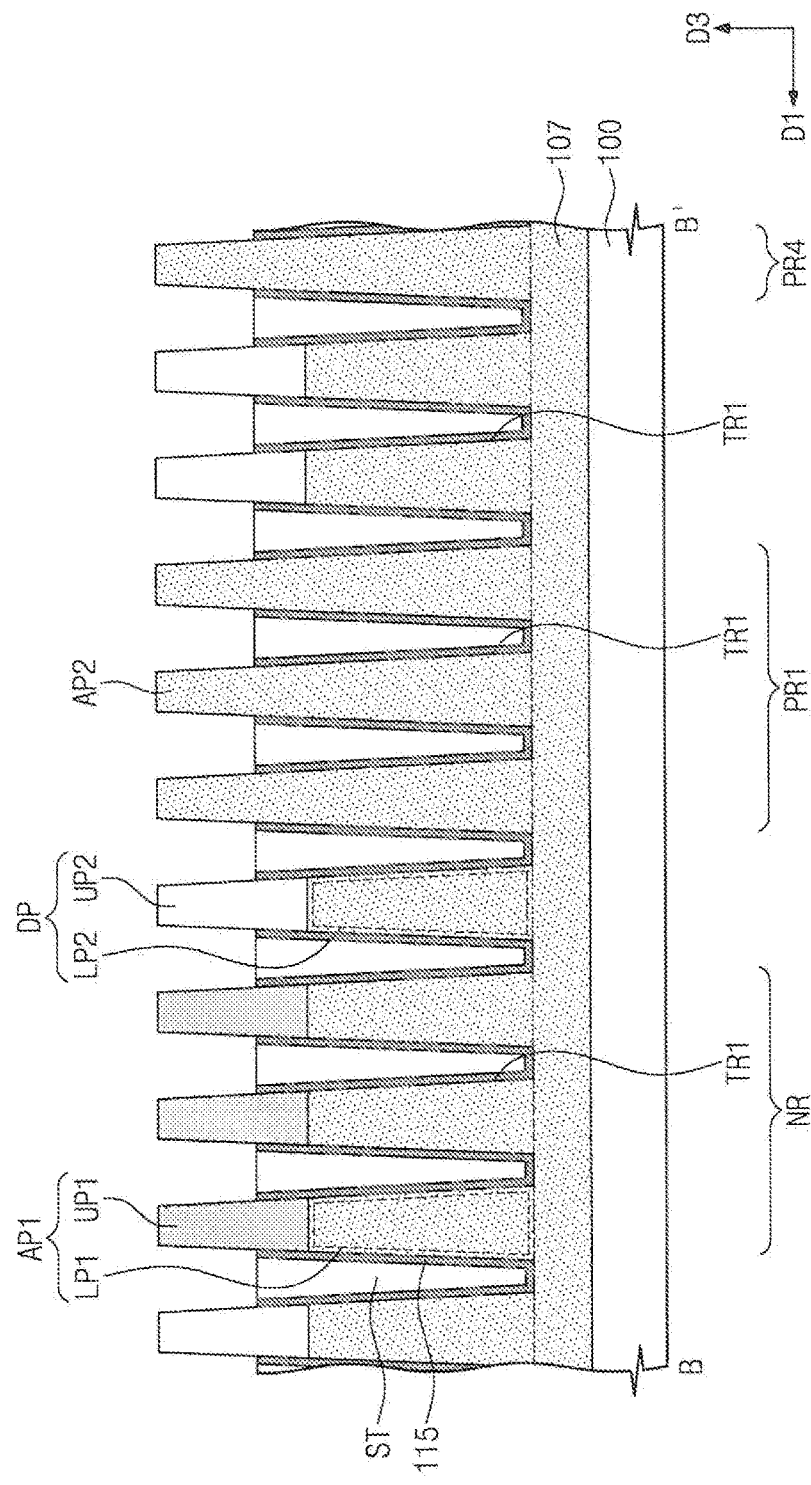

FIGS. 14A, 14B, 15A, and 15B are sectional views illustrating a method of fabricating a semiconductor device, according to some embodiments of the inventive concept. FIGS. 14A and 15A are sectional views taken along lines A-A' of FIGS. 6A and 8A, respectively, and FIGS. 14B and 15B are sectional views taken along lines B-B' of FIGS. 6A and 8A, respectively. In the following description, an element previously described with reference to FIGS. 3A to 11D may be identified by a similar or identical reference number without repeating an overlapping description thereof for the sake of brevity.

Referring to FIGS. 6A, 14A, and 14B, an etch stop layer 115 may be formed to conformally cover the resulting structure of FIGS. 6A, 6B, and 6C. The etch stop layer 115 may be formed to partially fill the first trenches TR1. The etch stop layer 115 may cover the second mask patterns MA2. The etch stop layer 115 may be formed of or include, for example, a silicon nitride layer.

Referring to FIGS. 8A, 15A, and 15B, upper portions of the first to third preliminary active patterns pAP1, pAP2, and pAP3 may be patterned to from the first active patterns AP1, the second active patterns AP2, and the dummy patterns DP. The insulating gapfill layer 110 and the additional insulating gapfill layer filling the second trenches TR2 may be planarized to expose a top surface of the etch stop layer 115. Next, the insulating gapfill layer 110 and the additional insulating gapfill layer may be recessed to form the device isolation patterns ST filling the first and second trenches TR1 and TR2.

In the process of recessing the insulating gapfill layer 110 and the additional insulating gapfill layer, the second upper patterns UP2 may be protected by the etch stop layer 115. Accordingly, the second upper patterns UP2 may remain intact after the recessing process, unlike the second upper patterns UP2 in the previous embodiments described with reference to FIGS. 8A to 8C. Thereafter, the etch stop layer 115, which is exposed on the device isolation patterns ST, may be selectively removed. In certain embodiments, the second mask patterns MA2 may also be removed.

Subsequent processes may be performed using a method similar to that in the previous embodiments described with reference to FIGS. 9A to 11D, and, thus, the finally fabricated semiconductor device may have substantially the same features and elements as that described with reference to FIGS. 12 and 13A to 13C.

Figure 16A:
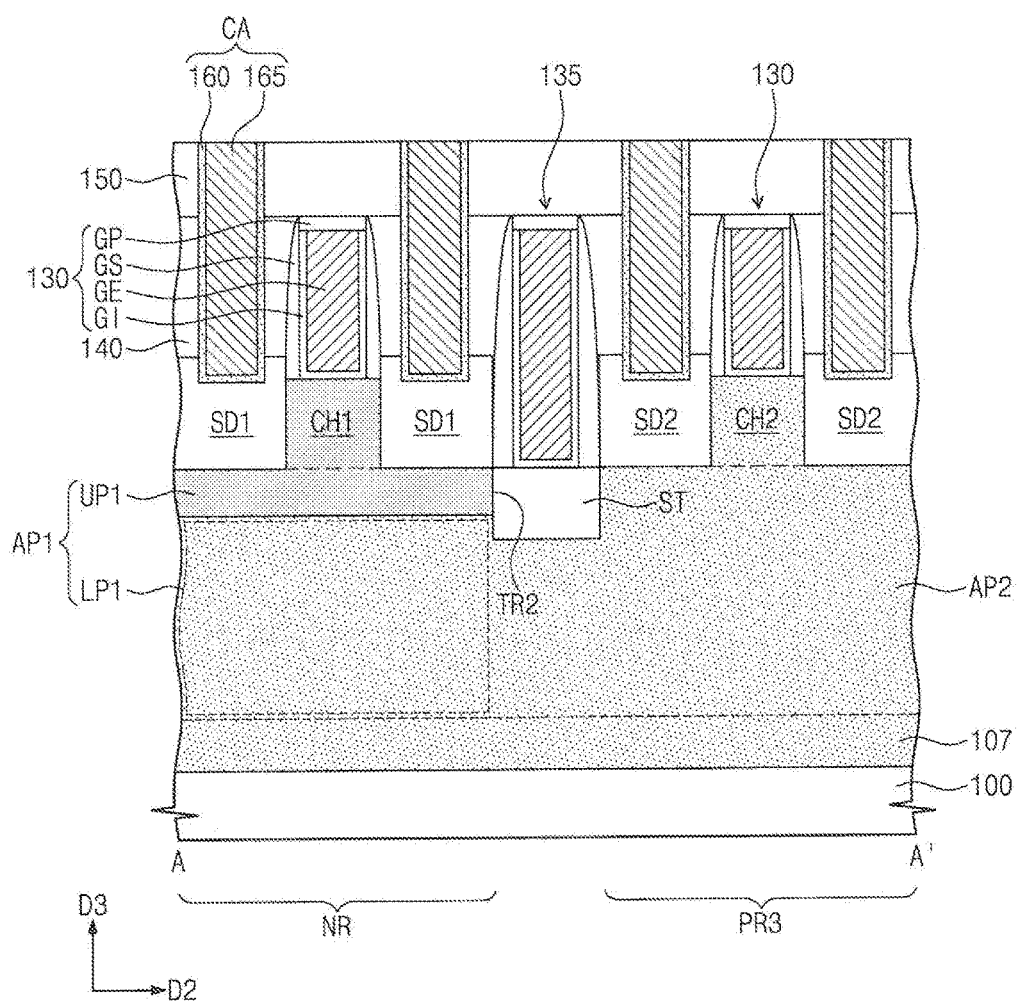
FIGS. 16A to 16C are sectional views illustrating a semiconductor device according to some embodiments of the inventive concept.
Figure 16B:
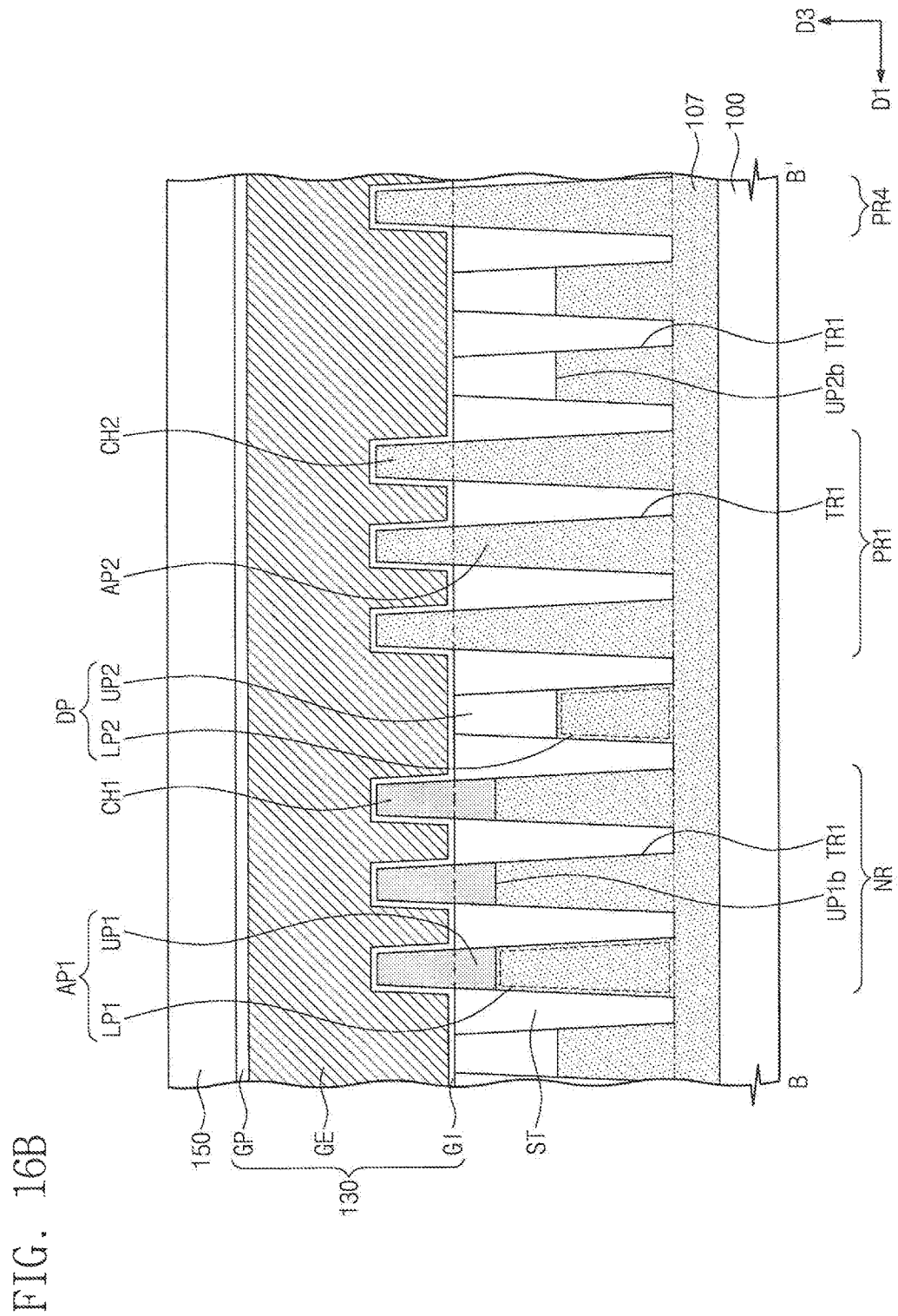
Figure 16C:
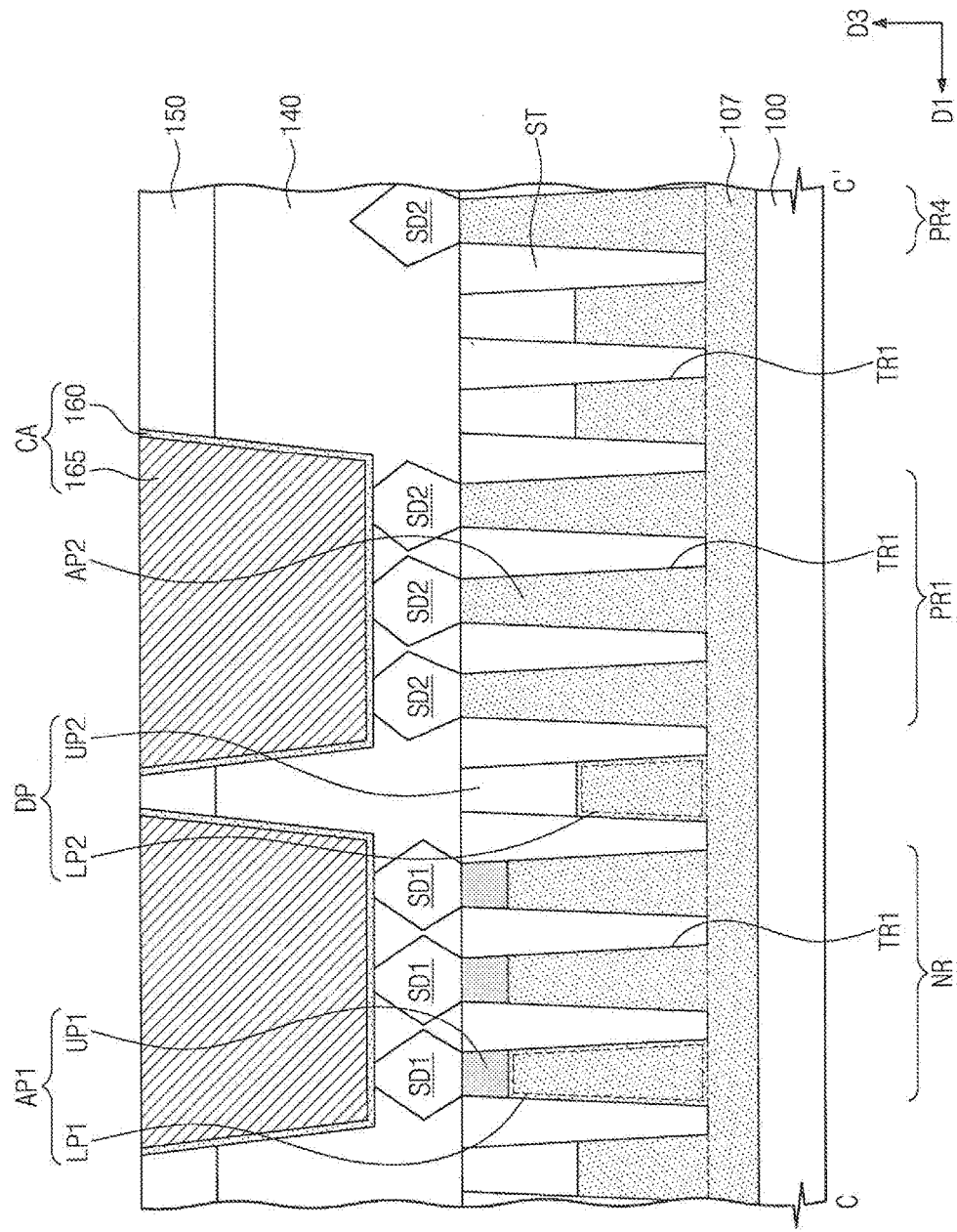

FIGS. 16A to 16C are sectional views illustrating a semiconductor device according to some embodiments of the inventive concept. In detail, FIG. 16A is a sectional view taken along line A-A' of FIG. 1, FIG. 16B is a sectional view taken along line B-B' of FIG. 1, FIG. 16C is a sectional view taken along line C-C' of FIG. 1. In the following description, an element previously described with reference to FIGS. 1 and 2A to 2C may be identified by a similar or identical reference number without repeating an overlapping description thereof for the sake of brevity.

Referring to FIGS. 1, 16A, 16B, and 16C, each of the first active patterns AP1 may include the first lower pattern LP1 and the first upper pattern UP1 on the first lower pattern LP1. Each of the dummy patterns DP may include the second lower pattern LP2 and the second upper pattern UP2 on the second lower pattern LP2. Here, a bottom surface UP1$b$ of the first upper pattern UP1 may be positioned at a level different from a bottom surface UP2$b$ of the second upper pattern UP2. For example, the bottom surface UP1$b$ of the first upper pattern UP1 may be higher than the bottom surface UP2$b$ of the second upper pattern UP2.

In some embodiments, the bottom surface UP2$b$ of the second upper pattern UP2 may be closer to the substrate 100 when compared with the second upper pattern UP2 described with reference to FIGS. 1 and 2A to 2C. For example, the second lower pattern LP2 may be spaced apart from the gate electrode GE and the source/drain regions SD1 and SD2 by a relatively large distance. Accordingly, it may be possible to prevent or reduce the likelihood of a short circuit from being formed between the second lower pattern LP2 and the gate electrode GE or between the second lower pattern LP2 and the source/drain regions SD1 and SD2.

In certain embodiments, although not shown, the bottom surface UP1$b$ of the first upper pattern UP1 may be farther apart from the substrate 100 when compared with the first upper pattern UP1 described with reference to FIGS. 1 and 2A to 2C. For example, the first lower pattern LP1 may be relatively adjacent to the gate electrode GE and the source/drain regions SD1 and SD2. The second lower and upper patterns LP2 and UP2 may have the same features as the second lower and upper patterns LP2 and UP2 described with reference to FIGS. 1 and 2A to 2C. In the case of the semiconductor device according to the present embodiment, by reducing a size of the first upper pattern UP1, it may be possible to reduce a difference in lattice constant between the substrate 100 and the first upper pattern UP1.

Figure 17A:
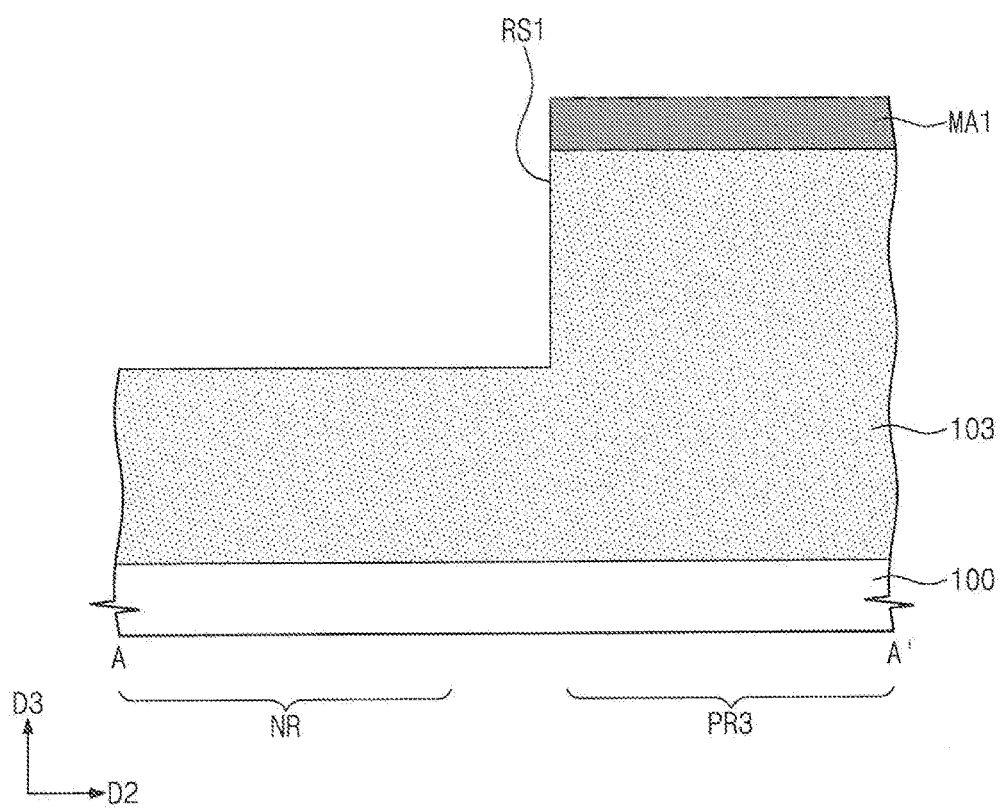
FIGS. 17A, 17B, 18A, and 18B are sectional views illustrating a method of fabricating a semiconductor device according to some embodiments of the inventive concept.
Figure 17B:
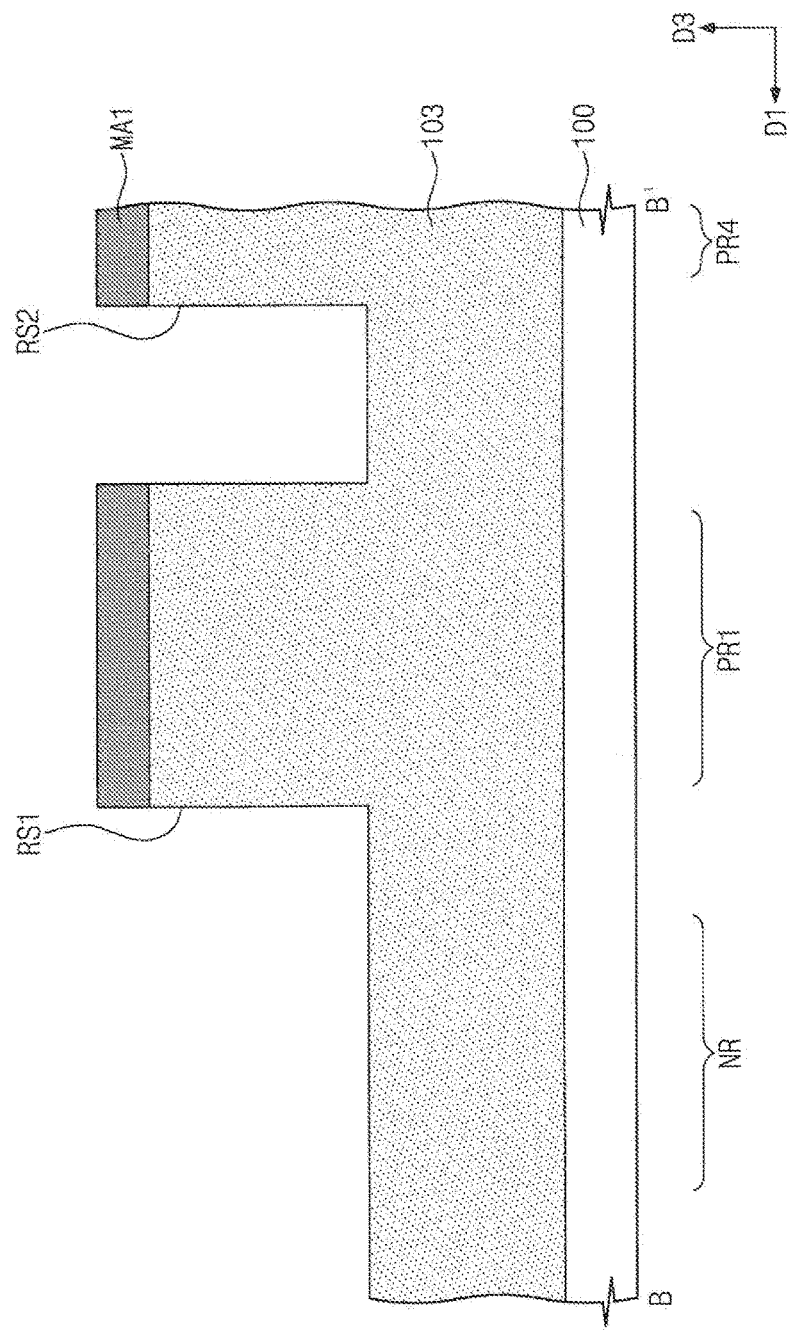
Figure 18A:
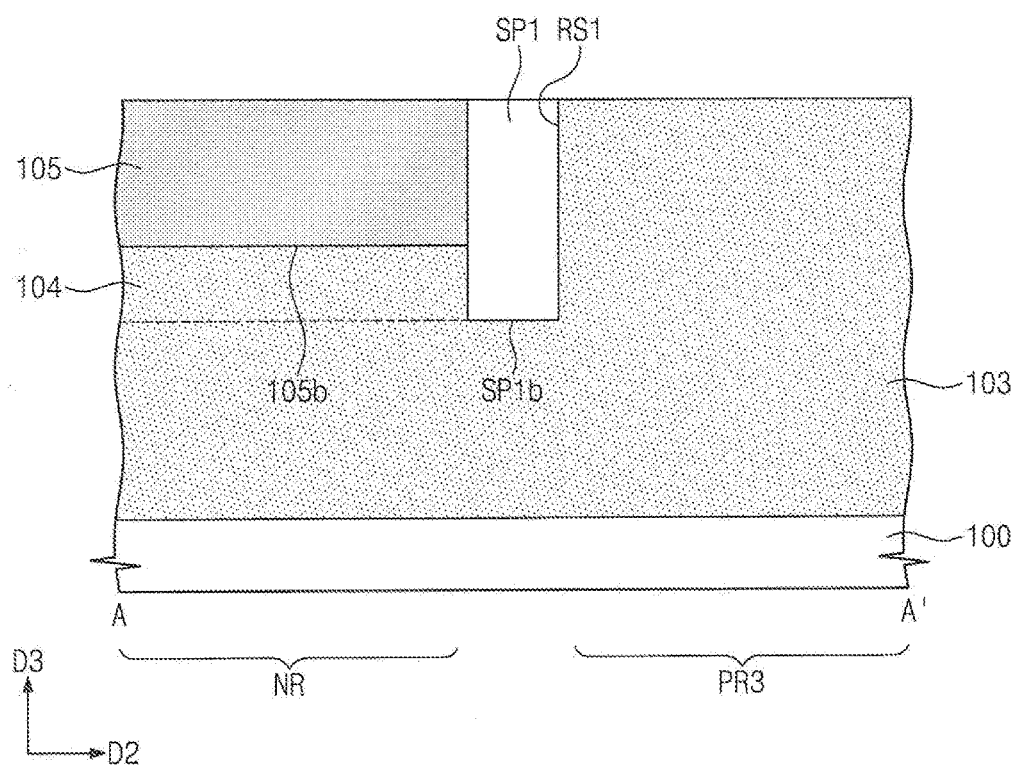
Figure 18B:
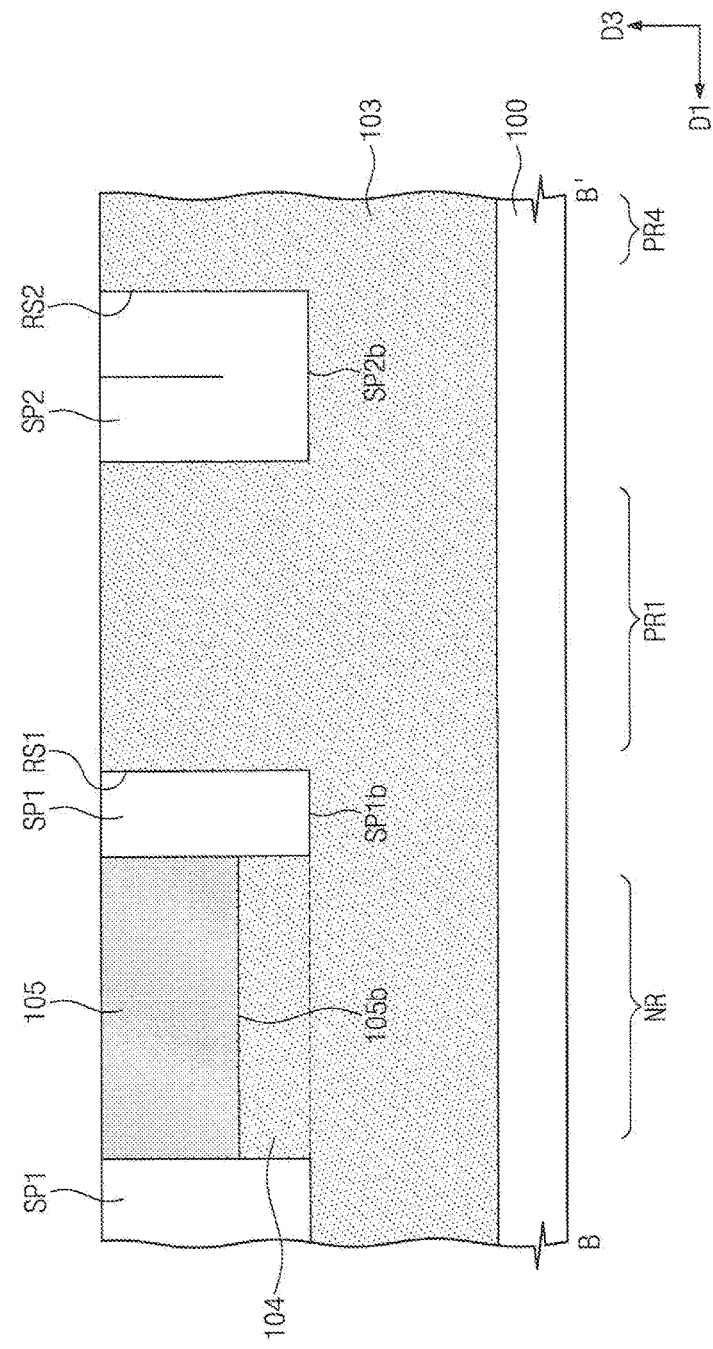

FIGS. 17A, 17B, 18A, and 18B are sectional views illustrating a method of fabricating a semiconductor device according to some embodiments of the inventive concept. In detail, FIGS. 17A and 18A are sectional views taken along lines A-A' of FIGS. 3A and 5A, respectively, and FIGS. 17B and 18B are sectional views taken along lines B-B' of FIGS. 3A and 5A, respectively. In the following description, an element previously described with reference to FIGS. 3A to 11D may be identified by a similar or identical reference number without repeating an overlapping description thereof for the sake of brevity.

Referring to FIGS. 3A, 17A, and 17B, the first recess region RS1 and the second recess region RS2 may be formed in an upper portion of the first semiconductor layer 103. In some embodiments, the first and second recess regions RS1 and RS2 may be formed to have a large depth, compared with the first and second recess regions RS1 and RS2 described with reference to FIGS. 3A to 3C. In certain embodiments, the first and second recess regions RS1 and RS2 may be formed to have the same depth as the first and second recess regions RS1 and RS2 described with reference to FIGS. 3A to 3C, but the inventive concept may not be limited thereto.

Referring to FIGS. 5A, 18A, and 18B, the first and second spacers SP1 and SP2 may be formed in the first and second recess regions RS1 and RS2, respectively. A selective epitaxial growth process using the exposed top surface of the first semiconductor layer 103 as a seed layer may be performed to form a buffer layer 104 on the first semiconductor layer 103, and in some embodiments, the buffer layer 104 may be formed to partially fill the first recess region RS1. The buffer layer 104 may be formed of or include the same material as the first semiconductor layer 103. For example, the buffer layer 104 may be connected to the first semiconductor layer 103 to form a single monolithic body. In certain embodiments, the buffer layer 104 may be formed of or include the same material as the first semiconductor layer 103, but the buffer layer 104 and the first semiconductor layer 103 may differ from each other in terms of germanium (Ge) concentration.

A selective epitaxial growth process using the top surface of the buffer layer 104 as a seed layer may be performed to form the second semiconductor layer 105 on the buffer layer 104. In some embodiments, the second semiconductor layer 105 may be formed to completely fill the first recess region RS1.

In some embodiments, a height, in the third direction D3, of the second semiconductor layer 105 may be substantially the same as that of the second semiconductor layer 105 described with reference to FIGS. 5A to 5C. By contrast, heights, in the third direction D3, of the first and second spacers SP1 and SP2 may be greater than those of the first and second spacers SP1 and SP2 described with reference to FIGS. 5A to 5C.

In certain embodiments, due to the presence of the buffer layer 104, the height, in the third direction D3, of the second semiconductor layer 105 may be less than that of the second semiconductor layer 105 described with reference to FIGS. 5A to 5C. By contrast, the heights, in the third direction D3, of the first and second spacers SP1 and SP2 may be substantially the same as those of the first and second spacers SP1 and SP2 described with reference to FIGS. 5A to 5C.

Subsequent processes may be performed using a method similar to that in the previous embodiments described with reference to FIGS. 6A to 11D, and, thus, the finally fabricated semiconductor device may have substantially the same features and elements as that described with reference to FIG. 1 and FIGS. 16A to 16C.

Figure 19A:
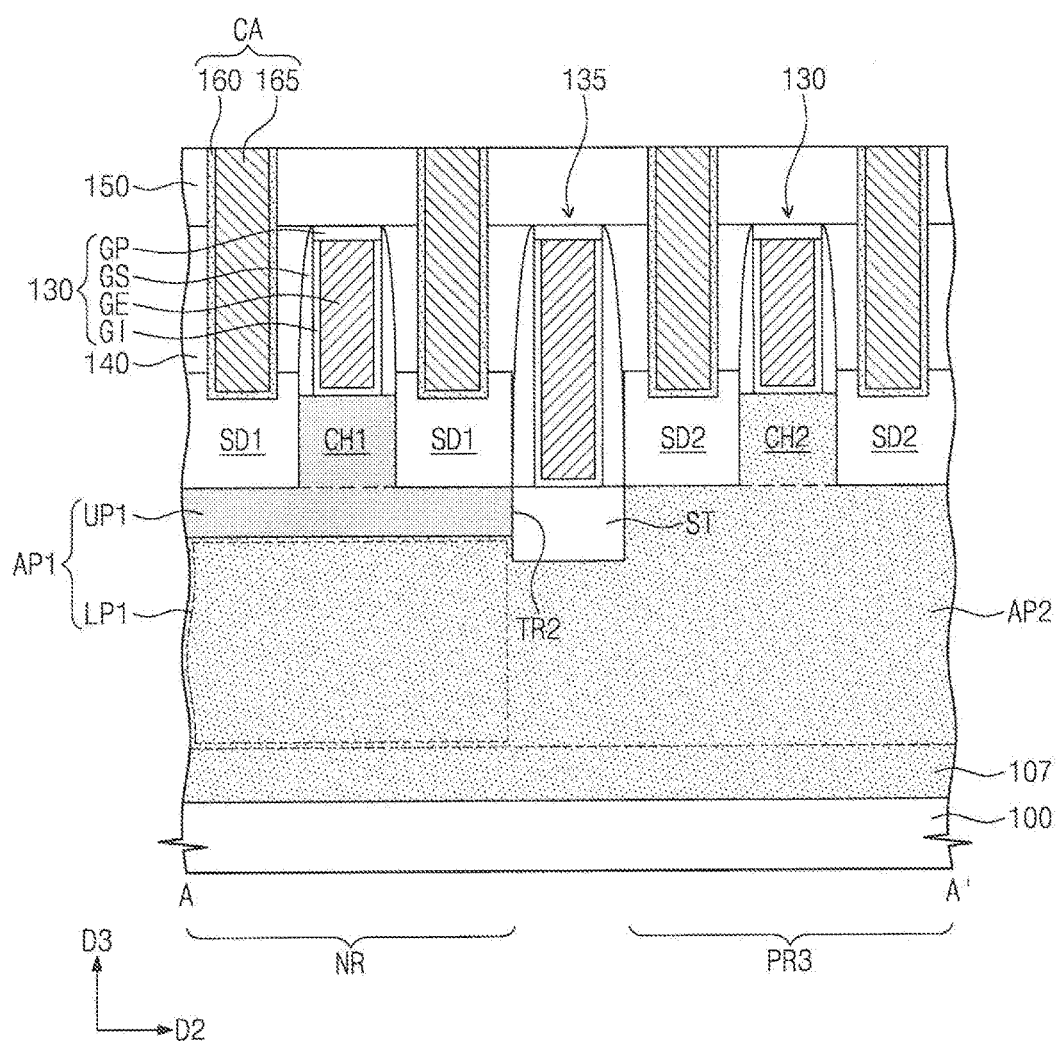
FIGS. 19A to 19C are sectional views illustrating a semiconductor device according to some embodiments of the inventive concept.
Figure 19B:
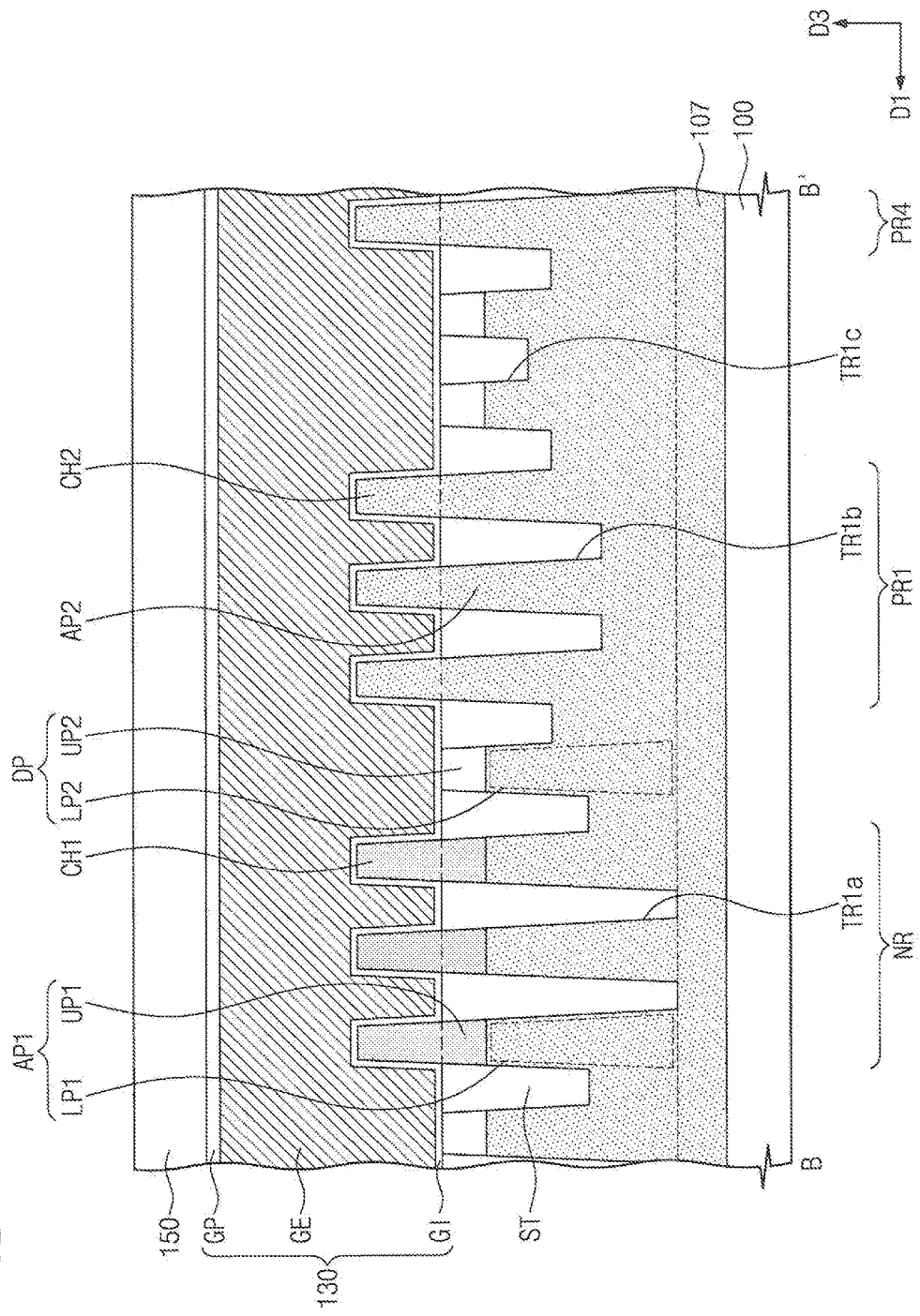
Figure 19C:
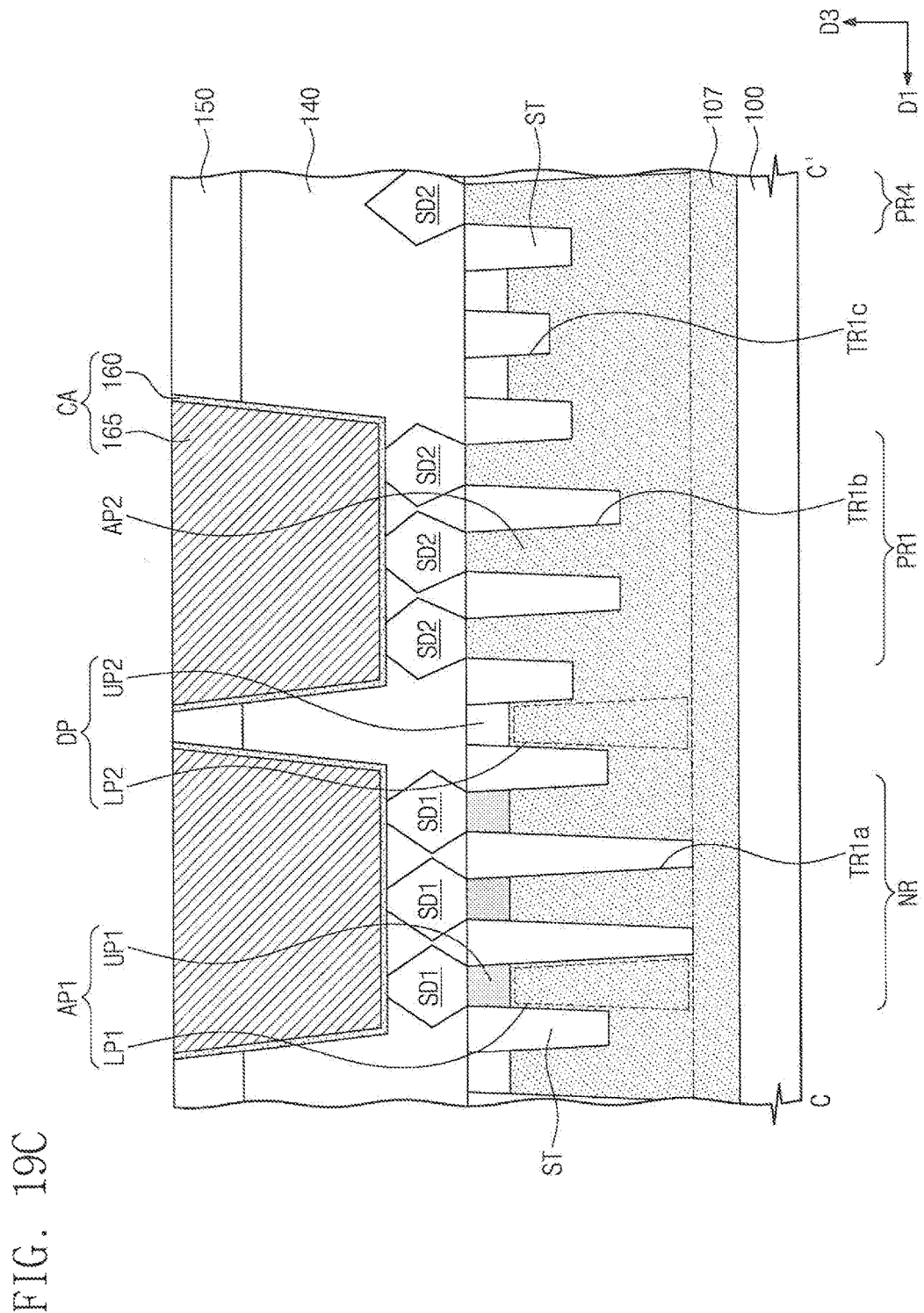

FIGS. 19A to 19C are sectional views illustrating a semiconductor device according to some embodiments of the inventive concept. In detail, FIG. 19A is a sectional view taken along line A-A' of FIG. 1, FIG. 19B is a sectional view taken along line B-B' of FIG. 1, and FIG. 19C is a sectional view taken along line C-C' of FIG. 1. In the following description, an element previously described with reference to FIGS. 1 and 2A to 2C may be identified by a similar or identical reference number without repeating an overlapping description thereof for the sake of brevity.

Referring to FIGS. 1, 19A, 19B, and 19C, device isolation patterns ST filling first trenches TR1$a$, TR1$b$, and TR1$c$ may be formed to define the first active patterns AP1, the second active patterns AP2, and the dummy patterns DP. Unlike the first trenches TR1 described with reference to FIGS. 1 and 2A to 2C, the first trenches TR1$a$, TR1$b$, and TR1$c$ according to the present embodiment may have depths different from each other. As an example, the depth of the first trench TR1$b$ between the second active patterns AP2 may be greater than that of the first trench TR1$c$ between the dummy patterns DP. The depth of the first trench TR1$a$ between the first active patterns AP1 may be greater than that of the first trench TR1*b* between the second active patterns AP2.

In other words, the heights, in the third direction D3, of the device isolation patterns ST filling the first trenches TR1*a*, TR1*b*, and TR1*c* may vary depending on their positions. For example, the height of the device isolation pattern ST between the second active patterns AP2 may be greater than that of the device isolation pattern ST between the dummy patterns DP. The height of the device isolation pattern ST between the first active patterns AP1 may be greater than that of the device isolation pattern ST between the second active patterns AP2.

The depth relationship between the first trenches TR1*a*, TR1*b*, and TR1*c* may be changed based on a difference in etch rate between materials in a subsequent etching process for forming the first to third preliminary active patterns pAP1, pAP2, and pAP3.

Figure 20A:
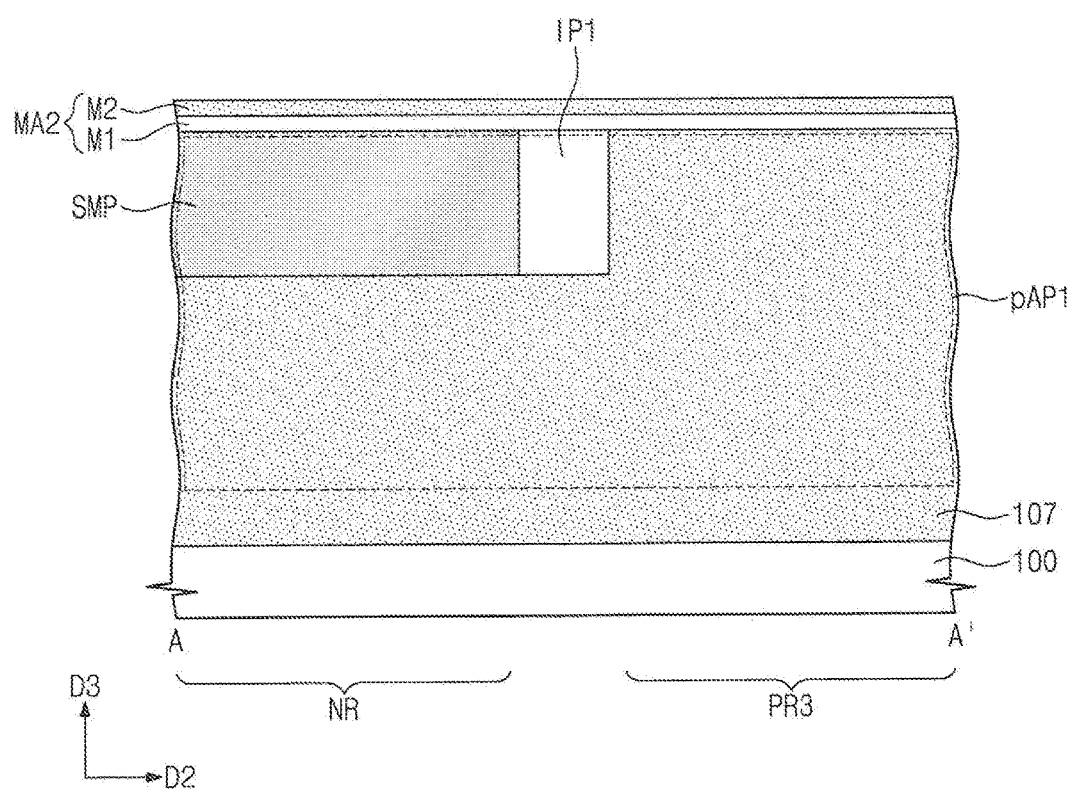
FIGS. 20A and 20B are sectional views illustrating a method of fabricating a semiconductor device according to some embodiments of the inventive concept.
Figure 20B:
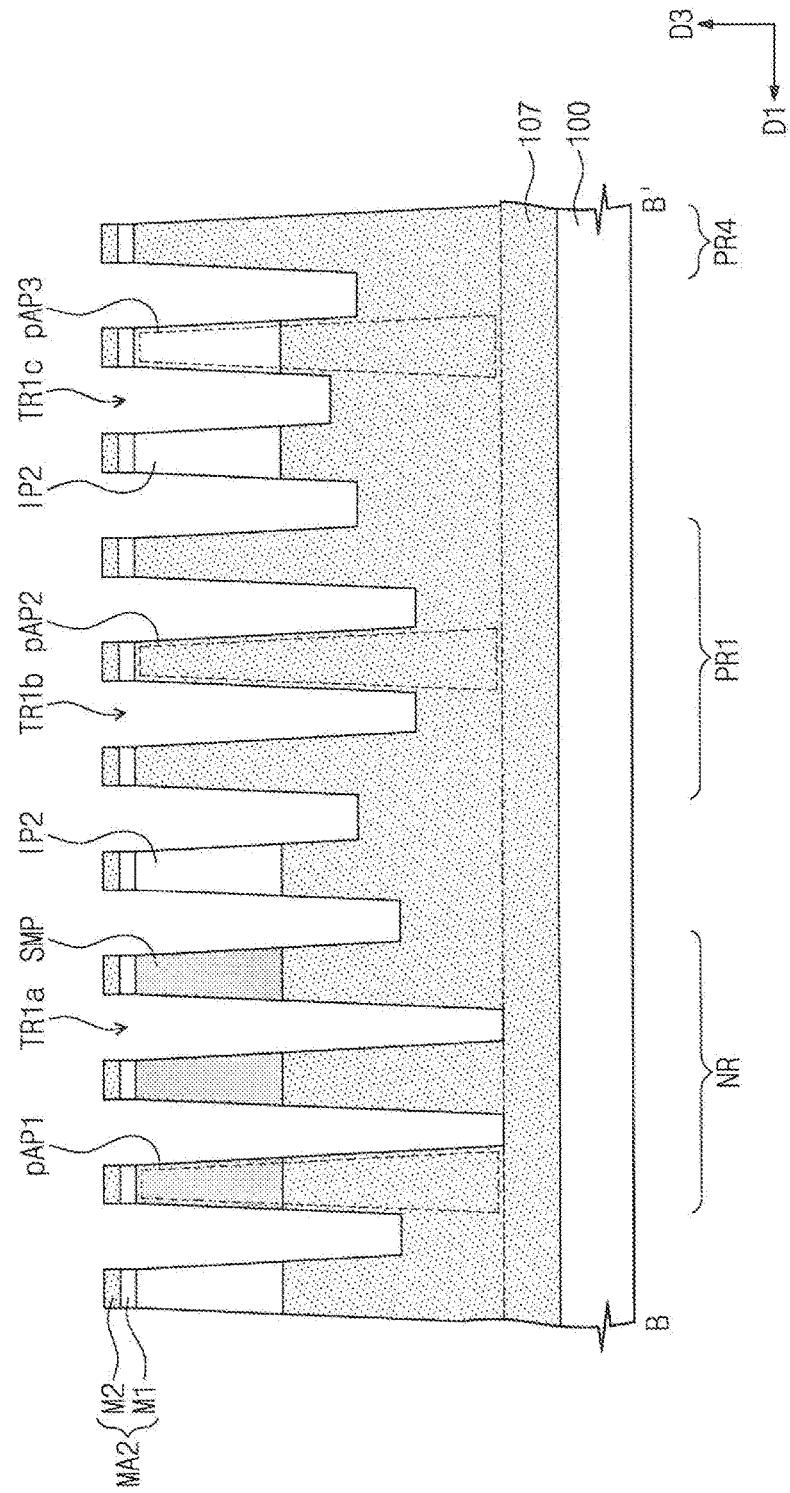

FIGS. 20A and 20B are sectional views illustrating a method of fabricating a semiconductor device according to some embodiments of the inventive concept. In detail, FIG. 20A is a sectional view taken along line A-A' of FIG. 6A, and FIG. 20B is a sectional view taken along line B-B' of FIG. 6A. In the following description, an element previously described with reference to FIGS. 3A to 11D may be identified by a similar or identical reference number without repeating an overlapping description thereof for the sake of brevity.

Referring to FIGS. 6A, 20A, and 20B, a patterning process may be performed on the resulting structure described with reference to FIGS. 5A to 5C to form the first to third preliminary active patterns pAP1, pAP2, and pAP3. For example, the first to third preliminary active patterns pAP1, pAP2, and pAP3 may be formed by an anisotropic etching process capable of etching all of the first semiconductor layer 103, the second semiconductor layer 105, the first spacer SP1, and the second spacer SP2. In the anisotropic etching process, the first semiconductor layer 103, the second semiconductor layer 105, and the first and second spacers SP1 and SP2 may have a first etch rate, a second etch rate, and a third etch rate, respectively, that are different from each other. For example, the first etch rate may be higher than the third etch rate, and the second etch rate may be higher than the first etch rate, but the inventive concept may not be limited thereto. For example, the first to third etch rates may be changed based on an etch recipe to be used in the anisotropic etching process.

The first trench TR1*a* formed between the first preliminary active patterns pAP1 may have the largest depth. This may be because, during the anisotropic etching process, the second semiconductor layer 105 at the position for the first trench TR1*a* is etched at the fastest etch rate. The first trench TR1*c* formed between the third preliminary active patterns pAP3 may have the smallest depth. This may be because, during the anisotropic etching process, the first and second spacers SP1 and SP2 at the position for the first trench TR1*c* are etched at the slowest etch rate. The first trench TR1*b* formed between the second preliminary active patterns pAP2 may have an intermediate depth, compared with the first trenches TR1*a* and TR1*c*.

Subsequent processes may be performed using a method similar to that in the previous embodiments described with reference to FIGS. 7A to 11D, and, thus, the finally fabricated semiconductor device may have substantially the same features and elements as that described with reference to FIG. 1 and FIGS. 19A to 19C.

According to some embodiments of the inventive concept, a semiconductor device may include n- and p-type transistors whose channel regions are formed of different semiconductor materials. Accordingly, it may be possible to realize a dual-channel CMOS device and improve electrical characteristics of a semiconductor device. Also, according to some embodiments of the inventive concept, a semiconductor device can be fabricated using a simplified process (e.g., without a deep trench isolation process).

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
    a substrate with an NMOSFET region and a PMOSFET region;
    a first active pattern on the NMOSFET region;
    a second active pattern on the PMOSFET region;
    a dummy pattern between the NMOSFET and PMOSFET regions; and
    device isolation patterns on the substrate that fill trenches between the first active pattern, the second active pattern, and the dummy pattern,
    wherein upper portions of the first and second active patterns have a fin-shaped structure protruding between the device isolation patterns,
    an upper portion of the dummy pattern contains an insulating material,
    the first active pattern comprises a first lower pattern at a lower portion thereof,
    the first lower pattern comprises a first semiconductor material,
    the upper portion of the first active pattern comprises a second semiconductor material different from the first semiconductor material, and
    the upper portion of the second active pattern comprises the first semiconductor material.

2. The semiconductor device of claim 1, further comprising a lower semiconductor layer interposed between the substrate and the first active pattern, between the substrate and the second active pattern, and between the substrate and the dummy pattern,
    wherein the lower semiconductor layer comprises the first semiconductor material, and
    the lower semiconductor layer, the first lower pattern, and the second active pattern are connected to each other to form a single monolithic body.

3. The semiconductor device of claim 1, wherein the dummy pattern comprises a second lower pattern at a lower portion thereof, and
    the second lower pattern contains the first semiconductor material.

4. The semiconductor device of claim 3, wherein a top surface of the second lower pattern is positioned at a lower level relative to the substrate than top surfaces of the device isolation patterns.

5. The semiconductor device of claim 3, wherein a top surface of the first lower pattern is positioned at a higher level relative to the substrate than a top surface of the second lower pattern.

6. The semiconductor device of claim 1, wherein a top surface of the dummy pattern is positioned at a lower level relative to the substrate than top surfaces of the first and second active patterns.

7. The semiconductor device of claim 1, wherein the top surface of the dummy pattern is substantially coplanar with top surfaces of the device isolation patterns.

8. The semiconductor device of claim 1, wherein each of the first active pattern, the second active pattern, and the dummy pattern is provided in plural, and
   a depth of a trench between the first active patterns, a depth of a trench between the second active patterns, and a depth of a trench between the dummy patterns are different from each other.

9. The semiconductor device of claim 1, wherein the first and second active patterns are arranged side by side in a direction,
   each of the first and second active patterns has a longitudinal axis parallel to the direction, and
   a trench between the first and second active patterns is shallower than at least one other trench.

10. The semiconductor device of claim 9, wherein the direction is a first direction, the semiconductor device further comprising:
   a gate electrode that crosses the first and second active patterns and the dummy pattern and extends in a second direction crossing the first direction,
   the upper portion of the first active pattern comprises a first channel region, which vertically overlaps the gate electrode, and first source/drain regions, which are adjacent to both sides of the gate electrode, and
   the upper portion of the second active pattern comprises a second channel region, which vertically overlaps the gate electrode, and second source/drain regions, which are adjacent to both sides of the gate electrode.

11. A semiconductor device, comprising a first active pattern, a second active pattern, and a dummy pattern between the first and second active patterns on a substrate; and
   a gate electrode that crosses the first and second active patterns and the dummy pattern;
   wherein the first active pattern and the second active pattern have different conductivity types,
   the first active pattern comprises a first lower pattern and a first upper pattern on the first lower pattern,
   the dummy pattern comprises a second lower pattern and a second upper pattern on the second lower pattern,
   the first lower pattern, the second lower pattern, and the second active pattern comprise the same semiconductor material, and
   the second upper pattern comprises an insulating material.

12. The semiconductor device of claim 11, wherein the first upper pattern and the second active pattern contains different semiconductor materials from each other.

13. The semiconductor device of claim 12, wherein the first lower pattern, the second lower pattern, and the second active pattern comprises a germanium-containing semiconductor material, and
   the first upper pattern comprises a III-V semiconductor material.

14. The semiconductor device of claim 11, further comprising device isolation patterns on the substrate and between the first active pattern, the second active pattern, and the dummy pattern,
   wherein each of the device isolation patterns has a top surface under the gate electrode, the top surface is positioned at a higher level relative to the substrate than a top surface of the first lower pattern.

15. The semiconductor device of claim 14, wherein each of the first active pattern, the second active pattern, and the dummy pattern is provided in plural, and
   a vertical height of the device isolation pattern between the first active patterns, a vertical height of the device isolation pattern between the second active patterns, and a vertical height of the device isolation pattern between the dummy patterns are different from each other.

16. A semiconductor device, comprising:
   a substrate having an NMOSFET region and a PMOSFET region;
   a device isolation pattern on the substrate;
   a first active pattern on the NMOSFET region that extends through the device isolation pattern and having a first channel region extending therefrom;
   a second active pattern on the PMOSFET region that extends through the device isolation pattern and having a second channel region extending therefrom; and
   a dummy pattern that extends through the device isolation pattern without a channel region extending therefrom;
   wherein the first channel region and the second channel region comprise first and second semiconductor materials, respectively, that are different from each other; and
   wherein a top surface of the dummy pattern is positioned at a lower level relative to the substrate than top surfaces of the first and second active patterns.

17. The semiconductor device of claim 16, further comprising:
   first source and first drain regions on opposing sides of the first active pattern; and
   second source and second drain regions on opposing sides of the second active pattern;
   wherein the first source region and the first drain regions exert a tensile strain on the first channel region; and
   wherein the second source region and the second drain region exert a compressive strain on the second channel region.

18. The semiconductor device of claim 17, wherein a semiconductor doping concentration of the first source and drain regions is different than a semiconductor doping concentration of the first channel region; and
   wherein a semiconductor doping concentration of the second source and drain regions is different than a semiconductor doping concentration of the second channel region.

19. The semiconductor device of claim 17, wherein a cross sectional view of the first source and drain regions is different than a cross sectional view of the second source and drain regions.

20. The semiconductor device of claim 14, wherein at least a portion of the first upper pattern has a fin-shaped structure protruding between the device isolation patterns, and
   an upper portion of the second active pattern has a fin-shaped structure protruding between the device isolation patterns.

* * * * *